(12) United States Patent
Tomita

(10) Patent No.: US 6,426,909 B1
(45) Date of Patent: Jul. 30, 2002

(54) SEMICONDUCTOR MEMORY

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/924,779

(22) Filed: Aug. 9, 2001

(51) Int. Cl.$^7$ .................................................. G11C 8/00
(52) U.S. Cl. ................................. 365/222; 365/230.03
(58) Field of Search ............................ 365/222, 230.03, 365/230.06, 230.08, 233, 236

(56) References Cited

U.S. PATENT DOCUMENTS

| | | | | |
|---|---|---|---|---|
| 5,557,577 A | * | 9/1996 | Kelly | 365/222 |
| 5,636,173 A | * | 6/1997 | Schaefer | 365/222 |
| 6,172,928 B1 | * | 1/2001 | Ooushi | 365/222 |
| 6,285,616 B1 | * | 9/2001 | Ikabata | 365/222 |
| 6,324,113 B1 | * | 11/2001 | Tomita | 365/222 |

OTHER PUBLICATIONS

Takayasu Sakurai, Ph.D., Masakazu Kazumu, Katsuhiko Sato; Toshiba Review; vol. 41, No. 3, 1986 pp. 227–230.
(2) Basic Operation of VSRAM and Circuit Technology Used Therein Fig. 2.

* cited by examiner

Primary Examiner—Trong Phan
(74) Attorney, Agent, or Firm—Arent Fox Kintner Plotkin & Kahn, PLLC

(57) ABSTRACT

The refresh circuit generates a refresh request for refreshing memory cells at a predetermined interval. The refresh counter generates a refresh address. The holding circuit respectively holds information as to the completion/incompletion of refresh of the memory cells in each of the banks, the memory cells being designated by the refresh address. The refresh control circuit refreshes bank(s) yet to be refreshed among the banks not in operation upon the occurrence of the refresh request, based on the information held in the holding circuit. That is, under a single refresh address, banks yet to be refreshed are successively refreshed every time refresh request occurs. The refresh operations are performed on banks that are not in operation. Therefore, the refresh operations can be performed without being recognized from exterior. That is, the semiconductor memory having a plurality of banks can perform the refresh of memory cells internally and automatically.

9 Claims, 46 Drawing Sheets

SEMICONDUCTOR MEMORY

BACKGROUND OF THE INVENTION

1. Field of the Invention

The present invention relates to a semiconductor integrated circuit having a plurality of memory cells including capacitors. In particular, the present invention relates to a technology for automatically performing refresh operation to the memory cells.

2. Description of the Related Art

In general, dynamic random access memories (DRAMs) have been known as the semiconductor integrated circuit having memory cells including capacitors. The DRAMs are suited for higher integration since their memory cells can be made in smaller configuration. The DRAMs, however, require refresh operation in order to retain data stored in the memory cells. Semiconductor memories such as DRAMs need a precharge operation where bit lines are equalized after a read and a write operation. The read operation and the write operation cannot be performed during a precharging period so that the data input/output efficiency is lowered.

Therefore, in the recent DRAMs, a memory core is constructed of a plurality of memory banks independently operating. The input/output data efficiency is improved by allowing the operation of the other banks during the precharge period of a single bank.

Meanwhile, virtually SRAMs have been known as the semiconductor integrated circuit having both of the usability of static RAMs (SRAMs) and the high integration of DRAMs. The virtually SRAMs comprises controlling circuits for refresh operation and memory cores similar to those of DRAMs.

In the virtually SRAMs, a read cycle and a write cycle both include a time required for refresh operation so that the performance of the refresh operation does not show to the exterior. The virtually SRAMs are detailed in TOSHIBA REVIEW Vol.41, No.3, 1986, pp.227–230 (TOSHIBA KK).

In the virtually SRAMs, the cycle time required for read and write operations need to be longer than its actual time value by a time required for a refresh operation. This causes a problem of greatly extending access time.

There have not been proposed any DRAMs which operate at a cycle time equal to that of the conventional DRAMs and automatically performs the refresh operation. This is also true in the DRAMs having a plurality of banks.

SUMMARY OF THE INVENTION

It is an object of the present invention to provide a semiconductor memory which can perform refresh without being shown to exterior.

In particular, an object of the present invention is to perform refresh without being shown to exterior, in a semiconductor having a plurality of banks capable of independent operations.

According to one of the aspects of a semiconductor memory in the present invention, the semiconductor memory comprises a plurality of banks having memory cells and operating independently, a refresh circuit, a refresh counter, a holding circuit, and a refresh control circuit. The refresh circuit generates a refresh request for refreshing the memory cells at a predetermined interval. The refresh counter generates a refresh address. The holding circuit respectively holds information as to the completion/incompletion of refresh of the memory cells in each of the banks, the memory cells being designated by the refresh address. The refresh control circuit refreshes bank(s) yet to be refreshed among the banks not in operation upon the occurrence of the refresh request, based on the information held in the holding circuit. That is, under a single refresh address, banks yet to be refreshed are successively refreshed every time refresh request occurs. The refresh operations are performed on banks that are not in operation. Therefore, the refresh operations can be performed without being recognized from exterior. That is, the semiconductor memory having a plurality of banks can perform the refresh of memory cells internally and automatically.

According to another aspect of the semiconductor memory in the present invention, when all of the information held in the holding circuit indicates completion, the holding circuit changes all the information on completion to incompletion, and the refresh counter counts up. Therefore, the information corresponding to a single refresh address can be surely held to refresh the memory cells on the respective banks with reliability.

According to another aspect of the semiconductor memory in the present invention, the maximum time available for consecutive access to each of the banks is specified to be shorter than the interval at which the refresh request occurs. For example, even if a refresh request occurs simultaneously with the start of a read operation so that the refresh operation cannot be performed, the read operation will be completed by the time of the occurrence of the next refresh request. Therefore, the refresh operation is sure to be performed in response to the next refresh request. Accordingly, refresh cycles can be inserted to all the banks without fail, ensuring the refresh of all the memory cells.

According to another aspect of the semiconductor memory in the present invention, the semiconductor memory comprises a priority circuit. The priority circuit determines a bank to be refreshed when the banks not in operation include a plurality of banks yet to be refreshed. This makes it possible to perform the refresh of the banks without conflict.

According to another aspect of the semiconductor memory in the present invention, the semiconductor memory comprises a plurality of banks having memory cells and operating independently, a refresh circuit, an address generating circuit, a plurality of holding circuits, and a refresh control circuit. The refresh circuit generates a refresh request for refreshing the memory cells at a predetermined interval. The address generating circuit generates a plurality of refresh addresses. The holding circuits respectively hold information as to the completion/incompletion of refresh of the memory cells in each of the banks, the memory cells being designated by each of the refresh addresses. The refresh control circuit refreshes memory cells yet to be refreshed under the refresh addresses on the banks not in operation upon the occurrence of the refresh request, based on the information held in each of the holding circuits. That is, with respect to one of a plurality of refresh addresses, banks yet to be refreshed are successively refreshed every time refresh request occurs. The refresh operations are performed on banks that are not in operation. Therefore, the refresh operations can be performed without being recognized from exterior. That is, the semiconductor memory having a plurality of banks can perform the refresh of memory cells internally and automatically.

When a bank to be refreshed under a refresh address is in operation, another bank can be refreshed under a different refresh address. As a result, the maximum time available for consecutive access to each bank can be extended.

According to another aspect of the semiconductor memory in the present invention, the address generating circuit comprises a refresh counter and an address holding circuit. The refresh counter generates a refresh address. The address holding circuit holds the refresh address previously generated by the refresh counter. Therefore, a plurality of refresh addresses can be generated by a simple circuit.

According to another aspect of the semiconductor memory in the present invention, when all of the information held in one of the holding circuits corresponding to the address holding circuit indicates completion, one of the holding circuits corresponding to the refresh counter changes all of the information on completion to incompletion after transferring the held information to the holding circuit corresponding to the address holding circuit. The refresh counter counts up after transferring a current counter value to the address holding circuit. Therefore, even in the case where a plurality of refresh addresses are used to refresh the plurality of banks, the information held in the holding circuits can be kept associated with the refresh addresses for reliable refresh of the memory cells on each bank.

According to another aspect of the semiconductor memory in the present invention, the maximum time available for consecutive access to each of the banks is specified to be shorter than (interval at which refresh request occurs)×(number of banks)×(number of holding circuits−1). When a bank indicated of incompletion by a first holding circuit is in operation, a plurality of banks indicated of incompletion by a second and subsequent holding circuits (different refresh addresses) can be refreshed.

Specifying the above-mentioned maximum time to be shorter than a time obtained by multiplying the interval at which the refresh request occurs by "(number of banks)×(number of second and subsequent holding circuits)" ensures that any of the banks is refreshed upon each refresh request. That is, all the memory cells can be refreshed without fail even if the maximum time available for consecutive access to each bank is extended.

According to another aspect of the semiconductor memory in the present invention, the semiconductor memory comprises a priority circuit. The priority circuit determines a memory cell to be refreshed when the banks not in operation include a plurality of memory cells yet to be refreshed under the refresh addresses. Therefore, even if a plurality of refresh addresses are generated, the refreshes can be performed without conflict.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
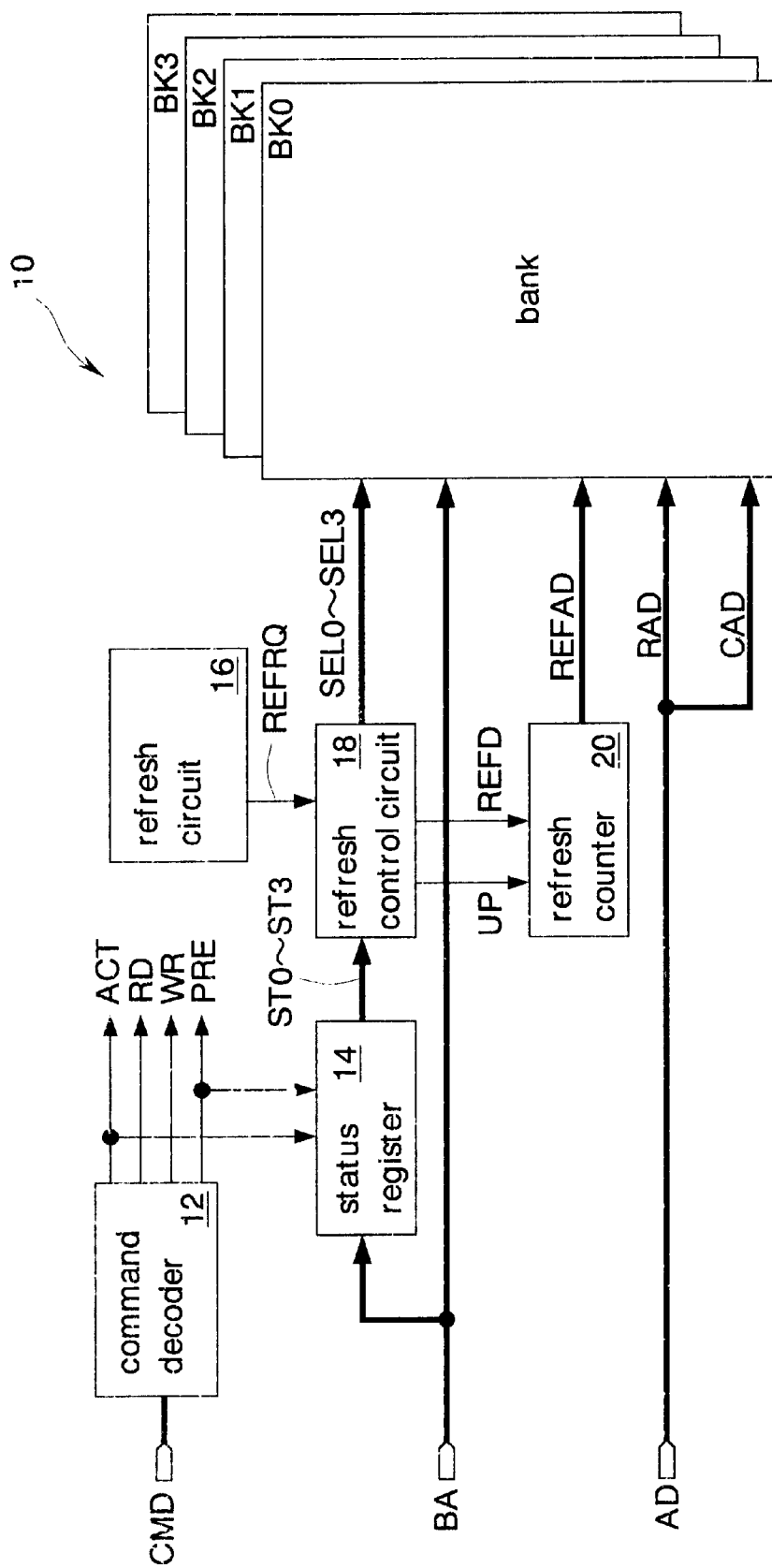
FIG. 1 is a block diagram showing a first embodiment of the present invention.

Hereinafter, embodiments of the present invention will be described with reference to the drawings. In the drawings, each thick line represents a signal line consisting of a plurality of lines. Some of the blocks connected with the thick lines are composed of a plurality of circuits each.

FIG. 1 shows a first embodiment of the semiconductor memory in the present invention. This semiconductor memory is formed as a 64-Mbit SDRAM (Synchronous DRAM) 10 on a silicon substrate by using CMOS processes. This SDRAM 10 is designed chiefly for consumer appliances, and has a maximum clock frequency of 20 MHz. For the sake of improved usability, the SDRAM 10 has the function of performing bank-by-bank refresh of memory cells automatically. As a result, users can design system substrates to mount the SDRAM on without any consideration of refresh.

The SDRAM 10 includes a command decoder 12, a status register 14, a refresh circuit 16, a refresh control circuit 18, a refresh counter 20, and four banks BK0–BK3.

The command decoder 12 receives a command signal CMD from exterior, decodes the command, and outputs an active signal ACT, a read signal RD, a write signal WR, and a precharging signal PRE. The status register 14 receives the active signal ACT, the precharging signal PRE, and a bank address BA from exterior, and outputs status signals ST0–ST3 which indicate the statuses of the banks BK0–BK3, respectively. The banks BK0–BK3 become refreshable when the status signals ST0–ST3 are at low level. Specifically, the status signal ST0 (ST1–ST3) corresponding to the bank BK0 (or BK1–BK3) is maintained at high level after an active command is supplied to activate the bank BK0 (or BK1–BK3) until a precharging command is supplied to perform the precharge operation. Incidentally, all the numerals 0 through 3 at the ends of signal names correspond to the numbers of the banks, respectively.

The refresh circuit 16 contains an oscillator, and generates a refresh request signal REFRQ at predetermined cycles. The refresh control circuit 18 receives the refresh request signal REFRQ and the status signals ST0–ST3, and outputs a count up signal UP, a delayed refresh signal REFD, and select signals SEL0–SEL3. The refresh counter 20 receives the count up signal UP and the delayed refresh signal REFD, and outputs a refresh address REFAD for refreshing memory cells.

The banks BK0–BK3 have a plurality of memory cells, address decoders, sense amplifiers, and the like. The banks BK0–BK3 receive the refresh address REFAD, the bank address BA, and an address AD (row address RAD, column address CAD) from exterior. The banks BK0–BK3 perform a refresh operation when they receive the select signals SEL0–SEL3 of high level, respectively. In this embodiment, a single refresh request activates any of the select signals SEL0–SEL3 to refresh any of the banks BK0–BK3.

In this embodiment, 1024 memory cells are refreshed in response to a single refresh request. To refresh all the 64M memory cells, 64 k refresh requests are needed. Besides, the memory cells are formed so that they can hold data for a maximum period of 64 ms. Therefore, 64 k times of refreshes are required within 64 ms, which means that refresh requests need to occur at intervals of 976 ns or shorter. The interval at which the refresh request signal REFRQ occurs is determined depending on the cycle of the oscillator in the refresh circuit 16. Accordingly, in this embodiment, the interval at which the refresh request signal REFRQ occurs is set to 510 ns in consideration of the manufacturing process, variations voltage, and variations in temperature. Then, as will be described later, the banks BK0–BK3 each are refreshed once for a period over which four refresh requests occur (2040 ns).

Figure 2:
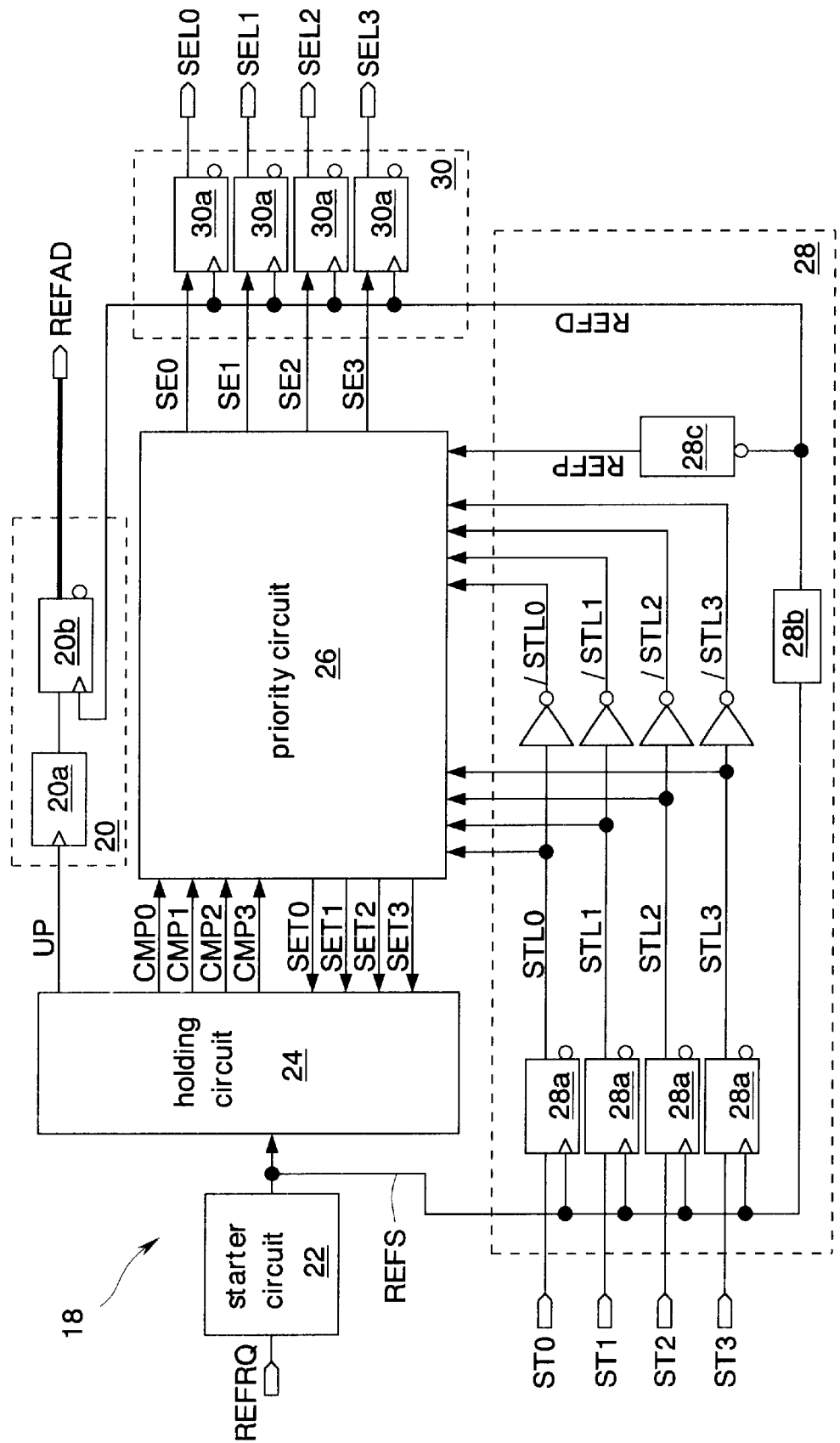
FIG. 2 is a circuit diagram showing the refresh control circuit and a refresh counter in FIG. 1.

FIG. 2 shows the details of the refresh control circuit 18 and the refresh counter 20.

The refresh control circuit 18 includes a starter circuit 22 for refresh, a holding circuit 24, a priority circuit 26, a status latching circuit 28, and a bank selecting circuit 30.

The starter circuit 22 has a latch for holding the refresh request signal REFRQ, and outputs a refresh start signal REFS when any of the banks BK0–BK3 is refreshable.

The holding circuit 24 receives the refresh start signal REFS and set signals SET0–SET3 from the priority circuit 26, and outputs completion signals CMP0–CMP3 and the count up signal UP.

The priority circuit 26 receives the completion signals CMP0–CMP3, status latched signals STL0–STL3 and /STL0–/STL3, and a refresh pulse REFP, and outputs the set signals SET0–SET3 and select signals SE0–SE3.

The status latching circuit 28 includes four latches 28a, a delay circuit 28b, and a pulse generator 28c. The latches 28a accept the status signals ST0–ST3 in synchronization with the rising edge of the refresh start signal REFS, and output the accepted signals as the status latched signals STL0–STL3, respectively. The status latched signals STL0–STL3 and the inverted signals thereof, or the status latched signals /STL0–/STL3, are output to the priority circuit 26. The delay circuit 28b delays the refresh start signal REFS for a predetermined time, and outputs the same as the delayed refresh signal REFD. The pulse generator 28c generates the refresh pulse REFP in synchronization with the falling edge of the delayed refresh signal REFD.

The bank selecting circuit 30 has four latches 30a. The latches 30a accept the select signals SE0–SE3 in synchronization with the rising edge of the delayed refresh signal REFD, and output the accepted signals as the select signals SEL0–SEL3, respectively.

The refresh counter 20 comprises a counter 20a which counts up in response to the rising edge of the count up signal UP, and a latch 20b which accepts the counter value output from the counter 20a in synchronization with the rising edge of the delayed refresh signal REFD and outputs the accepted signal as the refresh address REFAD.

Figure 3:
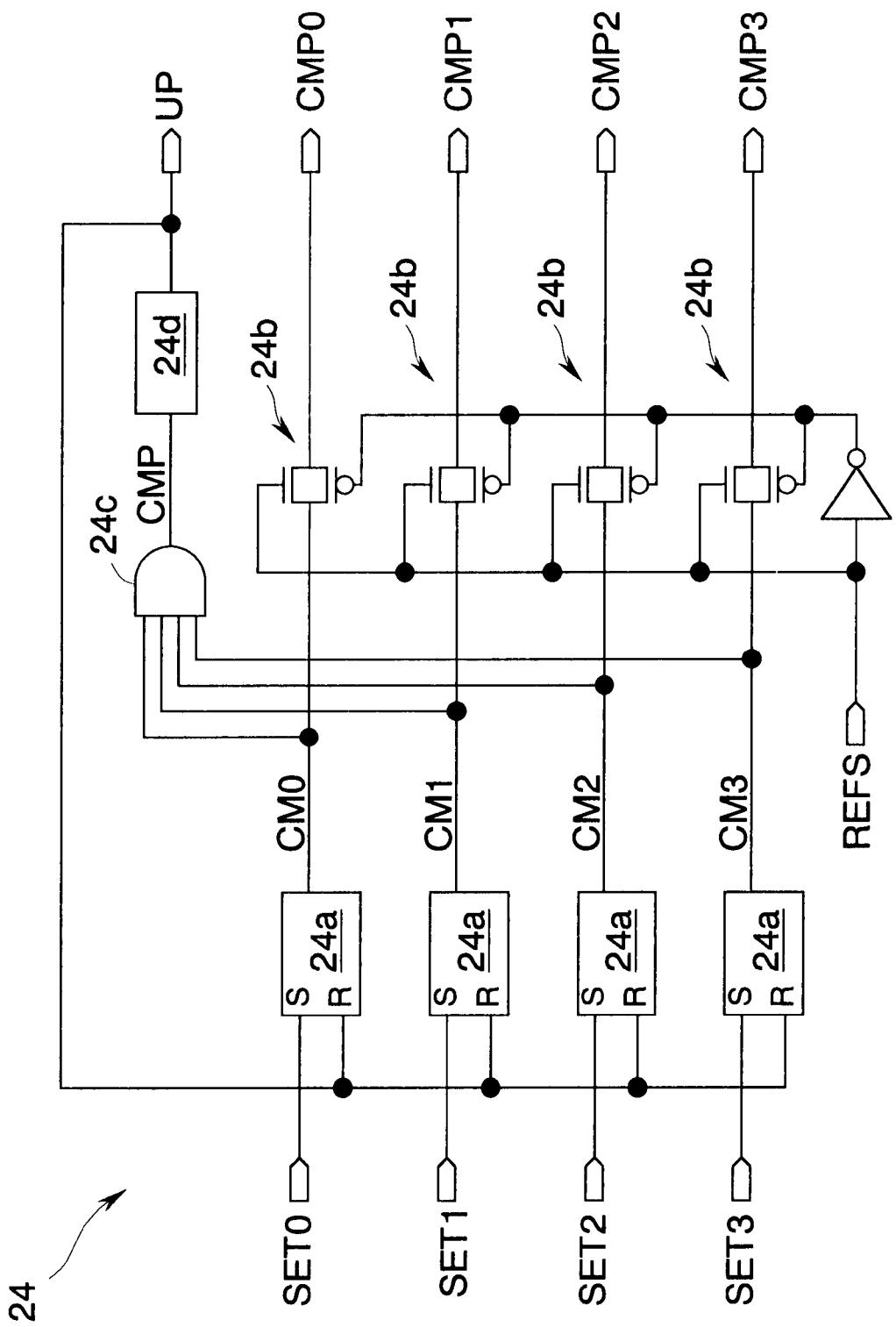
FIG. 3 is a circuit diagram showing the holding circuit in FIG. 1.

FIG. 3 shows the details of the holding circuit 24.

The holding circuit 24 includes RS flip-flops 24a, CMOS transmission gates 24b, an AND gate 24c, and a pulse generator 24d. The RS flip-flops 24a turn completion signals CM0–CM3 to high level upon receiving the set signals SET0–SET3 at their set terminals S, respectively. The RS flip-flops 24a turn the completion signals CM0–CM3 to low level upon receiving the count up signal UP at their reset terminals R, respectively. The CMOS transmission gates 24b turn on under the refresh start signal REFS of high level, to transmit the completion signals CM0–CM3 as the completion signals CMP0–CMP3, respectively. The AND gate 24c turns a completion signal CMP to high level when all the completion signals CM0–CM3 are at high level. The pulse generator 24d generates the count up signal UP (a pulse of high level) in response to the rising edge of the completion signal CMP.

Figure 4:
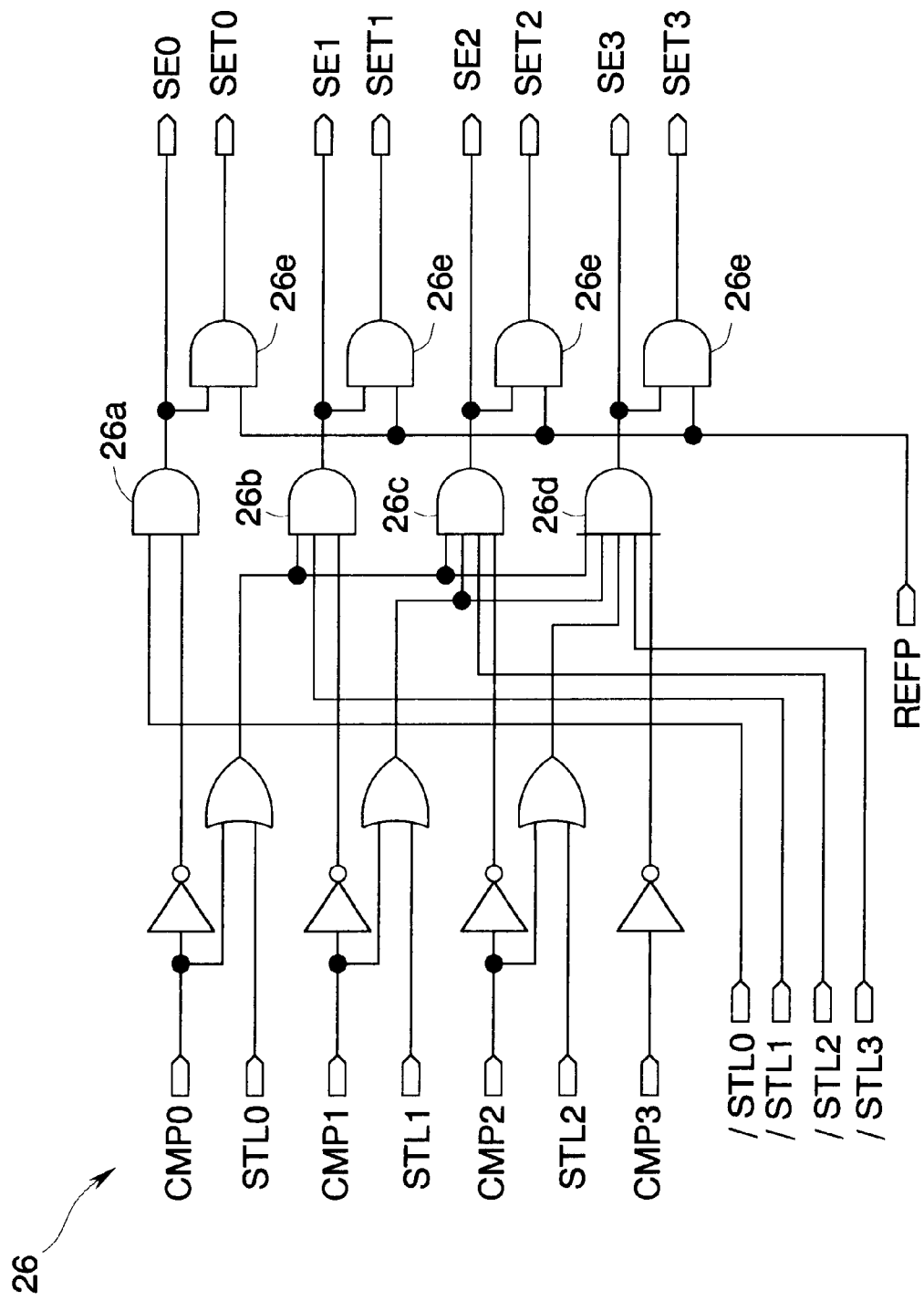
FIG. 4 is a circuit diagram showing the priority circuit in FIG. 1.

FIG. 4 shows the details of the priority 26.

The priority circuit 26 includes AND gates 26a, 26b, 26c, and 26d for outputting the select signals SE0–SE3, respectively, and four AND gates 26e for outputting the set signals SET0–SET3, respectively.

The AND gate 26a activates the select signal SE0 when the completion signal CMP0 is at low level and the status latched signal /STL0 is at high level. That is, the select signal SE0 is activated when the bank BK0 is yet to be refreshed under the refresh address REFAD and the bank BK0 is not in operation.

The AND gate 26b activates the select signal SE1 when the completion signal CMP1 is at low level, the status latched signal /STL1 is at high level, and either of the completion signal CMP0 and the status latched signal STL0 is at high level. That is, the select signal SE1 is activated when the bank BK1 is yet to be refreshed under the refresh address REFAD, the bank BK1 is not in operation, and the bank BK0 is either completed of refresh or in operation.

The AND gate 26c activates the select signal SE2 when the completion signal CMP2 is at low level, the status latched signal /STL2 is at high level, either of the completion signal CMP0 and the status latched signal STL0 is at high level, and either of the completion signal CMP1 and the status latched signal STL1 is at high level. That is, the select signal SE2 is activated when the bank BK2 is yet to be refreshed under the refresh address REFAD, the bank BK2 is not in operation, and the banks BK0 and BK1 are either completed of refresh or in operation.

The AND gate 26d activates the select signal SE3 when the completion signal CMP3 is at low level, the status latched signal /STL3 is at high level, either of the completion signal CMP0 and the status latched signal STL0 is at high level, either of the completion signal CMP1 and the status latched signal STL1 is at high level, and either of the completion signal CMP2 and the status latched signal STL2 is at high level. That is, the select signal SE3 is activated when the bank BK3 is yet to be refreshed under the refresh address REFAD, the bank BK3 is not in operation, and the banks BK0–BK2 are either completed of refresh or in operation.

As a result, when none of the banks BK0–BK3 is in operation or completed of refresh, higher priority is given in the order of the banks BK0, BK1, BK2, and BK3.

Figure 5:
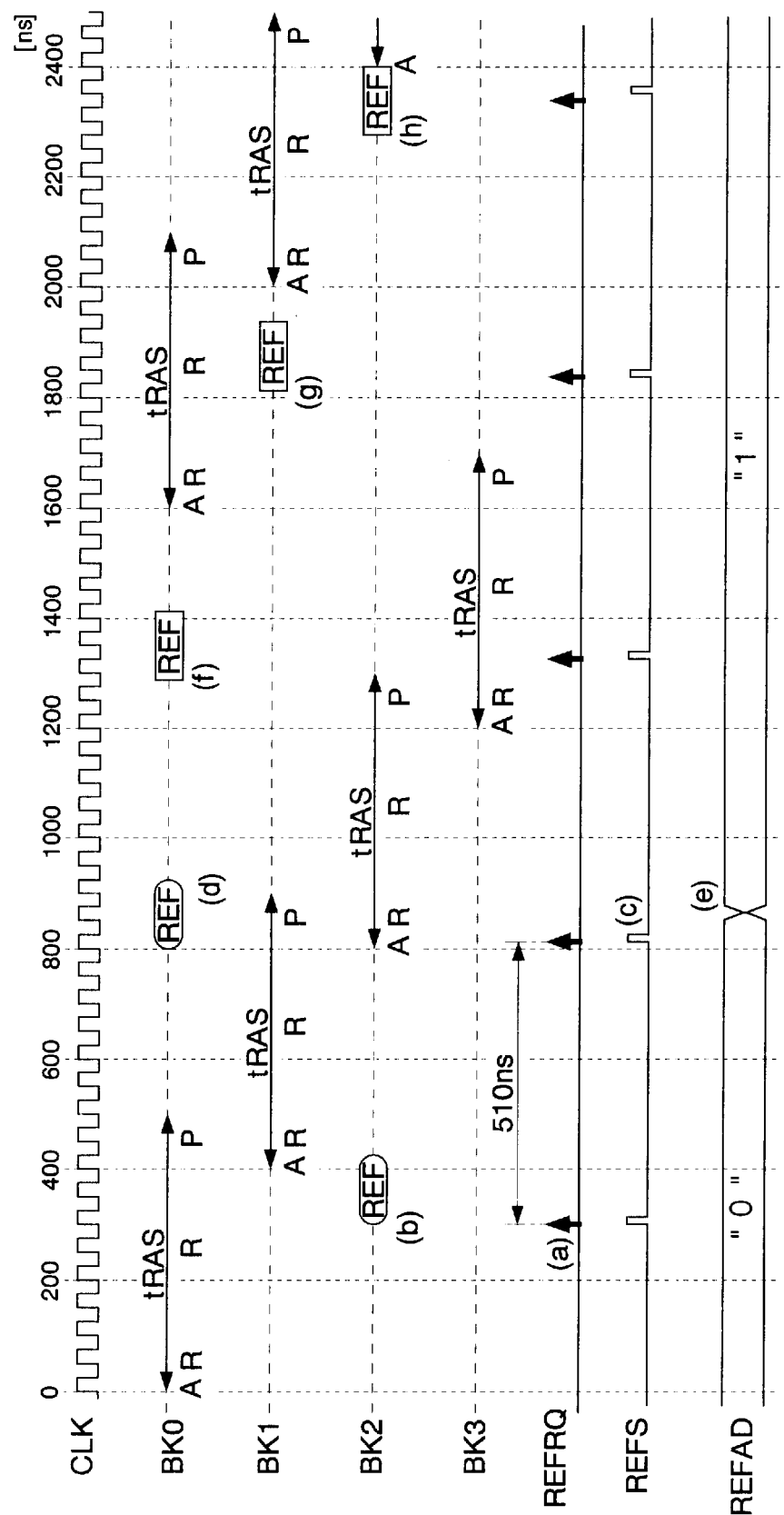
FIG. 5 is a timing chart showing an overview of the refresh operations in the first embodiment.

FIG. 5 shows an overview of the refresh operations in the SDRAM 10 described above. In the chart, "REF" sur- rounded by an ellipse and "REF" surrounded by a box represent refresh operations with refresh addresses REFAD of "0" and "1," respectively. "A," "R," and "P" in the chart represent the supply of an active command, a read command, and a precharging command, respectively.

In this example, the SDRAM 10 receives an active command, two read commands, and a precharging command to perform a burst read operation successively on each of the banks BK0–BK3. For example, during the burst read operation based on the read command supplied at 350 ns, an active command and a read command are supplied to the bank BK1. The burst length is set at "4," which means that a single read command is supplied to output four pieces of data. In other words, a read command can be supplied at every four clocks.

At the beginning of the timing chart, the banks BK1 and BK3 are completed of refresh corresponding to the refresh address REFAD (=0). On this account, the completion signals CM1 and CM3 shown in FIG. 3 have changed to high level.

The maximum time (timing specification) of tRAS (/RAS active time) of the SDRAM 10 is set at 500 ns which is shorter than the interval at which the refresh request signal REFRQ occurs. tRAS is the time that elapses from the reception of an active command to the reception of a precharging command, in which consecutive read/write operations can be performed with a word line being selected. Thus, for example, even when a refresh request occurs simultaneously with the supply of an active command so that the refresh operation cannot be performed, the read operations will be completed by the time of the next refresh request. This ensures that the bank performs a refresh operation in response to the next refresh request.

Initially, the refresh request signal REFRQ occurs during a read operation of the bank BK0 (FIG. 5(a)). The starter circuit 22 shown in FIG. 2 receives the refresh request signal REFRQ, determines that the bank BK2 is refreshable among the banks yet to be refreshed, and activates the refresh start signal REFS. Here, if both the banks BK0 and BK2 are active, the starter circuit 22 holds the refresh request, and will activate the refresh start signal REFS after either of the banks BK0 and BK2 becomes inactive.

The priority circuit 26 shown in FIG. 4 activates the select signal SE2 based on the completion signals CMP0–CMP3 and the status latched signals STL0–STL3, /STL0–/STL3. The select signal SE2 of high level is transmitted as the select signal SEL2 to the bank BK2, so that the refresh operation of the bank BK2 is performed (FIG. 5(b)). After this, the banks BK0 and BK1 are activated.

When the next refresh request signal REFRQ is activated, the starter circuit 22 determines that the bank BK0 is refreshable among the banks yet to be refreshed, and activates the refresh start signal REFS (FIG. 5(c)). Then, the refresh operation of the bank BK0 is performed (FIG. 5(d)). The refresh of the bank BK0 completes the refresh of all the banks BK0–BK3 under the refresh address REFAD (=0). The holding circuit 24 shown in FIG. 3 sets all the RS flip-flops 24a, and outputs the count up signal UP. The refresh counter 20 shown in FIG. 2 receives the count up signal UP, increments the counter value, and turns the refresh address REFAD to "1" (FIG. 5(e)).

Subsequently, each time the refresh request signal REFRQ occurs, a refresh operation corresponding to the refresh address REFAD (=1) is performed on the banks BK0–BK3 in succession (FIG. 5(f), (g), (h)). In this way, the SDRAM 10 controls its internal circuits independent of the commands supplied from exterior, to perform refresh operations. That is, the refresh operations are performed without being recognized from exterior.

Figure 6:
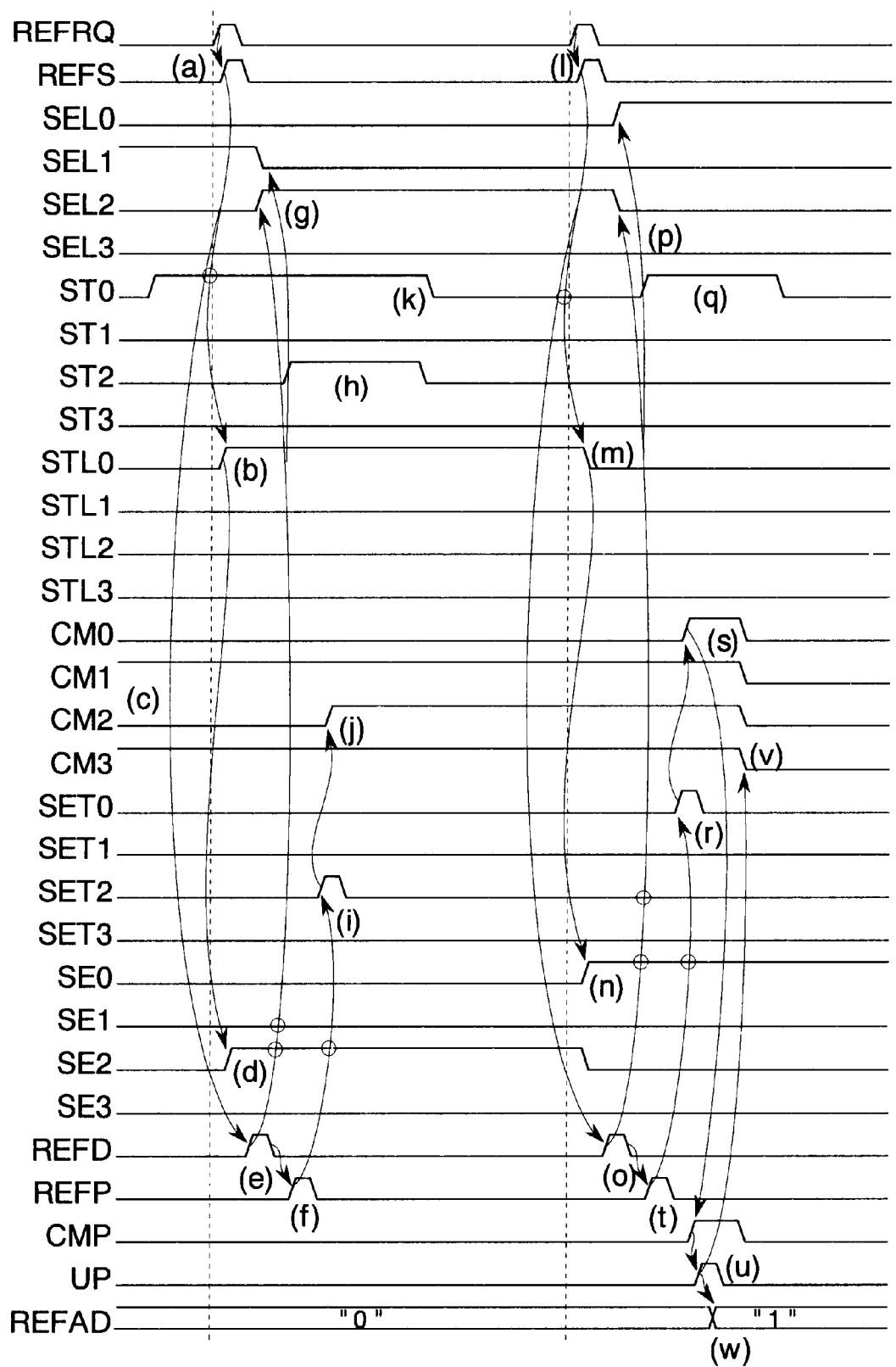
FIG. 6 is a timing chart showing the operation of the refresh control circuit in the first embodiment.

FIG. 6 shows the operations of the refresh control circuit 18 during the period of 200 to 1000 ns in the timing shown in FIG. 5.

Initially, the refresh start signal REFS is activated based on the refresh request signal REFRQ (FIG. 6(a)). Here, the bank BK0 is activated so that the status signal ST0 is at high level. The latch 28a in the status latching circuit 28 shown in FIG. 2 accepts the status signal ST0 of high level in synchronization with the rising edge of the refresh start signal REFS, and turns the status latched signal STL0 to high level (FIG. 6(b)).

In the holding circuit 24, the RS flip-flops 22a corresponding to the refresh-completed banks BK1 and BK3 are set so that the completion signals CM0–CM3 are at low level, high level, low level, and high level, respectively (FIG. 6(c)). The CMOS transmission gates 24b in the holding circuit 24 are turned on by the activation of the refresh start signal REF, transmitting the completion signals CM0–CM3 as the completion signals CMP0–CMP3 (not shown). Specifically, the completion signals CMP0 and CMP2 are turned to low level, and the completion signals CMP1 and CMP3 to high level.

The AND gate 26a of the priority circuit 26 shown in FIG. 4 is inactivated by the status latched signal /STL0 of low level. The AND gates 26b and 26d are inactivated by the completion signals CMP1 and CMP3 of high level, respectively. The AND gate 26c activates the select signal SE2 (FIG. 6(d)) under the status latched signal STL0 of high level (based on the bank BK0 being active), the completion signal CMP1 of high level (based on the completion of refresh of the bank BK1), the completion signal CMP2 of low level (based on the incompletion of refresh of the bank BK2), and the status latched signal /STL2 of high level (based on the bank BK2 being inactive). That is, because the bank BK0 is in operation and the bank BK1 is completed of refresh, the bank BK2 of the next higher priority is to be refreshed.

The delay circuit 28b in the status latching circuit 28 activates the delayed refresh signal REFD with a predetermined time of delay after the refresh start signal REFS (FIG. 6(e)). The pulse generator 28c generates the refresh pulse REFP in synchronization with the falling edge of the delayed refresh signal REFD (FIG. 6(f)).

The bank selecting circuit 30 shown in FIG. 2 activates the select signal SEL2 and inactivates the select signal SEL1 in synchronization with the rising edge of the delayed refresh signal REFD (FIG. 6(g)). Then, the refresh operation of the bank BK2 is performed under the refresh address REFAD (=0). While the bank BK2 is refreshed, the status signal ST2 is kept at high level (FIG. 6(h)).

In response to the activation of the select signal SE2, the AND gate 26e corresponding to the bank BK2 changes the set signal SET2 to high level while the refresh pulse REFP is at high level (FIG. 6(i)). The RS flip-flop 24a of the holding circuit 24, corresponding to the bank BK2 is set in synchronization with the activation of the set signal SET2, thereby turning the completion signal CM2 to high level (FIG. 6(j)). The status signal ST0 turns to low level when the precharge operation of the bank BK0 is completed (FIG. 6(k)).

The next refresh request signal REFRQ occurs to activate the refresh start signal REFS (FIG. 6(l)). The latch 28a in the status latching circuit 28 accepts the status signal ST0 of low level in synchronization with the rising edge of the refresh start signal REFS, and turns the status latched signal STL0 to low level (FIG. 6(m)). The AND gate 26a in the priority circuit 26 receives the completion signal CMP0 of low level and the status latched signal /STL0 of high level (the inverted logic of the signal STL0), and changes the select signal SE0 to high level (FIG. 6(n)). That is, the bank BK0 of the highest priority is refreshed because it is not in operation nor completed of refresh.

In the same fashion as described above, the delayed refresh signal REFD and the refresh pulse REFP are generated (FIG. 6(o)). The bank selecting circuit 30 activates the select signal SEL0 and inactivates the select signal SEL2 in synchronization with the rising edge of the delayed refresh signal REFD (FIG. 6(p)). Then, the refresh operation of the bank BK0 is performed under the refresh address REFAD (=0). While the bank BK0 is refreshed, the status signal ST0 is kept at high level (FIG. 6(q)).

In response to the activation of the select signal SE0, the AND gate 26e corresponding to the bank BK0 changes the set signal SET0 to high level while the refresh pulse REFP is at high level (FIG. 6(r)). The RS flip-flop 24a corresponding to the bank BK0 is set in synchronization with the activation of the set signal SET0, changing the completion signal CM0 to high level (FIG. 6(s)). The AND gate 24c in the holding circuit 24 receives the completion signals CM0–CM3 of high level, and changes the completion signal CMP to high level (FIG. 6(t)).

The pulse generating circuit 24d in the holding circuit 24 generates the count up signal UP (a pulse signal of high level) in synchronization with the rising edge of the completion signal CMP (FIG. 6(u)). The RS flip-flops 24a are reset in response to the count up signal UP, changing the completion signals CM0–CM3 to low level (FIG. 6(v)). The refresh counter 20 counts up in response to the count up signal UP, thereby turning the refresh address REFAD to "1" (FIG. 6(w)).

The holding circuit 24 is initialized (turned flat into information of incompletion) in synchronization with the count-up of the refresh counter 20. This avoids such problems as double refresh under an identical refresh address REFAD, and omission of refresh.

As has been described, in this embodiment, the information as to the completion/incompletion of refresh of each of the banks BK0–BK3 is held so that banks yet to be refreshed among banks not in operation are refreshed based on the held information when refresh requests occur. Since banks that are not in operation are subjected to refresh, the refresh operations can be performed without being recognized from exterior. That is, the refresh of the memory cells can be performed internally and automatically.

The refresh counter 20 counts up when all the latches 24a in the holding circuit 24 are set. Therefore, the memory cells of the banks BK0–BK3, corresponding to a single refresh address REFAD can be refreshed without fail.

The maximum time (specification) of tRAS is set to be shorter than the interval at which the refresh request occurs. This ensures that refresh cycles are inserted to all the banks BK0–BK3, allowing all the memory cells to be refreshed without fail.

There is provided the priority circuit 26 for determining a bank to be refreshed when a plurality of banks are refreshable. Therefore, the refresh of the banks BK0–BK3 can be performed without conflict.

Figure 7:
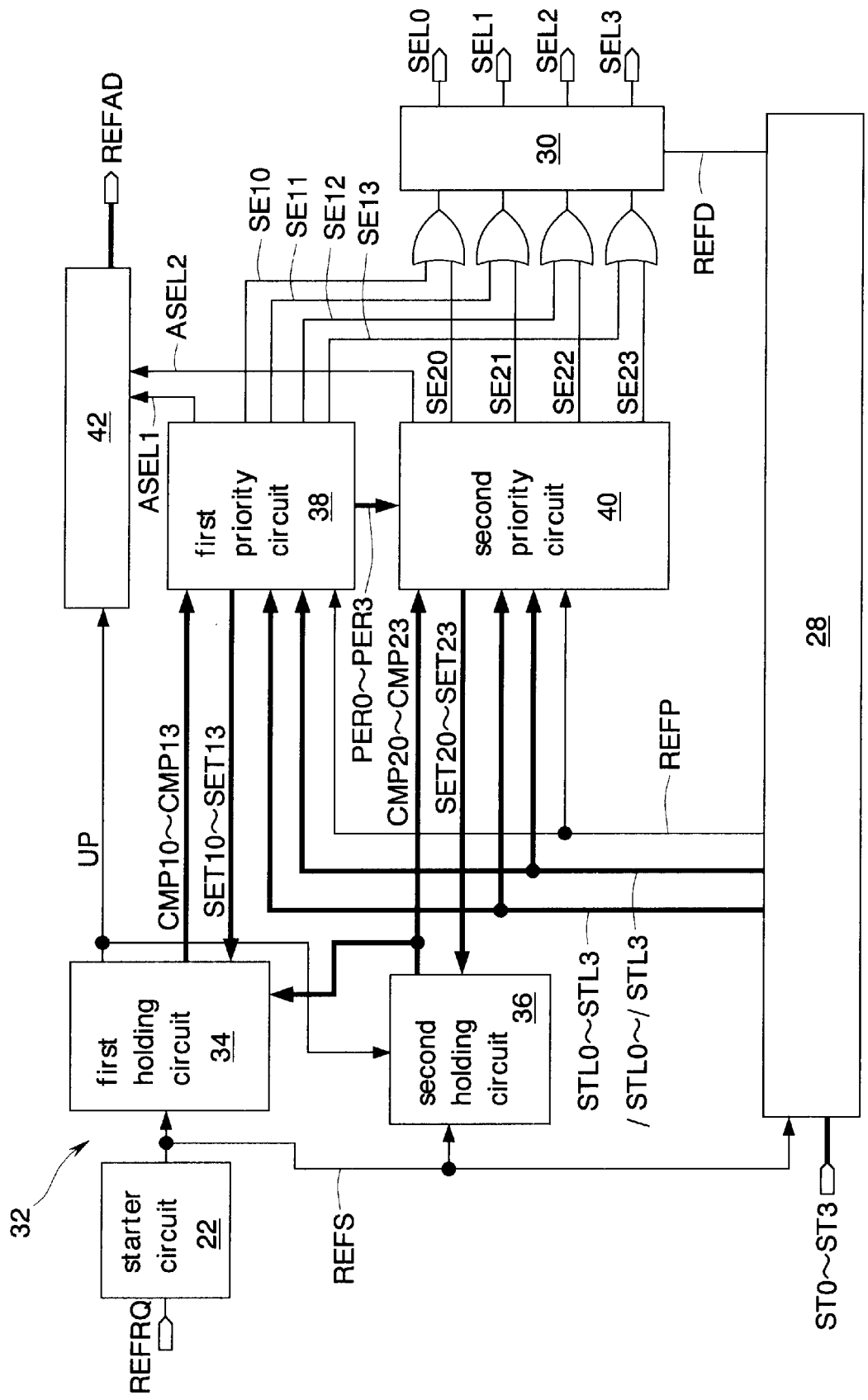
FIG. 7 is a block diagram showing a refresh control circuit in a second embodiment of the present invention.

FIG. 7 shows a second embodiment of the semiconductor memory in the present invention. The same circuits and signals as those described in the first embodiment will be designated by identical reference numbers or symbols. Detailed description thereof will be omitted here.

This embodiment includes a refresh control circuit 32 which differs from the refresh control circuit 18 of the first embodiment. The other configuration is identical to that of the first embodiment. Specifically, the semiconductor memory in the present embodiment is formed as a 64-Mbit SDRAM (Synchronous DRAM) with four banks BK0–BK3, having a maximum clock frequency of 20 MHz. The interval at which the refresh request signal REFRQ occurs is set at 510 ns.

The refresh control circuit 32 includes the starter circuit 22, the status latching circuit 28, and the bank selecting circuit 30 which are identical to those of the first embodiment, along with a first holding circuit 34, a second holding circuit 36, a first priority circuit 38, a second priority circuit 40, and a refresh counter 42. The signals input/output to/from the starter circuit 22 and the status latching circuit 28 are the same as those of the first embodiment. The signals input/output to/from the bank selecting circuit 30 are the same as those of the first embodiment except in that the OR logics of select signals SE10–SE13 from the first priority circuit 38 and select signals SE20–SE23 from the second priority circuit 40 are input thereto.

The first holding circuit 34 receives the refresh start signal REFS, set signals SET10–SET13 from the first priority circuit 38, and completion signals CMP20–CMP23 from the second holding circuit 36, and outputs completion signals CMP10–CMP13 and a count up signal UP.

The second holding circuit 36 receives the refresh start signal REFS, the count up signal UP from the first holding circuit 34, and set signals SET20–SET23 from the second priority circuit 40, and outputs the completion signals CMP20–CMP23.

The first priority circuit 38 receives the completion signals CMP10–CMP13, the status latched signals STL0–STL3 and /STL0–/STL3, and the refresh pulse REFP, and outputs the set signals SET10–SET13, the select signals SE10–SE13, an address select signal ASEL1, and permission signals PER0–PER3.

The second priority circuit 40 receives the completion signals CMP20–CMP23, the status latched signals STL0–STL3 and /STL0–/STL3, and the refresh pulse REFP, and outputs the set signals SET20–SET23, the select signals SE20–SE23, and an address select signal ASEL2.

Figure 8:
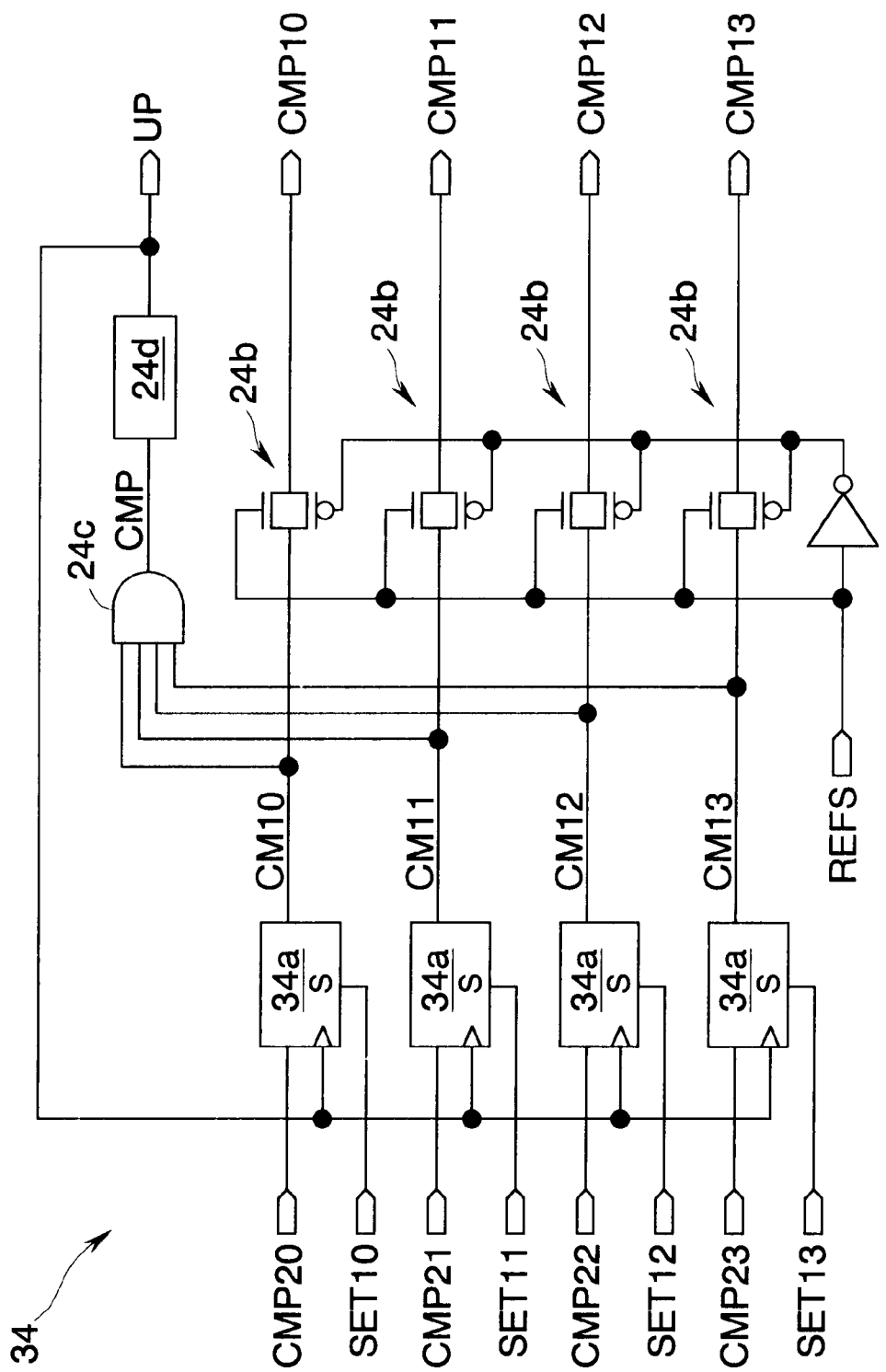
FIG. 8 is a circuit diagram showing the first holding circuit in FIG. 7.

FIG. 8 shows the details of the first holding circuit 34.

The first holding circuit 34 includes latches 34a with set terminals S, instead of the RS flip-flops 24a of the holding circuit 24 in the first embodiment. The configuration excepting the latches 34a is identical to that of the holding circuit 24. The latches 34a accept the completion signals CMP20–CMP23 in synchronization with the rising edge of the count up signal UP, and output the accepted signals as completion signals CM10–CM13, respectively. The latches 34a turn the completion signals CM10–CM13 to high level upon receiving the set signals SET10–SET13 at their set terminals S, respectively. The CMOS transmission gates 24b are turned on by the refresh start signal REFS of high level, transmitting the completion signals CM10–CM13 as the completion signals CMP10–CMP13, respectively.

Figure 9:
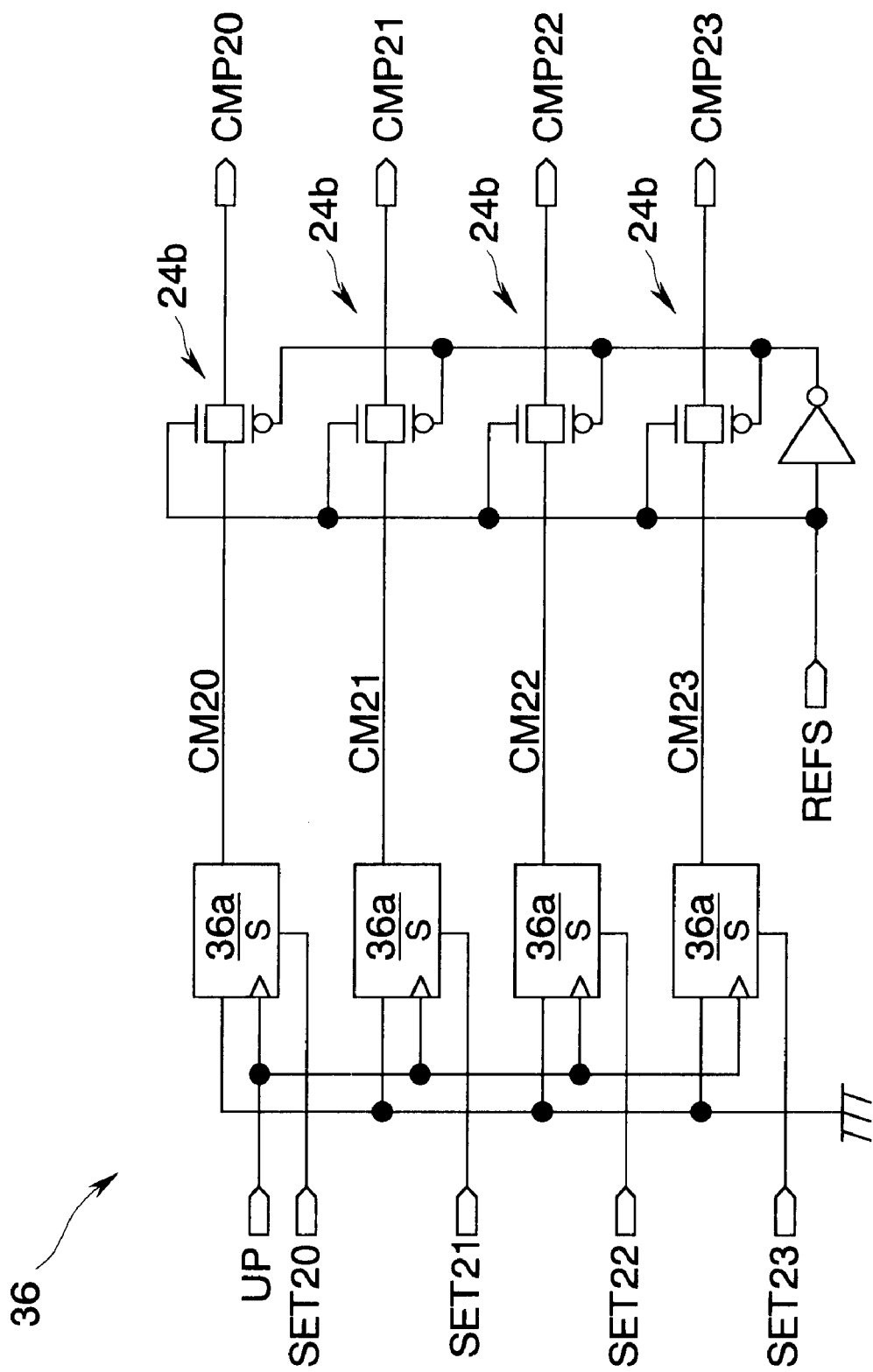
FIG. 9 is a circuit diagram showing the second holding circuit in FIG. 7.

FIG. 9 shows the details of the second holding circuit 36.

The second holding circuit 36 includes latches 36a having set terminals S, corresponding to the banks BK0–BK3, and CMOS transmission gates 24b. The latches 36a turn their respective completion signals CM20–CM23 to low level in synchronization with the rising edge of the count up signal UP. The latches 36b turn the completion signals CM20–CM23 to high level upon receiving the set signals SET10–SET13 at their set terminals S. The CMOS transmission gates 24b are turned on by the refresh start signal REFS of high level, transmitting the completion signals CM20–CM23 as the completion signals CMP20–CMP23, respectively.

Figure 10:
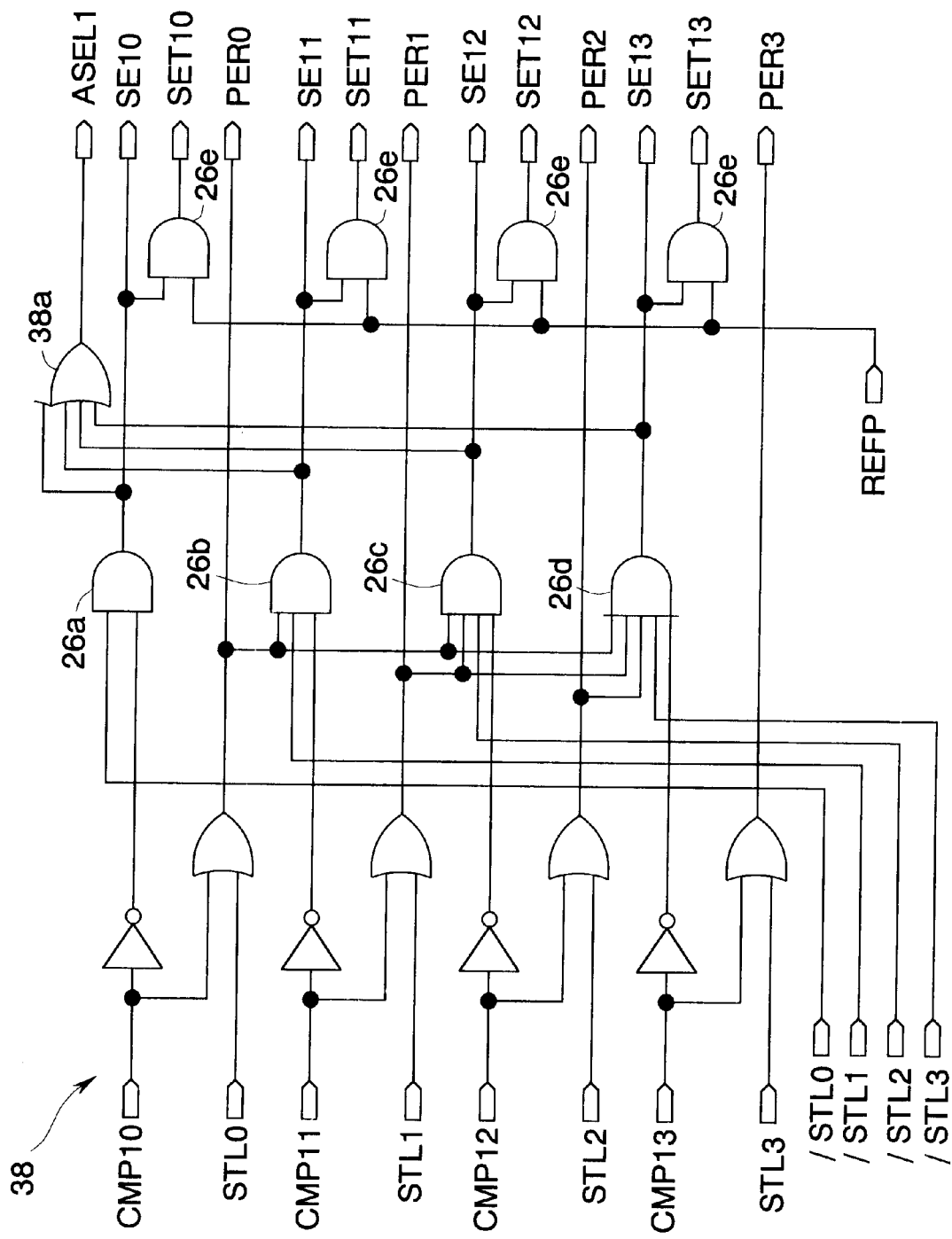
FIG. 10 is a circuit diagram showing the first priority circuit in FIG. 7.

FIG. 10 shows the details of the first priority circuit 38.

The first priority circuit 38 is constituted by adding an OR gate 38a to the priority circuit 26 of the first embodiment. The configuration excepting the OR gate 38a is identical to that of the priority circuit 26. The OR gate 38a changes the address select signal ASEL1 to high level when any of the select signals SE10–SE13 output from the AND gates 26a–26d is at high level. Moreover, the first priority circuit 38 outputs the OR logic of the completion signal CMP10 and the status latched signal STL0 as the permission signal PER0, outputs the OR logic of the completion signal CMP11 and the status latched signal STL1 as the permission signal PER1, outputs the OR logic of the completion signal CMP12 and the status latched signal STL2 as the permission signal PER2, and outputs the OR logic of the completion signal CMP13 and the status latched signal STL3 as the permission signal PER3. Like the priority circuit 26 of the first embodiment, the priority circuit 38 provides priority in the order of the banks BK0, BK1, BK2, and BK3.

Figure 11:
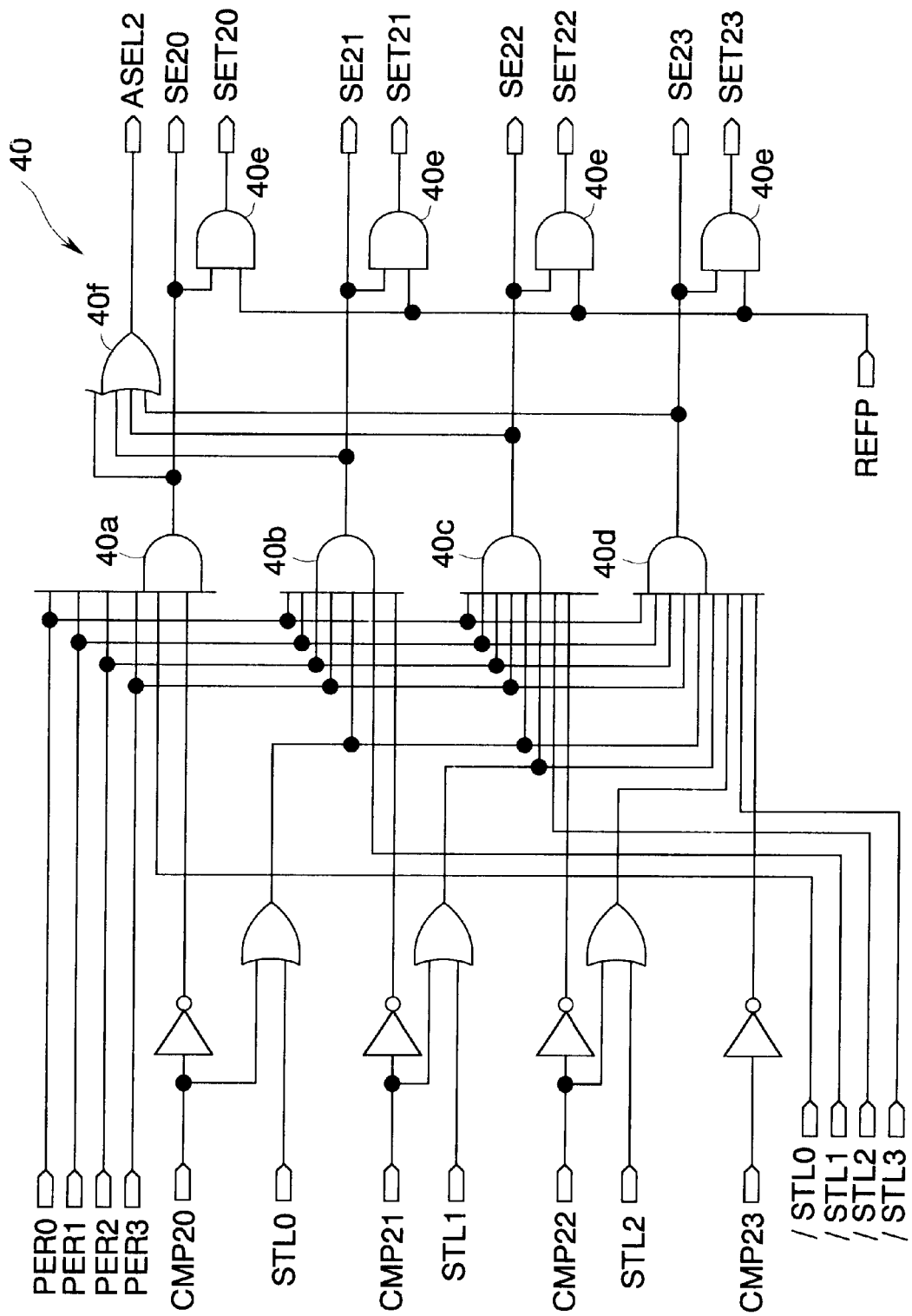
FIG. 11 is a circuit diagram showing the second priority circuit in FIG. 7.

FIG. 11 shows the details of the second priority circuit 40.

The second priority circuit 40 includes: AND gates 40a, 40b, 40c, and 40d for outputting the select signals SE20–SE23, respectively; four AND gates 40e for outputting the set signals SET20–SET23, respectively; and an OR gate 40f identical to the OR gate 38a in the priority circuit 38.

The AND gate 40a activates the select signal SE20 when the completion signal CMP20 is at low level, the status latched signal /STL0 is at high level, and the permission signals PER0–PER3 are at high level. That is, the select signal SE20 is activated when all the permission signals PER0–PER3 are at high level, the bank BK0 is yet to be refreshed under the refresh address REFAD, and the bank BK0 is not in operation.

The AND gate 40b activates the select signal SE21 when the completion signal CMP21 is at low level, the status latched signal /STL1 is at high level, either of the completion signal CMP20 and the status latched signal STL0 is at high level, and the permission signals PER0–PER3 are at high level. That is, the select signal SE21 is activated when all the permission signals PER0–PER3 are at high level, the bank BK1 is yet to be refreshed under the refresh address REFAD, the bank BK1 is not in operation, and the bank BK0 is either completed of refresh or in operation.

The AND gate 40c activates the select signal SE22 when the completion signal CMP22 is at low level, the status latched signal /STL2 is at high level, either of the completion signal CMP20 and the status latched signal STL0 is at high level, either of the completion signal CMP21 and the status latched signal STL1 is at high level, and the permission signals PER0–PER3 are at high level. That is, the select signal SE22 is activated when all the permission signals PER0–PER3 are at high level, the bank BK2 is yet to be refreshed under the refresh address REFAD, the bank BK2 is not in operation, and the banks BK0 and BK1 are either completed of refresh or in operation.

The AND gate 40d activates the select signal SE23 when the completion signal CMP23 is at low level, the status latched signal /STL3 is at high level, either of the completion signal CMP20 and the status latched signal STL0 is at high level, either of the completion signal CMP21 and the status latched signal STL1 is at high level, either of the completion signal CMP22 and the status latched signal STL2 is at high level, and the permission signals PER0–PER3 are at high level. That is, the select signal SE23 is activated when all the permission signals PER0–PER3 are at high level, the bank BK3 is yet to be refreshed under the refresh address REFAD, the bank BK3 is not in operation, and the banks BK0–BK2 are either completed of refresh or in operation.

Like the priority circuit 38, the second priority circuit 40 provides priority in the order of the banks BK0, BK1, BK2, and BK3. Between the first priority circuit 38 and the second priority circuit 40, the first priority circuit 38 is given priority.

Figure 12:
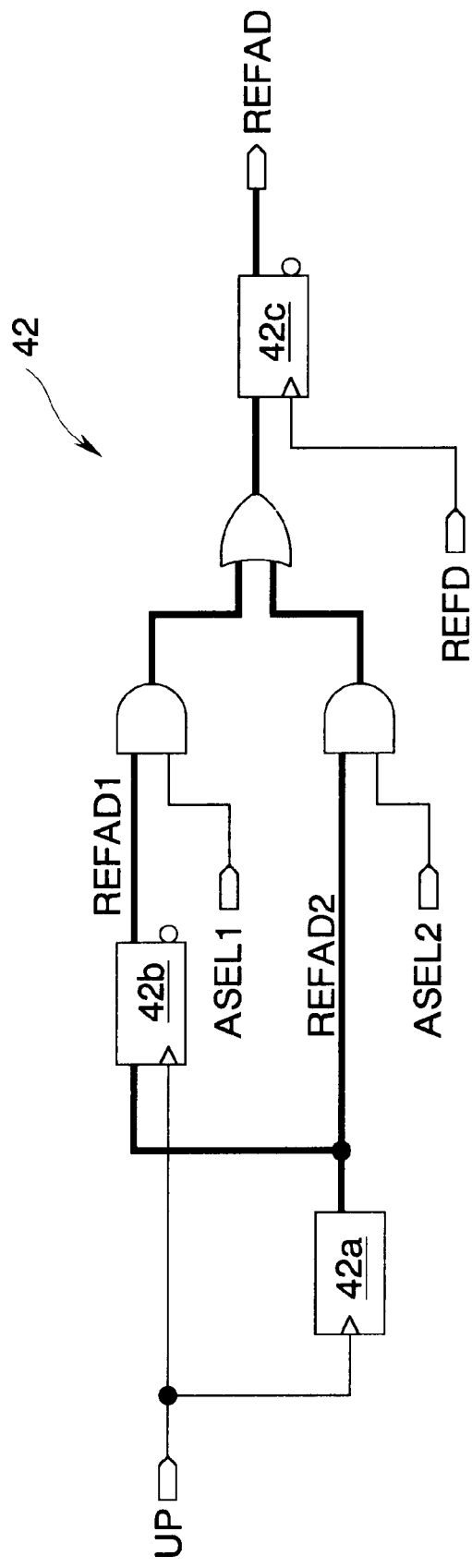
FIG. 12 is a circuit diagram showing the refresh counter in FIG. 7.

FIG. 12 shows the details of the refresh counter 42.

The refresh counter 42 has a counter 42a, latches 42b and 42c, two AND gates, and an OR gate. The counter 42a counts up in response to the rising edge of the count up signal UP. The latch 42b accepts the counter value of the counter 42a, or a refresh address signal REFAD2, in synchronization with the rising edge of the count up signal UP, and outputs the accepted signal as a refresh address signal REFAD1. The refresh address signal REFAD1 is transmitted to the latch 42c when the address select signal ASEL1 is at high level. The refresh address signal REFAD2 is transmitted to the latch 42c when the address select signal ASEL2 is at high level. The latch 42c accepts either of the refresh address signals REFAD1 and REFAD2 in synchronization with the rising edge of the delayed refresh signal REFD, and outputs the accepted signal as the refresh address REFAD.

Figure 13:
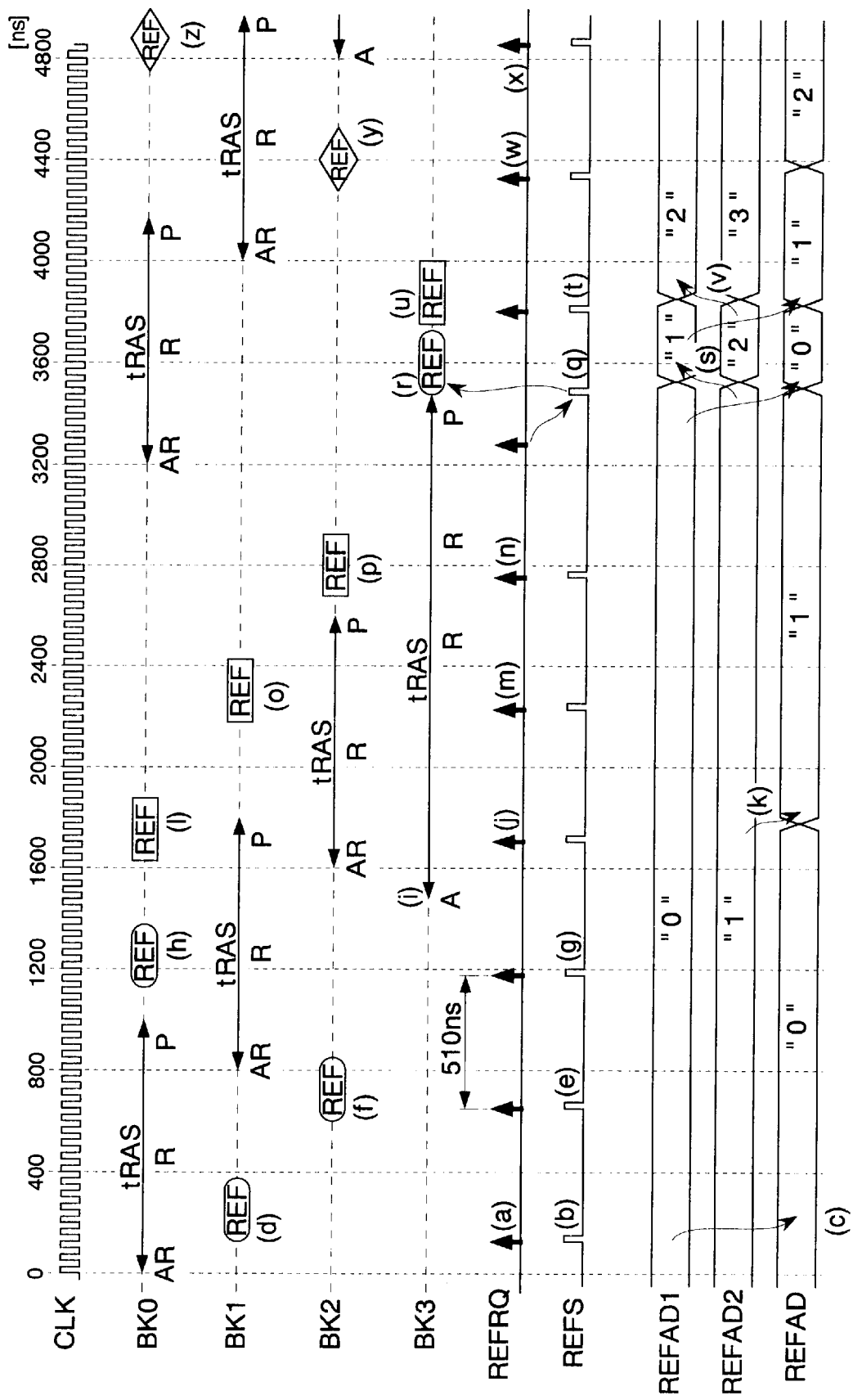
FIG. 13 is a timing chart showing an overview of the refresh operations in the second embodiment.

FIG. 13 shows an overview of the refresh operations in the SDRAM described above. In the chart, "REF" surrounded by an ellipse, "REF" surrounded by a box, and "REF" surrounded by a rhombus represent refresh operations with refresh addresses REFAD of "0," "1," and "2," respectively. "A," "R," and "P" in the chart represent the supply of an active command, a read command, and a precharging command, respectively. In this example, the burst length is set at "8," which means that a single read command is supplied to output eight pieces of data. In other words, a read command can be supplied at every eight clocks.

At the beginning of the timing chart, the latch 42b of the refresh counter 42 shown in FIG. 12 outputs the refresh address REFAD1 (=0), and the counter 42a outputs the refresh address REFAD2 (=1). All the banks BK0–BK3 are yet to be refreshed under the refresh addresses REFAD1 and REFAD2.

The refresh circuit 16 (FIG. 1) generates the refresh request signal REFRQ at every 510 ns as in the first embodiment. The maximum time (timing specification) of tRAS (/RAS active time) of this SDRAM is set at 2000 ns. To be more specific, the maximum time of tRAS is made smaller than "(interval at which refresh request occurs)× (number of banks)×(number of holding circuits −1)." When a bank indicated of incompletion by the first holding circuit 34 corresponding to the refresh address REFAD1 is in operation, it is possible to refresh a plurality of banks that are indicated of incompletion by the second holding circuit 36 corresponding to another refresh address REFAD2. Therefore, making the maximum time of tRAS shorter than the time obtained by multiplying the interval at which the refresh request occurs by "(number of banks)×(number of holding circuits−1)" ensures that any of the banks BK0–BK3 is refreshed in response to every refresh request. That is, even though the maximum time available for consecutive access to each bank is extended, all the memory cells can be refreshed without fail.

In this embodiment, the banks BK0–BK3 each require two refreshes for a period over which eight refresh requests occur (4080 ns).

Initially, the refresh request signal REFRQ occurs during a read operation of the bank BK0 (FIG. 13(a)). The starter circuit 22 shown in FIG. 7 determines that the bank BK1 is refreshable, and activates the refresh start signal REFS (FIG. 13(b)).

The banks BK1–BK3 are not in operation, nor completed of refresh. Therefore, the first priority circuit 38 shown in FIG. 10 keeps the permission signals PER1–PER3 at low level. That is, when any bank corresponding to the refresh address REFAD1 is refreshable, none of the AND gates 40a–40d in the second priority circuit 40 shown in FIG. 11 is activated. This prevents conflict between the refreshes under the refresh addresses REFAD1 and REFAD2.

The AND gate 26b in the first priority circuit 38 receives the status latched signals STL0 and /STL1 of high level and, through the inverter, the completion signal CMP11 of low level, and changes the select signal SE11 to high level. The select signal SE11 of high level turns the address select signal ASEL1 to high level. The refresh counter 42 receives the address select signal ASEL1 of high level, and outputs the refresh address signal REFAD1 (=0) as the refresh address REFAD (FIG. 13(c)). Then, the refresh operation of the bank BK0 is performed under the refresh address REFAD (FIG. 13(d)).

When the next refresh request signal REFRQ is activated, the starter circuit 22 determines that the bank BK2 is refreshable, and activates the refresh start signal REFS (FIG. 13(e)). The AND gate 26c in the first priority circuit 38 receives the completion signal CMP11 and the status latched signal /STL2 of high level and, through the inverter, the completion signal CMP11 of low level, and changes the select signal SE12 to high level. Under the permission signals PER2 and PER3 of low level, none of the AND gates 40a–40d in the second priority circuit 40 is activated. Then, the refresh operation of the bank BK2 is performed (FIG. 13(f)).

When the next refresh request signal REFRQ is activated, the bank BK0 is not in operation. The starter circuit 22 determines that the bank BK0 is refreshable, and activates the refresh start signal REFS (FIG. 13(g)). The AND gate 26a in the first priority circuit 38 receives the status latched signal /STL1 of high level and, through the inverter, the completion signal CMP10 of low level, and changes the select signal SE10 to high level. Then, the refresh operation of the bank BK0 is performed (FIG. 13(h)).

Subsequently, an active command is supplied to start read operations of the bank BK3 (FIG. 13(i)).

There occurs the next refresh request signal REFRQ (FIG. 13(j)). Since the banks BK0, BK1, and BK2 are completed of refresh, the completion signals CMP10, CMP11, and CMP12 are at high level. Since the bank BK3 is in operation, the status latched signal STL3 is at high level. As a result, all the permission signals PER0–PER3 turn to high level, permitting the second priority circuit 40 to operate. That is, when none of the banks BK0–BK3 is refreshable under the refresh address REFAD1, the second priority circuit 40 operates to refresh the banks BK0–BK3 by using the refresh address REFAD2.

The second priority circuit 40 receives the completion signal CMP20 of low level through the inverter, and the status latched signal /STL0 of high level, and changes the select signal SE20 and the address select signal ASEL2 to high level.

The refresh counter 42 receives the address select signal ASEL2 of high level, and outputs the refresh address signal REFAD2 (=1) as the refresh address REFAD (FIG. 13(k)). Then, the refresh operation of the bank BK0 is performed under the refresh address REFAD (FIG. 13(l)).

After this, the refresh request signals REFRQ occur in succession (FIG. 13(m), (n)). Since the bank BK3 is in operation, the bank BK3 cannot be refreshed under the refresh address REFAD (=0). Therefore, the refresh operations of the banks BK1 and BK2 are performed under the refresh address REFAD (=1) (FIG. 13(o), (p)).

When the next refresh request signal REFRQ occurs, there is no bank refreshable; therefore, the starter circuit 22 temporarily holds the refresh request. After the precharge operation of the bank BK3 is completed, the starter circuit 22 activates the refresh start signal REFS (FIG. 13(q)). Then, the refresh operation corresponding to the refresh address REFAD (=0) is performed on the bank BK3 (FIG. 13(r)).

The refresh of the bank BK3 sets all the latches 34a of the first holding circuit 34 shown in FIG. 8, generating the count up signal UP. The latch 42b in the refresh counter 42 accepts the refresh address REFAD2 from the counter 42a, and outputs the same as the refresh address REFAD1. The counter 42a counts up. As a result, the refresh addresses REFAD1 and REFAD2 become "1" and "2," respectively (FIG. 13(s)). The information of the second holding circuit 36 is transferred to the first holding circuit 34. The latches 36a in the second holding circuit 36 are reset in response to the activation of the count up signal UP.

When the next refresh request signal REFRQ occurs, the starter circuit 22 determines that the bank BK3 is refreshable, and activates the refresh start signal REFS (FIG. 13(t)). Then, the refresh operation of the bank BK3 is performed under the refresh address REFAD (=1) (FIG. 13(u)).

The refresh of the bank BK3 sets all the latches 34a of the first holding circuit 34 shown in FIG. 8 again, generating the count up signal UP. The refresh address REFAD1 becomes "2," and the refresh address REFAD2 becomes "3" (FIG. 13(v)). The information of the second holding circuit 36 is transferred to the first holding circuit 34. The latches 36a in the second holding circuit 36 are reset in response to the activation of the count up signal UP.

Subsequently, the refresh request signals REFRQ occur in succession (FIG. 13(w), (x)). Since the bank BK3 is activated, the refreshes of the banks BK2 and BK0 are performed under the refresh address REFAD (=2) (FIG. 13(y), (z)).

Figure 14:
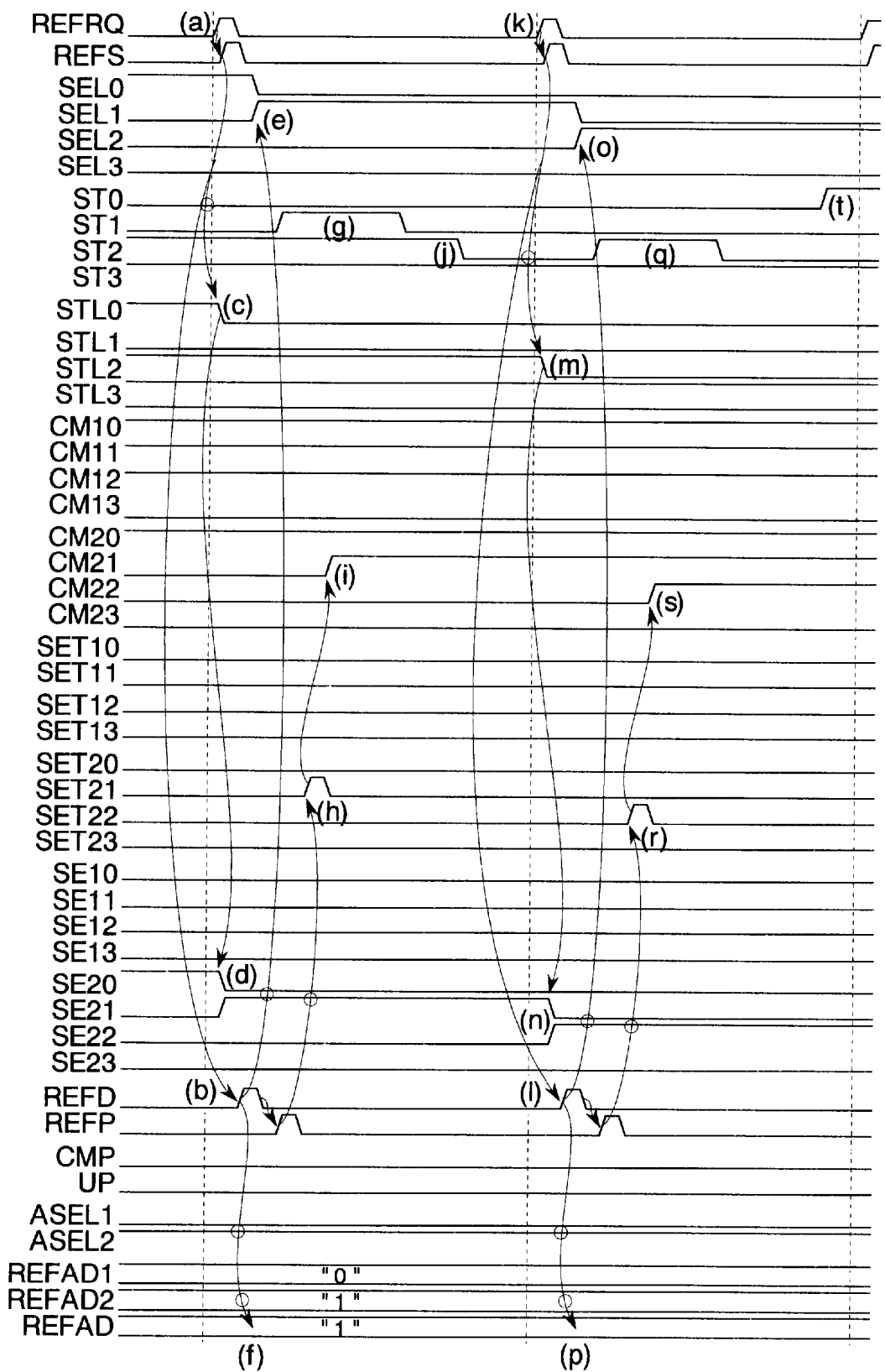
FIG. 14 is a timing chart showing the operation of the refresh control circuit in the second embodiment.
Figure 15:
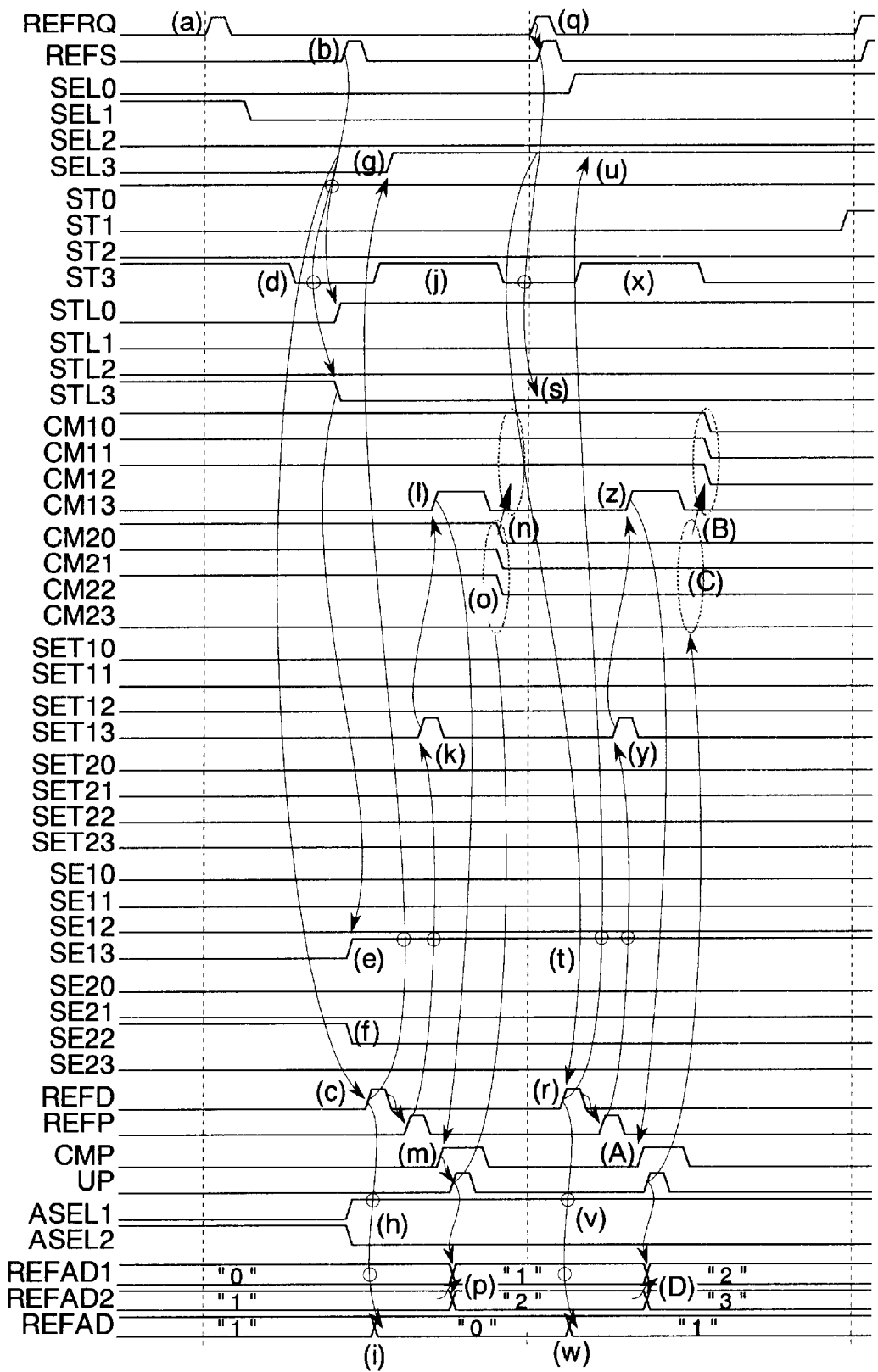
FIG. 15 is a timing chart showing the operation of the refresh control circuit in the second embodiment.

FIGS. 14 and 15 show the operations of the refresh control circuit 32 during the period of 2000 to 4000 ns in the timing shown in FIG. 13. The third refresh request signal REFRQ shown in FIG. 14 corresponds to the first refresh request signal REFRQ in FIG. 15.

At the beginning of the timing chart of FIG. 14, the banks BK2 and BK3 are performing read operations, with their status signals ST2 and ST3 at high level. The select signals SEL0–SEL3 retain the statuses of the select signals SE10–SE13 and SE20–SE23 at the previous occurrence of the delayed refresh signal REFD. Since the bank BK0 has been refreshed under the refresh address (=1) at the previous refresh request, the select signal SE20 is at high level.

The status latched signals STL0–STL3 retain the statuses of the banks BK0–BK3 at the previous occurrence of the refresh request signal REFRQ. The banks BK0–BK2 are completed of refresh corresponding to the refresh address REFAD (=0). Only the bank BK0 is completed of refresh corresponding to the refresh address REFAD (=1). Accordingly, the completion signals CM10–CM12 and CM20 are at high level.

When the refresh request signal REFRQ occurs, the refresh start signal REFS, the delayed refresh signal REFD, and the refresh pulse REFP are activated in succession (FIG. 14(a), (b)). The status latching circuit 28 shown in FIG. 7 accepts the status signal ST0 of low level in synchronization with the refresh start signal REFS, and changes the status latched signal STL0 to low level (FIG. 14(c)). The second holding circuit 36 shown in FIG. 9 outputs the completion signal CM20 of high level as the completion signal CMP20 (not shown) in synchronization with the refresh start signal REFS. In accordance with the change of the completion signal CMP20, the AND gates 40a and 40b of the second priority circuit 40 shown in FIG. 11 change the select signals SE20 and SE21 to low level and high level, respectively (FIG. 14(d)). The bank selecting circuit 30 shown in FIG. 7 receives the select signal SE21 of high level, and changes the select signal SEL1 to high level (FIG. 14(e)). The address select signal ASEL2 receives the select signal SE20 of high level, and remains at high level. The refresh counter 42 shown in FIG. 12 receives the address select signal ASEL2 of high level, and outputs the refresh address signal REFAD2 (=1) as the refresh address REFAD (FIG. 14(f)). Then, the refresh operation of the bank BK1 is performed under the refresh address REFAD. While the bank BK1 is refreshed, the status signal ST1 is kept at high level (FIG. 14(g)).

In the second priority circuit 40, the AND gate 40e that receives the select signal SE21 changes the set signal SET21 to high level while the refresh pulse REFP is at high level (FIG. 14(h)). In the second holding circuit 36, the latch 36a that receives the set signal SET21 changes the completion signal CM21 to high level (FIG. 14(i)). The status signal ST2 turns to low level when the precharge operation of the bank BK2 is completed (FIG. 14(j)).

The next refresh request signal REFRQ occurs to activate the refresh start signal REFS, the delayed refresh signal REFD, and the refresh pulse REFP in succession (FIG. 14(k), (l)).

The status latching circuit 28 accepts the status signal ST2 of low level in synchronization with the refresh start signal REFS, and changes the status latched signal STL2 to low level (FIG. 14(m)). The second holding circuit 36 outputs the completion signal CM21 of high level as the completion signal CMP21 (not shown), in synchronization with the refresh start signal REFS. In accordance with the change of the completion signal CMP21, the AND gates 40b and 40c in the second priority circuit 40 change the select signals SE21 and SE22 to low level and high level, respectively (FIG. 14(n)). The bank selecting circuit 30 receives the select signal SE22 of high level, and changes the select signal SEL2 to high level (FIG. 14(o)). The address select signal ASEL2 receives the select signal SE21 of high level, and remains at high level. The refresh counter 42 outputs, as the refresh address REFAD, the refresh address signal REFAD2 (=1) which is selected by the address select signal ASEL2 of high level (FIG. 14(p)). Then, the refresh operation of the bank BK2 is performed under the refresh address REFAD. While the bank BK2 is refreshed, the status signal ST2 is kept at high level (FIG. 14(q)).

In the second priority circuit 40, the AND gate 40e that receives the select signal SE22 changes the set signal SET22 to high level while the refresh pulse REFP is at high level (FIG. 14(r)). In the second holding circuit 36, the latch 36a that receives the set signal SET22 changes the completion signal CM22 to high level (FIG. 14(s)). The status signal ST0 turns to high level in response to the active command corresponding to the bank BK0 (FIG. 14(t)).

In FIG. 15, the next refresh request signal REFRQ occurs (FIG. 15(a)). Here, the bank BK3 which is yet to be refreshed under the refresh address REFAD1 (=0) is performing a read operation. The starter circuit 22 waits for the precharge operation of the bank BK3 to be completed, and then activates the refresh start signal REFS (FIG. 15(b)). The activation of the refresh start signal REFS activates the delayed refresh signal REFD and the refresh pulse REFP in succession (FIG. 15(c)).

The status latching circuit 28 accepts the status signal ST0 of high level and the status signal ST3 of low level in synchronization with the refresh start signal REFS, and changes the status latched signals STL0 and STL3 to high level and low level, respectively (FIG. 15(d)).

Here, the first holding circuit 34 keeps only the completion signal CMP13 at low level (not shown) based on the completion signal CM13 of low level. The second holding circuit 36 keeps only the completion signal CMP23 at low level (not shown) based on the completion signal CM23 of low level. The AND gate 26d in the first priority circuit 38 receives the status latched signal /STL3 of high level (the status latched signal STL3 of low level), and changes the select signal SE13 to high level (FIG. 15(e)). The permission signal PER3 turns to low level (not shown) under the completion signal CMP13 of low level and the status latched signal STL3 of low level. The AND gates 40a–40d in the second priority circuit 40 are inactivated in response to the permission signal PER3 of low level. Accordingly, the select signal SE22 turns to low level (FIG. 15(f)).

The bank selecting circuit 30 receives the select signal SE13 of high level, and changes the select signal SEL3 to high level (FIG. 15(g)). The address select signal ASEL1 turns to high level in response to the select signal SE13 of high level. The address select signal ASEL2 turns to low level in response to the select signal SE22 of low level (FIG. 15(h)). The refresh counter 42 receives the address select signal ASEL1 of high level, and outputs the refresh address REFAD1 (=0) as the refresh address REFAD (FIG. 15(i)). Then, the refresh operation of the bank BK3 is performed under the refresh address REFAD. While the bank BK3 is refreshed, the status signal ST3 is kept at high level (FIG. 15(j)).

In the first priority circuit 38, the AND gate 26e that receives the select signal SE13 changes the set signal SET13 to high level while the refresh pulse REFP is at high level (FIG. 15(k)). In the first holding circuit 34, the latch 34a that receives the set signal SET13 changes the completion signal CM13 to high level (FIG. 15(l)). Then, the completion signal CMP and the count up signal UP are generated (FIG. 15(m)).

The latches 34a in the first holding circuit 34 accept the completion signals CMP20–CMP23 output from the second holding circuit, respectively, in synchronization with the count up signal UP. That is, the information held in the second holding circuit 36 is transferred to the first holding circuit 34 (FIG. 15(n)). The latches 36a in the second holding circuit 36 are reset in synchronization with the count up signal UP (FIG. 15(o)). The refresh counter 42 transfers the refresh address REFAD2 to the latch 42b in synchronization with the count up signal UP, and counts up the refresh address REFAD2 (FIG. 15(p)).

The next refresh request signal REFRQ occurs to activate the refresh start signal REFS, the delayed refresh signal REFD, and the refresh pulse REFP in succession (FIG. 15(q), (r)).

The status latching circuit 28 newly accepts the status signal ST3 of low level in synchronization with the refresh start signal REFS, and holds the status latched signal STL3 at low level (FIG. 15(s)).

Here, the first holding circuit 34 keeps only the completion signal CMP13 at low level (not shown) based on the completion signal CM13 of low level. The second holding circuit 36 keeps all the completion signals CMP20–CMP23 at low level (not shown) based on the completion signals CM20–CM23 of low level. The AND gate 26d in the first priority circuit 38 receives the status latched signal /STL3 of high level (the status latched signal STL3 of low level), and keeps the select signal SE13 at high level (FIG. 15(t)). The permission signal PER3 turns to low level (not shown) under the completion signal CMP13 and the status latched signal STL3 of low level. The AND gates 40a–40d in the second priority circuit 40 are inactivated in response to the permission signal of low level.

The bank selecting circuit 30 receives the select signal SE13 of high level, and keeps the select signal SEL3 at high level (FIG. 15(u)). The address select signals ASEL1 and ASEL2 are kept at high level and low level, respectively (FIG. 15(v)). The refresh counter 42 receives the address select signal ASEL1 of high level, and outputs the refresh address REFAD (=1) as the refresh address REFAD (FIG. 15(w)). Then, the refresh operation of the bank BK3 is performed under the refresh address REFAD. While the bank BK3 is refreshed, the status signal ST3 is kept at high level (FIG. 15(x)).

In the first priority circuit 38, the AND gate 26e that receives the select signal SE13 changes the set signal SET13 to high level while the refresh pulse REFP is at high level (FIG. 15(y)). In the first holding circuit 34, the latch 34a that receives the set signal SET13 changes the completion signal CM13 to high level (FIG. 15(z)). Then, the completion signal CMP and the count up signal UP are generated (FIG. 15(A)). In the same fashion as described above, the information held in the second holding circuit 36 is transferred to the first holding circuit 34 (FIG. 15(B)). The latches 36a in the second holding circuit 36 are reset in synchronization with the count up signal UP (FIG. 15(C)). The refresh counter 42 transfers the refresh address REFAD2 to the latch 42b in synchronization with the count up signal UP, and counts up the refresh address REFAD2 (FIG. 15(D)).

This embodiment can offer the same effects as those obtained from the first embodiment described above. Moreover, in this embodiment, consecutive two refresh address signals REFAD1 and REFAD2 are generated at the same time, and the first holding circuit 34 and the second holding circuit 36 corresponding to these addresses REFAD1 and REFAD2 are provided. Therefore, the information as to the completion/incompletion of refresh can be held with respect to the two addresses REFAD1 and REFAD2. As a result, when a bank having memory cells to be refreshed under the refresh address REFAD1 is in operation, memory cells on other banks can be refreshed under the refresh address REFAD2. Accordingly, tRAS for continuous access to a single bank can be extended. In this example, the maximum time of tRAS can be made four times as much as in the first embodiment. This allows an increase in the maximum number of times of consecutive access that is generally referred to as page operation.

The two refresh addresses REFAD1 and REFAD2 are generated by the counter 42a and the latch 42b for holding the previous counter value. That is, the two refresh address REFAD1 and REFAD2 can be generated by simple circuitry.

When all the latches 34a in the second holding circuit 34 are set, the information held by the latches 36a in the second holding circuit 36 is transferred to latches 34a, and then the latches 36a are reset. In the meantime, the count of the counter 42a (the refresh address signal REFAD2) is transferred to the latch 42b, and then the counter 42a is counted up. Therefore, even when the two refresh addresses REFAD1 and REFAD2 are used to refresh the banks BK0–BK3, the information held in the holding circuits 34 and 36 can be kept associated with the refresh addresses REFAD1 and REFAD2 for reliable refresh of the memory cells of the banks BK0–BK3.

The first priority circuit 38 and the second priority circuit 40 having lower priority than this first priority circuit 38 are provided so as to correspond to the first holding circuit 34 and the second holding circuit 36, respectively. Then, the priority of refresh is established over the eight refresh regions on the four banks BK0–BK3, selected by the two refresh addresses REFAD1 and REFAD2. Therefore, even when a plurality of refresh addresses are generated in the presence of the four banks BK0–BK3, the refreshes can be performed without conflict.

Figure 16:
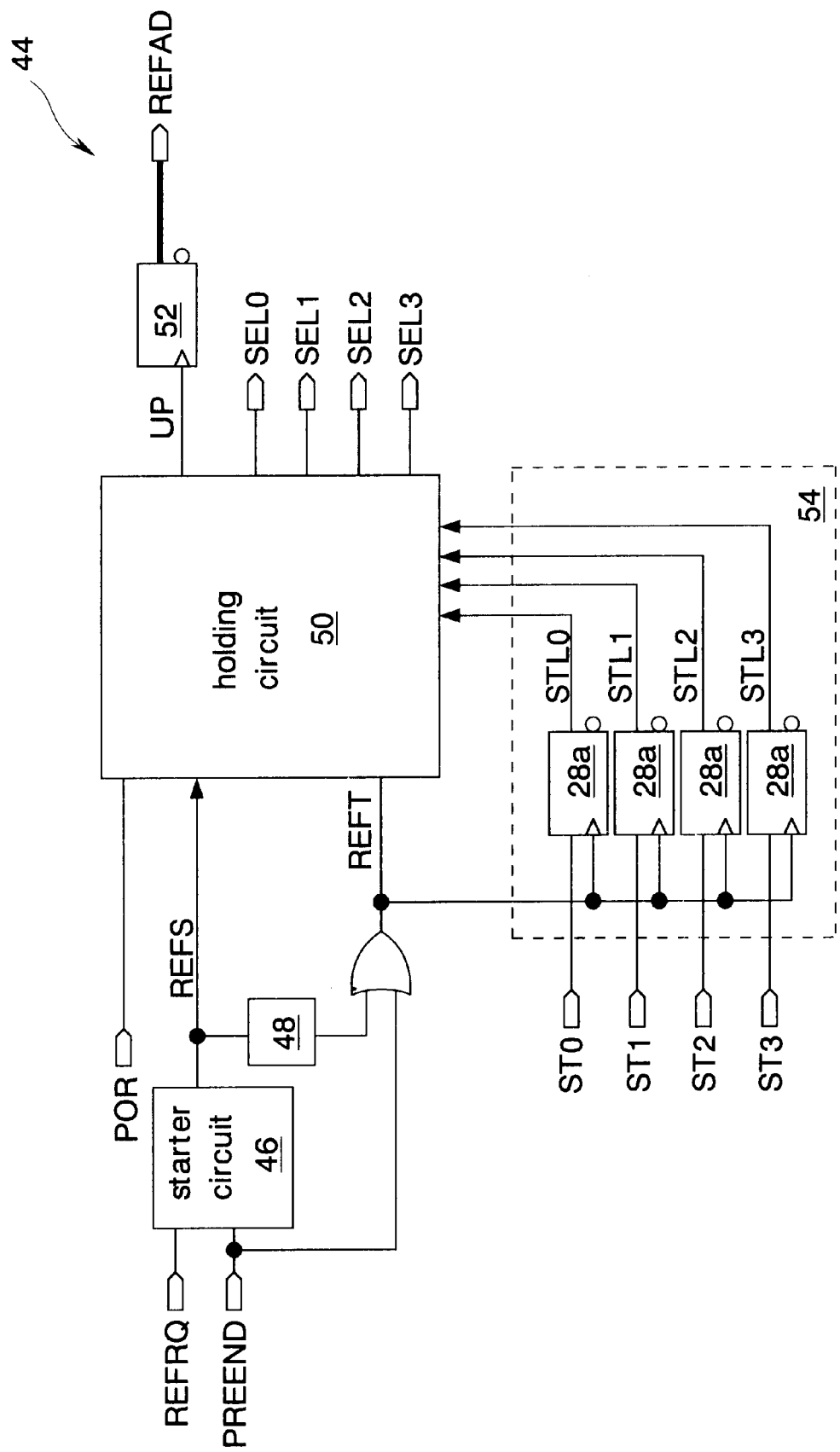
FIG. 16 is a block diagram showing a refresh control circuit in a third embodiment of the present invention.

FIG. 16 shows a third embodiment of the semiconductor memory in the present invention. The same signals as those described in the first embodiment will be designated by identical reference numbers or symbols.

This embodiment includes a refresh control circuit 44 which differs from the refresh control circuit 18 of the first embodiment. The other configuration is identical to that of the first embodiment. The semiconductor memory of the present embodiment is formed as a 64-Mbit SDRAM with four banks BK0–BK3, having a maximum clock frequency of 10 MHz. The interval at which the refresh request signal REFRQ occurs is set at 510 ns.

The refresh control circuit 44 includes a starter circuit 46 for refresh, a delay circuit 48, a holding circuit 50, a refresh counter 52, and a status latching circuit 54.

The starter circuit 46 receives a refresh request signal REFRQ and a precharge end signal PREEND, and outputs a refresh start signal REFS. The precharge end signal RREEND is a pulse signal of high level to be activated after the completion of a charge operation.

The holding circuit 50 receives a power-on resetting signal POR, the refresh start signal REFS, a refresh timing signal REFT, and status latched signals STL0–STL3, and outputs a count up signal UP and select signals SEL0–SEL3. The refresh timing signal REFT is the refresh start signal REFS delayed by the delay circuit 48, ORed with the precharge end signal PREEND.

The refresh counter 52 increments a refresh address REFAD by one in synchronization with the rising edge of the count up signal UP.

The status latching circuit 54 has the latches 28a of the status latching circuit 28 in the first embodiment. The status latching circuit 54 accepts status signals ST0–ST3 in synchronization with the rising edge of the refresh timing signal REFT, and outputs the accepted signals as the status latched signals STL0–STL3.

Figure 17:
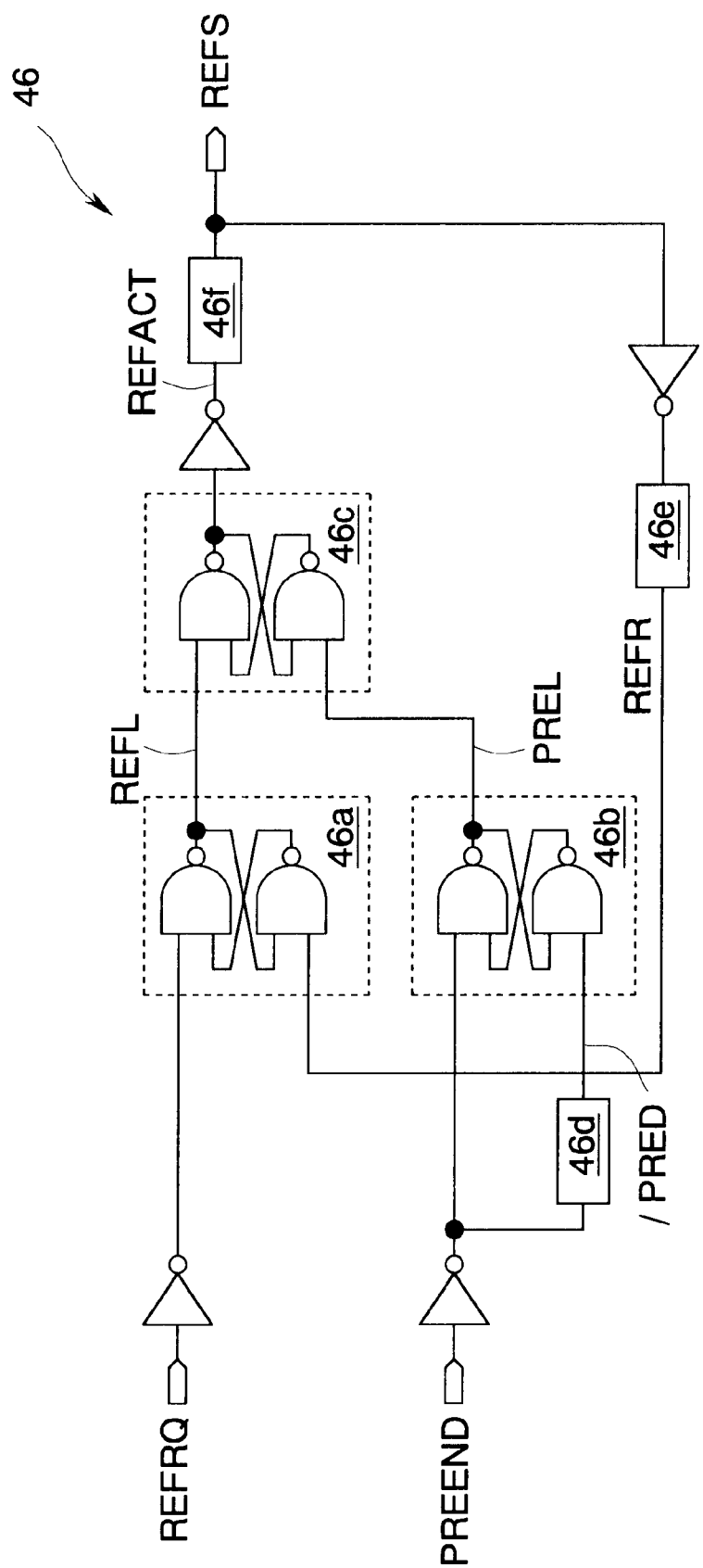
FIG. 17 is a circuit diagram showing the details of the starter circuit in FIG. 16.

FIG. 17 shows the details of the starter circuit 46.

The starter circuit 46 includes flip-flops 46a, 46b, and 46c, delay circuits 46d and 46e, a pulse generating circuit 46f, and a plurality of inverters. The flip-flop 46a is set in response to the activation (high level) of the refresh request signal REFRQ, turning a refresh latched signal REFL to high level. The flip-flop 46a is reset in response to the activation (low level) of a refresh resetting signal REFR, turning the refresh latched signal REFL to low level. The flip-flop 46a functions as a buffer for holding the refresh request signal REFRQ.

The flip-flop 46b is set in response to the activation (high level) of the precharge end signal PREEND, turning a precharge latched signal PREL to high level. The flip-flop 46b is reset in response to the activation (low level) of a delayed precharging signal /PRED, turning the precharge latched signal PREL to low level. The delayed precharging signal /PRED is the inverted signal of the precharge end signal PREEND, delayed through the delay circuit 46d. The delay time of the delay circuit 46d is set at the time necessary to judge a refresh operation.

The flip-flop 46c disables the reception of the refresh latched signal REFL when the precharge latched signal PREL is activated. The flip-flop 46c transmits the refresh latched signal REFL as a refresh active signal REFACT when the precharge latched signal PREL is inactivated.

The pulse generator 46f generates the refresh start signal REFS of high level in synchronization with the rising edge of the refresh active signal REFACT. The delay circuit 46e delays the inverted signal of the refresh start signal REFS by a predetermined time to generate the refresh resetting signal REFR. The delay circuit 46e secures the refresh latched signal REL to a predetermined value of pulse width.

Figure 18:
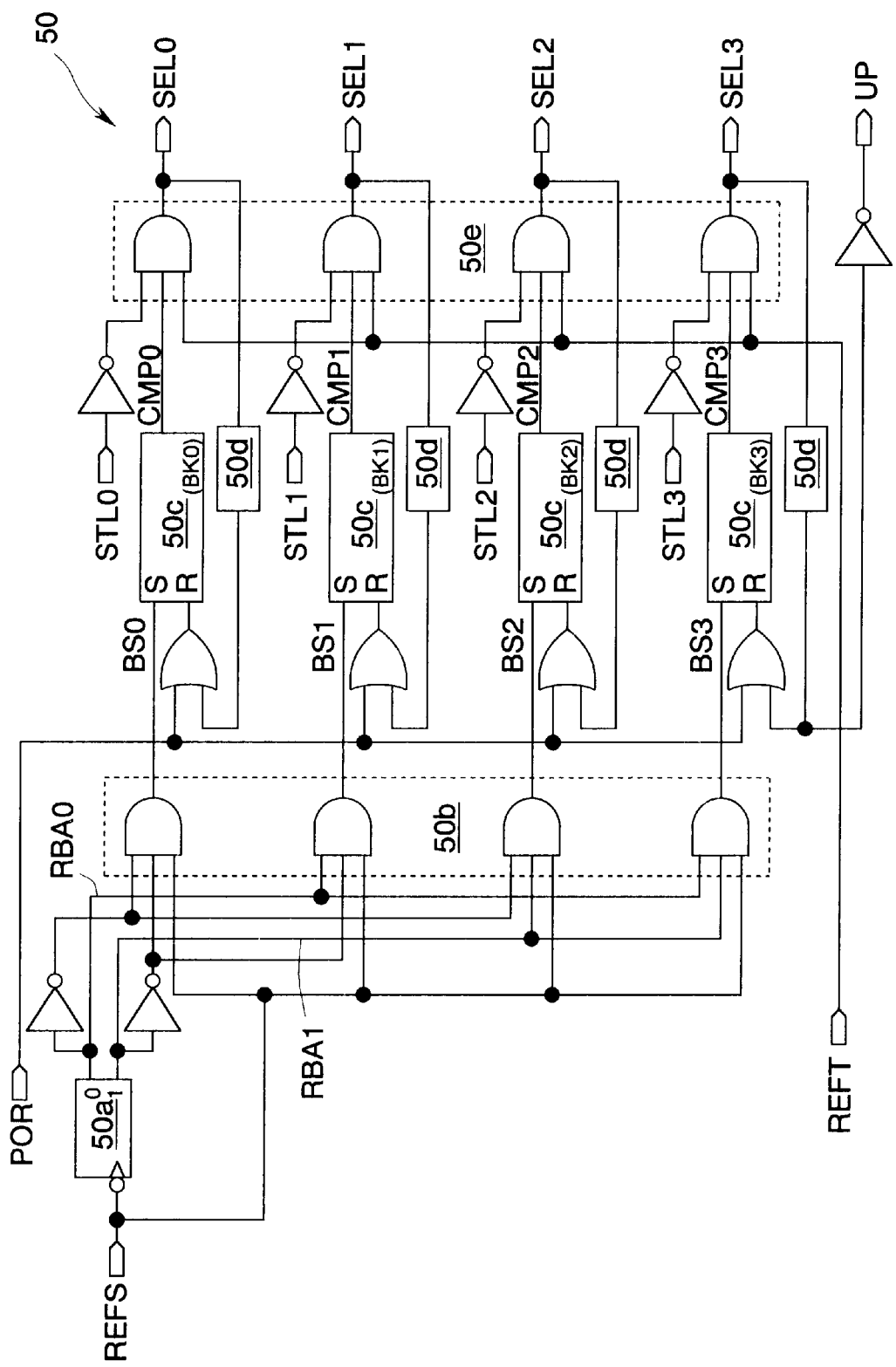
FIG. 18 is a circuit diagram showing the details of the holding circuit in FIG. 16.

FIG. 18 shows the details of the holding circuit 50.

The holding circuit 50 includes a two-bit counter 50a, a decoder 50b for decoding the output of the counter 50a, four RS flip-flops 50c, four delay circuits 50d, and an output circuit 50e.

The counter 50a counts up in synchronization with the falling edge of the refresh start signal REFS, outputting a count signal RBA0 corresponding to the low order bit and a count signal RBA1 corresponding to the high order bit.

The decoder 50b includes four three-input AND gates. The AND gates activate any one of a select signal BS0 corresponding to a counter value "0," a select signal BS1 corresponding to a counter value "1," a select signal BS2 corresponding to a counter value "2," and a select signal BS3 corresponding to a counter value "3" in accordance with the count signals RBA0 and RBA1 when the refresh start signal REFS is at high level.

The RS flip-flops 50c receive the select signals BS0–BS3 at their respective set terminals S. They also receive the OR logics of delayed signals obtained by delaying the select signals SEL0–SEL3 and the power-on resetting signal POR at their respective reset terminals R. That is, the RS flip-flops 50c activate completion signals CMP0–CMP3 when receiving the activation of the select signals BS0–BS3, respectively, and inactivate the completion signals CMP0–CMP3 when receiving the activation of the delayed signals of the select signals SEL0–SEL3 or the power-on resetting signal POR, respectively. Here, the numerals at the ends of the select signals BS0–BS3, SEL0–SEL3, and the completion signals CMP0–CMP3 correspond to the numbers of the banks.

The delay circuits 50d delay the select signals SEL0–SEL3 for a predetermined time each, and output the same as the delayed signals. The delayed signal obtained by delaying the select signal SEL3 is output as the count up signal UP via an inverter.

The output circuit 50e is activated while the status latched signals STL0–STL3 are at low level and the refresh timing signal REFT is at high level, to output the completion signals CMP0–CMP3 as the select signals SEL0–SEL3, respectively. That is, the output circuit 50e receives the activation of the completion signals CMP0–CMP3, and activates the select signals SEL0–SEL3 when the corresponding banks BK0–BK3 are not in operation.

Figure 19:
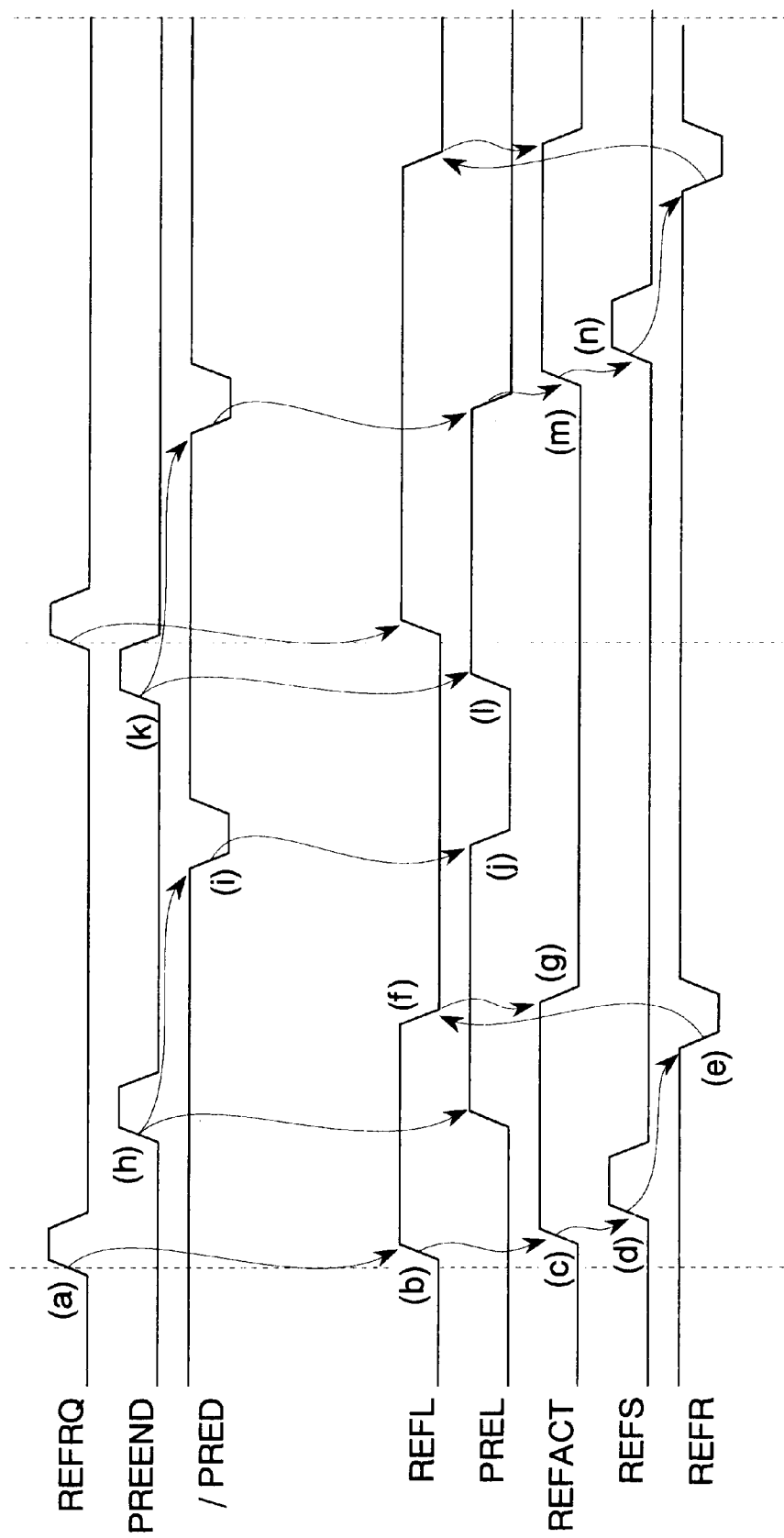
FIG. 19 is a timing chart showing the operation of the starter circuit in the third embodiment.

FIG. 19 shows the operations of the starter circuit 46.

Initially, when the refresh request signal REFRQ is activated earlier than the precharge end signal PREEND (FIG. 19(a)), the flip-flop 46a shown in FIG. 17 activates the refresh latched signal REFL (FIG. 19(b)).

The flip-flop 46c is set in response to the high level of the refresh latched signal REFL, changing the refresh active signal REFACT to high level (FIG. 19(c)). The pulse generator 46f activates the refresh start signal REFS in synchronization with the rising edge of the refresh active signal REFACT (FIG. 19(d)). The delay circuit 46e delays the inverted signal of the refresh start signal REFS by a predetermined time, and outputs the same as the refresh reset signal REFR (FIG. 19(e)). The flip-flop 46a is reset in response to the falling edge of the refresh resetting signal REFR, changing the refresh latched signal REFL to low level (FIG. 19(f)). The flip-flop 46c is set in response to the low level of the refresh latched signal REFL, changing the refresh active signal REFACT to low level (FIG. 19(g)).

The flip-flop 46b activates the precharge latched signal PREL in response to the activation of the precharge end signal PREEND (FIG. 19(h)). The flip-flop 46c, however, may not operate during the activation period of the refresh latched signal REFL, depending on the precharge latched signal PREL. The delay circuit 46d delays the inverted signal of the precharge end signal PREEND by a predetermined time, and outputs the same as the delayed precharging signal /PRED (FIG. 19(i)). The flip-flop 46b is reset in response to the falling edge of the delayed precharging signal PRED, changing the precharge latched signal PREL to low level (FIG. 19(j)).

In this way, when the refresh request signal REFRQ occurs a predetermined time or more after the completion of the precharge operation, the refresh start signal REFS is activated in synchronization with the refresh request signal REFRQ.

On the other hand, when the precharge end signal PREEND is activated earlier than the refresh request signal REFRQ (FIG. 19(k)), the precharge latched signal PREL is activated before the refresh latched signal REFL (FIG. 19(l)). Then, the flip-flop 46c disables the reception of the refresh latched signal REFL while the precharge latched signal PREL is at high level. Subsequently, in response to the inactivation of the precharge latched signal PREL, the refresh active signal REFACT is activated (FIG. 19(m)) and the refresh start signal REFS is activated (FIG. 19(n)). That is, if the refresh request signal REFRQ occurs before a predetermined time elapses since the completion of a precharge operation, the activation of the refresh start signal REFS is delayed for a predetermined period. In this way, the reception of the refresh request signal REFRQ is masked for a refresh-operation judging period after the completion of a precharge operation. This avoids, for example, refresh of memory cells under an incorrect address.

Figure 20:
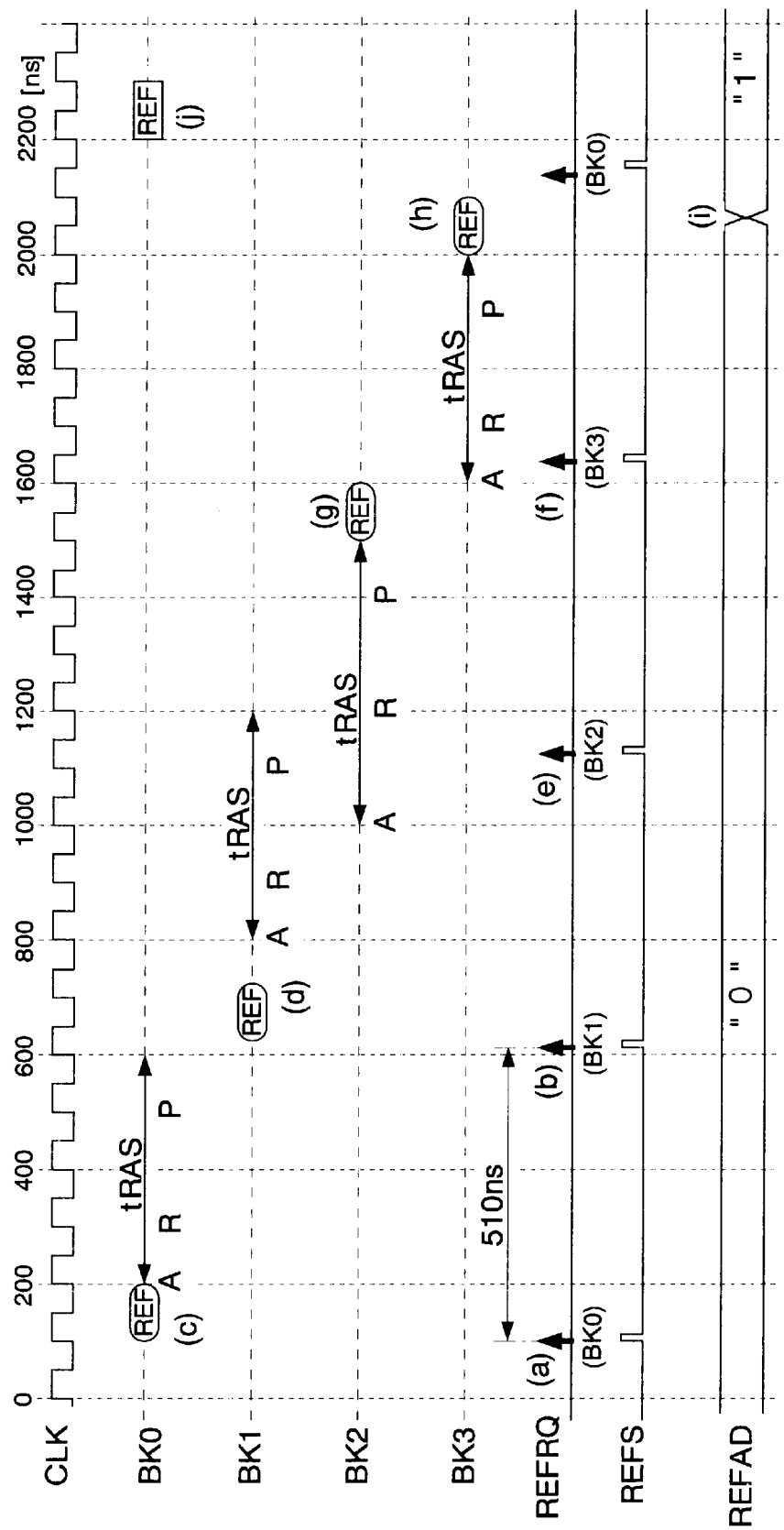
FIG. 20 is a timing chart showing an overview of the refresh operations in the third embodiment.

FIG. 20 shows an overview of the refresh operations in the SDRAM described above. In the chart, "REF" surrounded by an ellipse and "REF" surrounded by a box represent refresh operations with refresh addresses REFAD of "0" and "1," respectively. "A," "R," and "P" in the chart represent the supply of an active command, a read command, and a precharging command, respectively.

In this example, the SDRAM receives an active command, a read command, and a precharging command to perform a burst read operation on each of the banks BK0–BK3 in succession. The burst length is set at "2," which means that a single read command R is supplied to output two pieces of data consecutively. The maximum time (timing specification) of tRAS is set at 500 ns, and the interval at which the refresh request signal REFRQ occurs is set at 510 ns. In accordance with the count signals RBA0 and RBA1 which vary in synchronization with the refresh request signal REFRQ, the holding circuit 50 shown in FIG. 18 successively sets the RS flip-flops 50c corresponding to the banks BK0–BK3, respectively. That is, in this embodiment, the counter value of the counter 50a determines a bank to be refreshed among the banks BK0–BK3 in response to an occurring refresh request signal REFRQ.

In the timing chart, refresh request signals REFRQ corresponding to the banks BK0 and BK1 occur in succession (FIG. 20(a), (b)). Since neither of the banks BK0 and BK1 is in operation, the holding circuit 50 activates the not-shown select signals SEL0 and SEL1 successively in response to the refresh start signals REFS. Then, the refresh operations of the banks BK0 and BK1 are performed (FIG. 20(c), (d)).

Next, refresh request signals REFRQ corresponding to the banks BK2 and BK3 occur in succession (FIG. 20(e), (f)). Since both the banks BK2 and BK3 are in operation, the holding circuit 50 holds the refresh start signals REFS received, so as to activate the not-shown select signals SEL2 and SEL3 in succession after the banks BK2 and BK3 enter a nonoperation state. Then, the refresh operations of the banks BK2 and BK3 are performed (FIG. 20(g), (h)). The activation of the select signal SEL3 activates the not-shown count up signal UP, changing the refresh address REFAD from "0" to "1" (FIG. 20(i)). In synchronization with the next refresh request signal REFRQ, the refresh operation of the bank BK0 is performed again (FIG. 20(j)). In this way, the SDRAM controls its internal circuits independent of the commands supplied from exterior, to perform refresh operations. That is, the refresh operations are performed without being recognized from exterior.

Figure 21:
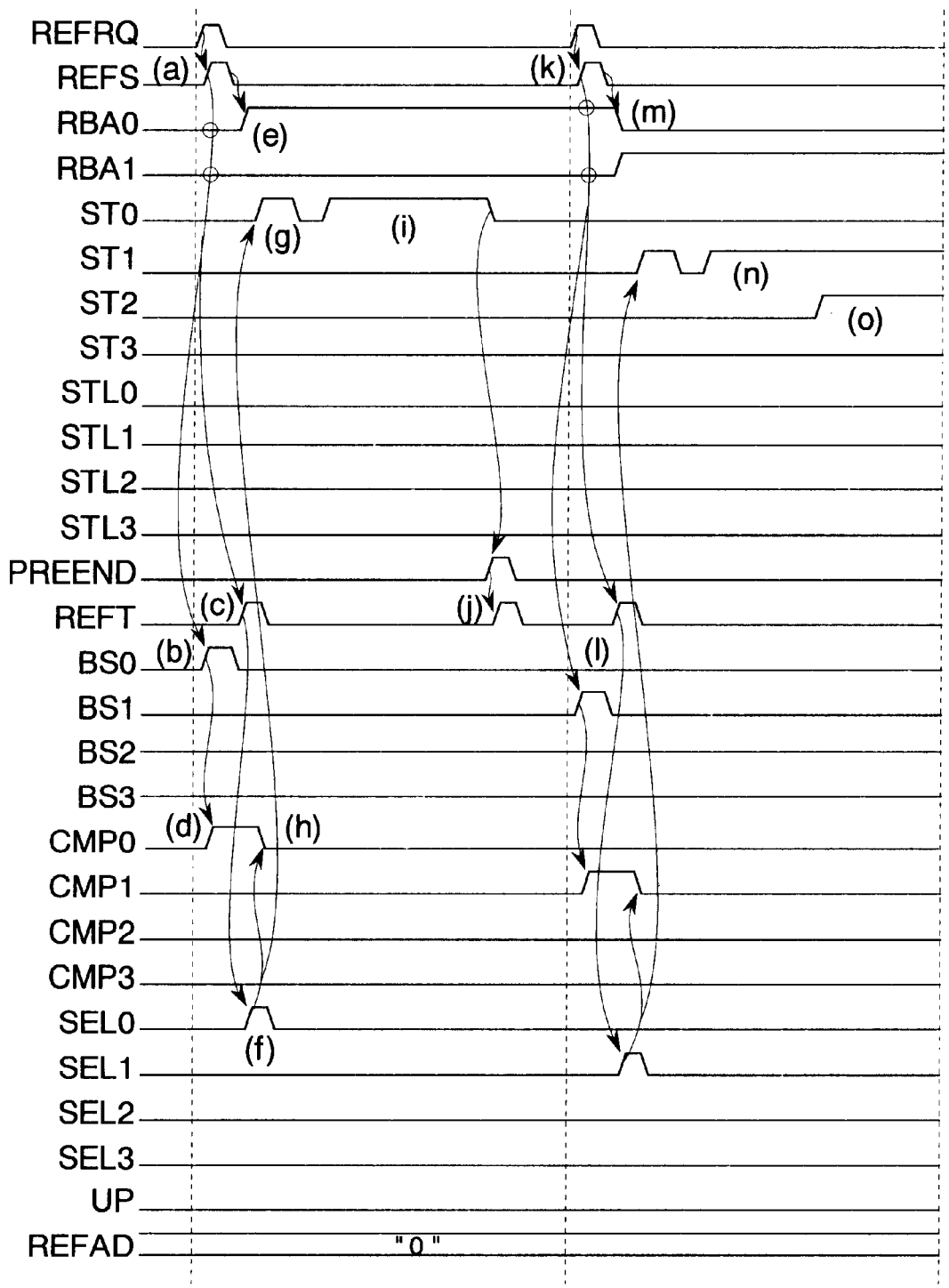
FIG. 21 is a timing chart showing the operation of the refresh control circuit in the third embodiment.

FIG. 21 shows the operations of the refresh control circuit 44 during the period of 100 to 1120 ns in the timing shown in FIG. 20.

Initially, the refresh request signal REFRQ corresponding to the bank BK0 occurs to activate the refresh start signal REFS (FIG. 21 (a)). The decoder 50b shown in FIG. 18 activates the select signal BS0 in synchronization with the activation of the refresh start signal REFS (FIG. 21(b)). The delay circuit 48 shown in FIG. 16 activates the refresh timing signal REFT based on the activation of the refresh start signal REFS (FIG. 21(c)). The RS flip-flop 50c corresponding to the select signal BS0 activates the completion signal CMP0 (FIG. 21(d)). In synchronization with the falling edge of the refresh start signal REFS, the counter 50a shown in FIG. 18 turns RBA0 to high level, changing the counter value to "1" (FIG. 21(e)). The output circuit 50e receives the completion signal CMP0 of high level, and activates the select signal SEL0 in synchronization with the activation of the refresh timing signal REFT (FIG. 21(f)). In response to the activation of the select signal SEL0, the refresh operation of the bank BK0 is performed. During the refresh operation, the status signal ST0 changes to high level (FIG. 21(g)). A predetermined time after the activation of the select signal SEL0, the RS flip-flop 50c is reset to inactivate the CMP0 (FIG. 21(h)). Subsequently, the normal operation of the bank BK0 is performed, so that the status signal ST0 turns to high level again (FIG. 21(i)). When the precharge operation following the normal operation is completed, the precharge end signal PREEND is activated to activate the refresh timing signal REFT (FIG. 21(j)).

Next, the refresh request signal REFRQ corresponding to the bank BK1 occurs to activate the refresh start signal REFS (FIG. 21(k)). The select signal BS1 corresponding to a counter value "1" and the refresh timing signal REFT are activated in synchronization with the activation of the refresh start signal REFS (FIG. 21(l)). The counter 50a changes the counter value to "2" in synchronization with the falling edge of the refresh start signal REFS (FIG. 21(m)). Subsequently, the bank BK1 is refreshed in the same fashion as described above. The bank BK1 starts its normal operation after the refresh operation (FIG. 21(n)). The bank BK2 starts its normal operation while the bank BK1 is in operation (FIG. 21 (o)).

Figure 22:
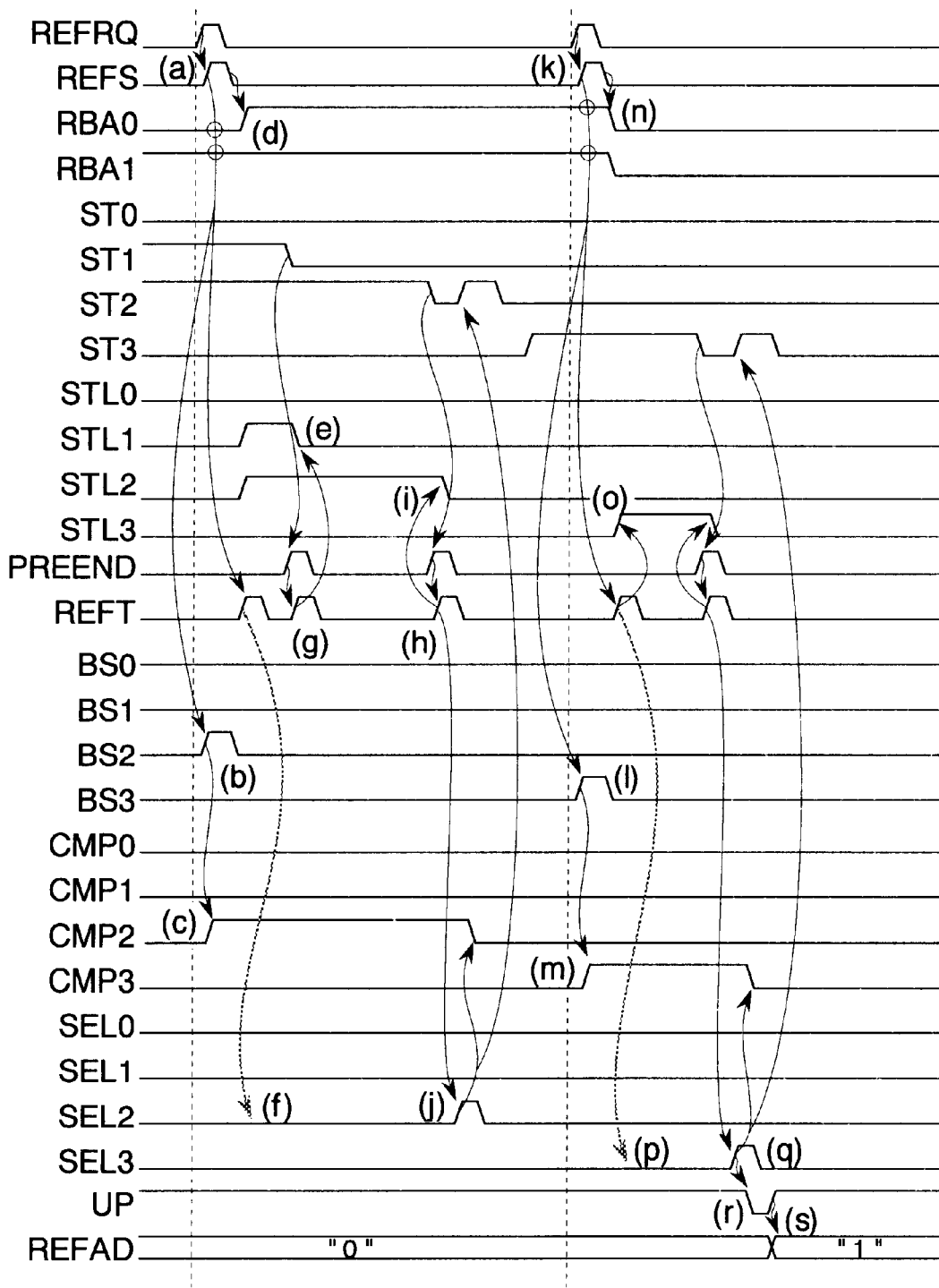
FIG. 22 is a timing chart showing the operation of the refresh control circuit in the third embodiment.

FIG. 22 shows the operations of the refresh control circuit 44 during the period of 1120 to 2140 ns in the timing shown in FIG. 20.

Initially, the refresh request signal REFRQ corresponding to the bank BK2 occurs to activate the refresh start signal REFS (FIG. 22(a)). The select signal BS2 corresponding to a counter value "2" and the refresh timing signal REFT are activated in synchronization with the activation of the refresh start signal REFS (FIG. 22(b)). In response to the activation of the select signal BS2, the completion signal CMP2 is activated (FIG. 22(c)). The counter 50a changes the counter value to "3" in synchronization with the falling edge of the refresh start signal REFS (FIG. 22(d)). The status latching circuit 54 shown in FIG. 16 accepts the status signals ST0–ST3 in synchronization with the rising edge of the refresh timing signal REFT, and changes the status latched signals STL1 and STL2 to high level (FIG. 22(e)). In the output circuit 50e, the AND gate that receives the completion signal CMP2 is inactivated under the status latched signal STL2 of high level. This precludes the activation of the select signal SEL2 (FIG. 22(f)).

The bank BK1 completes its normal operation, so that the precharge end signal PREEND is activated to activate the refresh timing signal REFT (FIG. 22(g)). Here, the select signal SEL2 is not activated since the status latched signal STL2 keeps its high level. Then, the bank BK2 completes its normal operation, so that the precharge end signal PREEND is activated to activate the refresh timing signal REFT (FIG. 22(h)). The status latching circuit 54 changes the status latched signal STL2 to low level in synchronization with the refresh timing signal REFT (FIG. 22(i)). The output circuit 50e activates the select signal SEL2 based on the fact that the bank BK2 enters a nonoperation state (the low level of the status latched signal STL2) (FIG. 22(j)). Then, the refresh operation of the bank BK2 is performed. In this way, when a bank designated by the counter value is in operation, the operation is completed before the performance of the refresh operation. Since tRAS (500 ns) is shorter than the refresh request interval (510 ns), the banks are sure to enter an idle state within the refresh request interval for refresh.

Next, the refresh request signal REFRQ corresponding to the bank BK3 occurs to activate the refresh start signal REFS (FIG. 22(k)). The select signal BS3 corresponding to a counter value "3" and the refresh timing signal REFT are activated in synchronization with the activation of the refresh start signal REFS (FIG. 22(l)). In response to the activation of the select signal BS3, the completion signal CMP3 is activated (FIG. 22(m)). The counter 50a restores the counter value to "0" in synchronization with the falling edge of the refresh start signal REFS (FIG. 22(n)). Since the bank BK3 is in operation, the status latched signal STL3 turns to high level in synchronization with the rising edge of the refresh timing signal REFT (FIG. 22(o)). This precludes the activation of the select signal SEL3 (FIG. 22(p)).

Thereafter, the completion of the normal operation of the bank BK3 activates the select signal SEL3 (FIG. 22(q)), so that the refresh operation of the bank BK3 is performed. The delay circuit 50d activates the count up signal UP (negative logic) with a predetermined time of delay after the activation of the select signal SEL3 (FIG. 22(r)). The refresh counter 52 shown in FIG. 16 counts up in synchronization with the rising edge of the count up signal UP, changing the refresh address REFAD from "0" to "1" (FIG. 22(s)).

This embodiment can offer the same effects as those obtained from the first embodiment described above. Moreover, in this embodiment, the reception of the refresh request signal REFRQ is masked for a refresh-operation judging period after the completion of a precharge operation. This can prevent the memory cells from being refreshed under incorrect addresses.

A bank to be refreshed in response to a refresh request signal REFRQ is designated by the two-bit counter 50a. As a result, the refresh operations of the banks BK0–BK3 can be distributed for a reduction in peak current.

Figure 23:
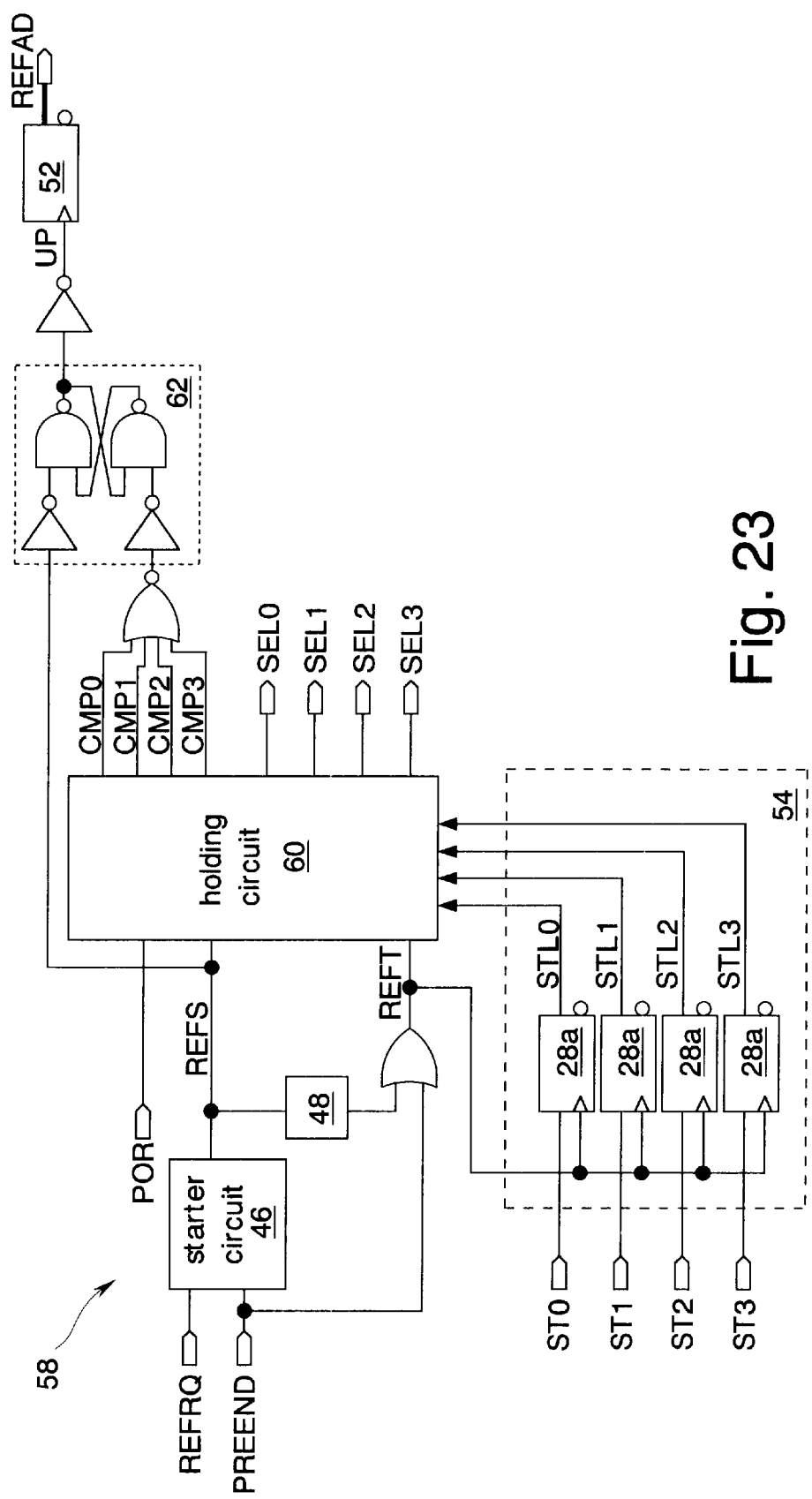
FIG. 23 is a block diagram showing a refresh control circuit in a fourth embodiment of the present invention.

FIG. 23 shows a fourth embodiment of the semiconductor memory in the present invention. The same circuits and signals as those described in the third embodiment will be designated by identical reference numbers or symbols.

This embodiment includes a refresh control circuit 58 which differs from the refresh control circuit 18 of the first embodiment. The other configuration is identical to that of the first embodiment. The semiconductor memory of the present embodiment is formed as a 64-Mbit SDRAM with four banks BK0–BK3, having a maximum clock frequency of 10 MHz. The interval at which the refresh request signal REFRQ occurs is set at 2040 ns. Besides, the SDRAM has a precharge all command for precharging all the banks BK0–BK3 at the same time.

The refresh control circuit 58 includes the starter circuit 46, the delay circuit 48, the refresh counter 52, and the status latching circuit 54 which are identical to those of the third embodiment, along with a holding circuit 60 and a flip-flop 62.

The holding circuit 60 receives a power-on resetting signal POR, a refresh start signal REFS, a refresh timing signal REFT, and status latched signals STL0–STL3, and outputs completion signals CMP0–CMP3 and select signals SEL0–SEL3. The flip-flop 62 turns a count up signal UP to low level based on the activation of the refresh start signal REFS, and turns the count up signal UP to high level based on the inactivation of all the completion signals CMP0–CMP3.

Figure 24:
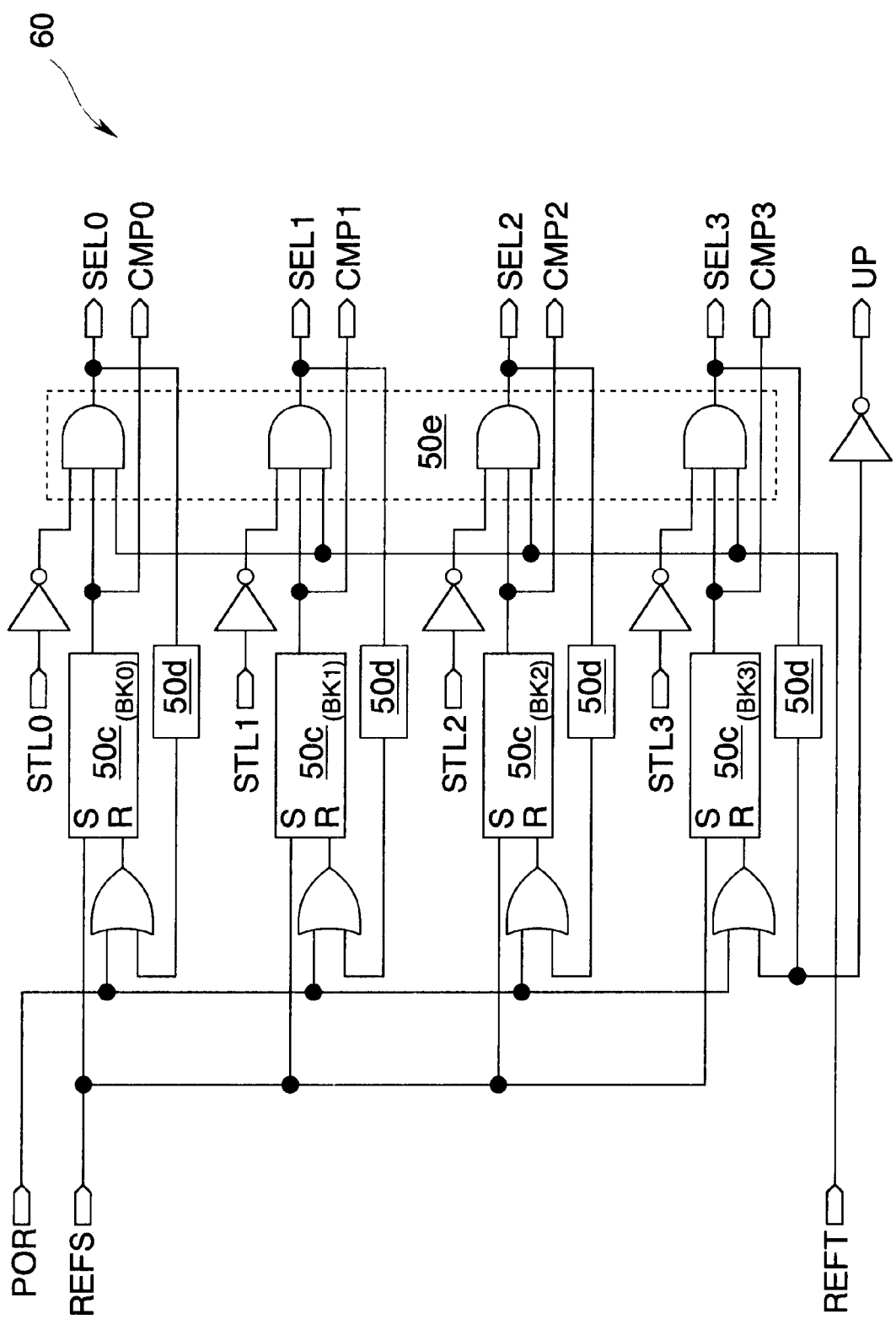
FIG. 24 is a circuit diagram showing the details of the holding circuit in FIG. 23.

FIG. 24 shows the details of the holding circuit 60.

The holding circuit 60 is constituted by excluding the counter 50a and the decoder 50b from the holding circuit 50 (FIG. 18) of the third embodiment. The RS flip-flops 50c in the holding circuit 60 receive the refresh start signal REFS directly at their set terminals S. That is, in this embodiment, when a refresh request occurs and the refresh start signal REFS is activated, all the RS flip-flops 50c are set to activate the completion signals CMP0–CMP3. Since refresh requests need not be generated bank by bank, the interval of refresh requests is set at 2040 ns, or four times as much as in the third embodiment.

Figure 25:
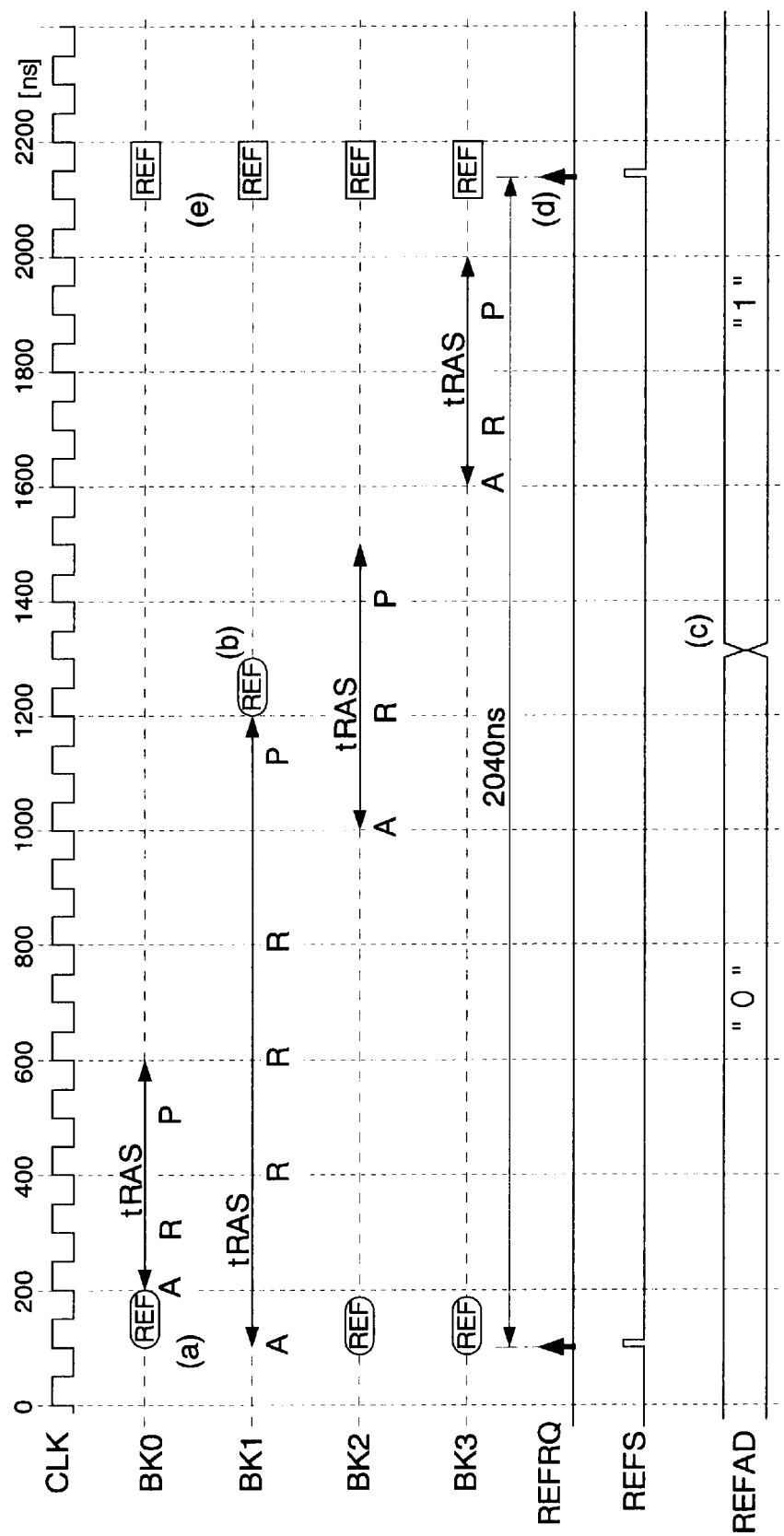
FIG. 25 is a timing chart showing an overview of the refresh operations in the fourth embodiment.

FIG. 25 shows an overview of the refresh operations in the SDRAM described above. In this example, an active command A corresponding to the bank BK1 is supplied at time 100 ns, and the bank BK1 performs its normal operation until time 1200 ns. The banks BK0, BK2, and BK3 perform their normal operations in the same timing as in the third embodiment (FIG. 20). The burst length is set at "2." The maximum time (timing specification) of tRAS is set at 2000 ns.

The holding circuit 60 shown in FIG. 23 activates the not-shown completion signals CMP0–CMP3 in synchronization with the refresh request signal REFRQ. Then, the select signals SEL0, SEL2, and SEL3 for the not-operating banks BK0, BK2, and BK3 are activated so that the refresh operations of these banks are performed simultaneously (FIG. 25(a)). Next, the precharge operation of the bank BK1 is completed, and then the refresh operation of the bank BK1 is performed (FIG. 25(b)). After all the banks BK0–BK3 are completed of refresh, the refresh address REFAD is changed from "0" to "1" (FIG. 25(c)).

The next refresh request occurs 2040 ns after the first refresh request (FIG. 25(d)). Here, the banks BK0–BK3 are refreshed simultaneously since none of them is in operation (FIG. 25(e)). Even in this example, refresh operations are performed without being recognized from exterior.

Figure 26:
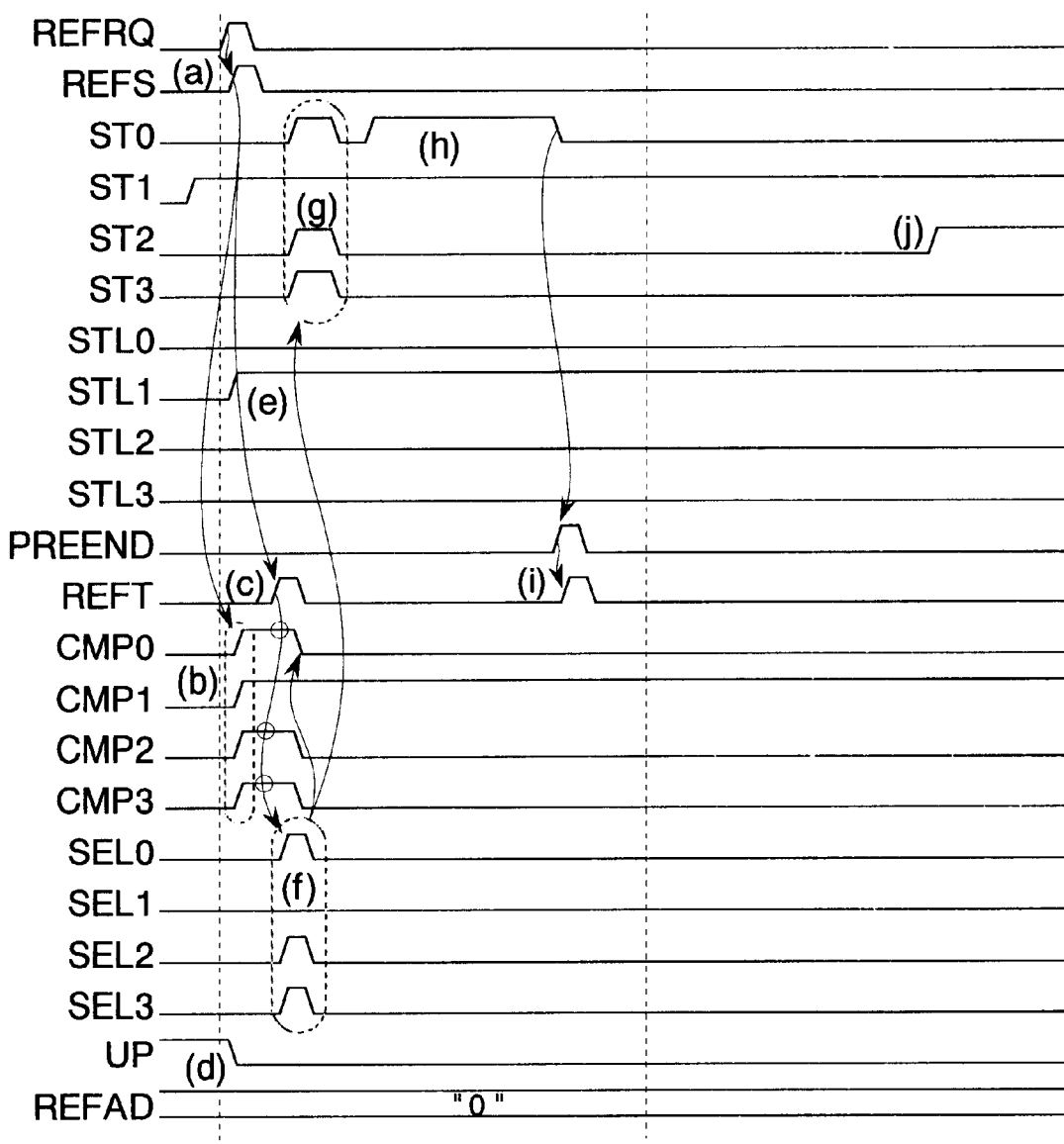
FIG. 26 is a timing chart showing the operation of the refresh control circuit in the fourth embodiment.

FIG. 26 shows the operations of the refresh control circuit 58 during the period of 100 to 1120 ns in the timing shown in FIG. 25.

In this embodiment, when the refresh request signal REFRQ occurs to activate the refresh start signal REFS (FIG. 26(a)), the completion signals CMP0–CMP3 corresponding to all the banks BK0–BK3 are activated (FIG. 26(b)). The activation of the refresh start signal REFS activates the refresh timing signal REFT (FIG. 26(c)), changing the count up signal UP to low level (FIG. 26(d)). Corresponding to the bank BK1 that is in operation at the time of activation of the refresh timing signal REFT, the status latched signal STL1 turns to high level (FIG. 26(e)).

The output circuit 50e shown in FIG. 24 receives the completion signals CMP0–CMP3 of high level, and activates the select signals SEL0, SEL2, and SEL3 corresponding to the status latched signals STL0, STL2, and STL3 of low level in synchronization with the activation of the refresh timing signal REFT (FIG. 26(f)). Then, the not-operating banks BK0, BK2, and BK3 are refreshed simultaneously (FIG. 26(g)). After this, the bank BK0 performs its normal operation so that the status signal ST0 turns to high level during this period (FIG. 26(h)). When the precharge operation following the normal operation is completed, the precharge end signal PREEND is activated to activate the refresh timing signal REFT (FIG. 26(i)). Next, the bank BK2 performs its normal operation so that the status signal ST2 turns to high level (FIG. 26(j)). At this point, it is the bank BK1 alone that is yet to be refreshed under the refresh address REFAD (="0").

Figure 27:
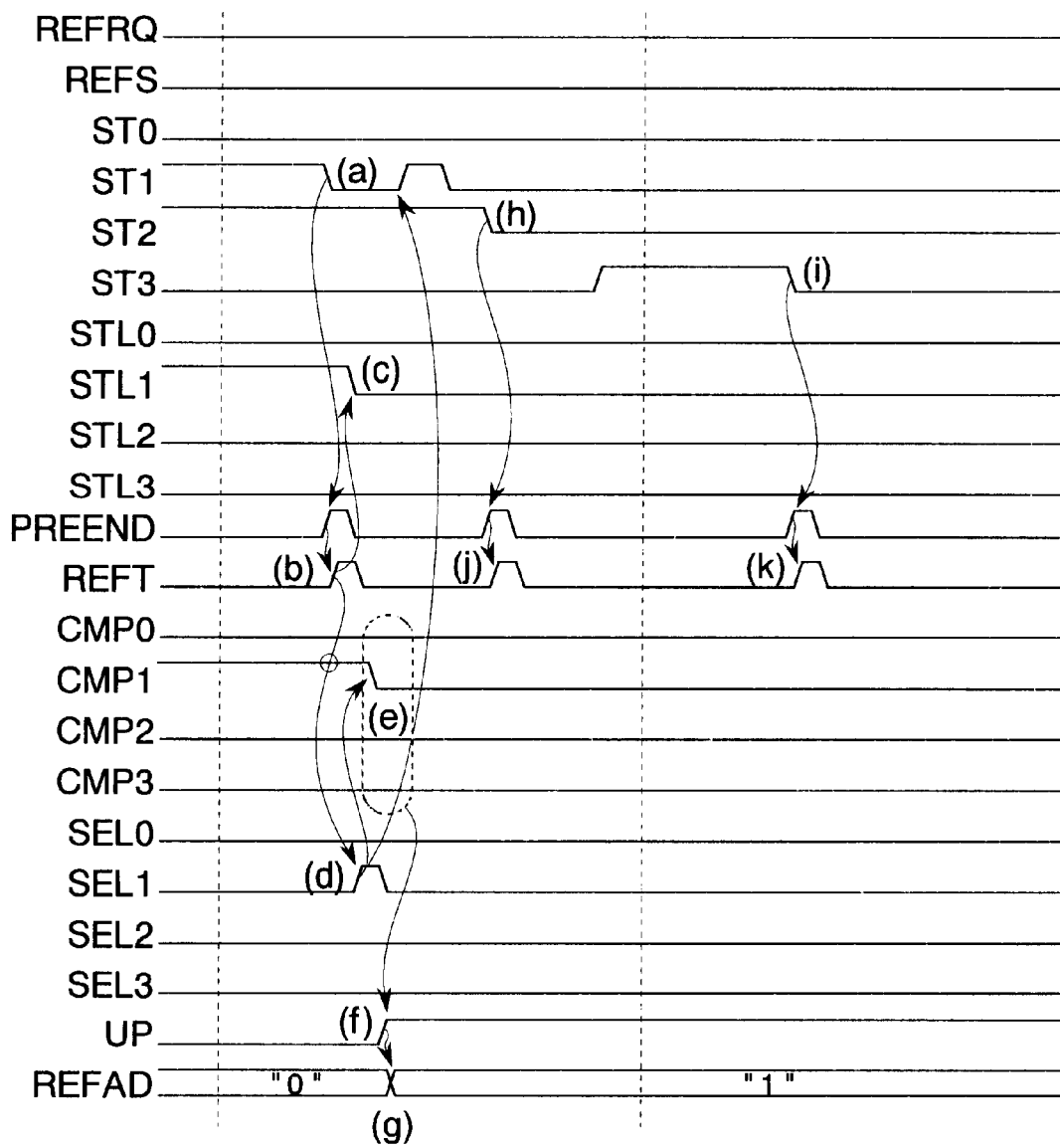
FIG. 27 is a timing chart showing the operation of the refresh control circuit in the fourth embodiment.

FIG. 27 shows the operations of the refresh control circuit 58 during the period of 1120 to 2140 ns in the timing shown in FIG. 25.

When the bank BK1 completes its normal operation and precharge operation, the status signal ST1 turns to low level (FIG. 27(a)) to activate the precharge end signal PREEND and the refresh timing signal REFT (FIG. 27(b)). Based on the activation of the refresh timing signal REFT, the status latched signal STL1 turns to low level (FIG. 27(c)), activating the select signal SEL1 (FIG. 27(d)). Then, the refresh operation of the bank BK1 is performed.

A predetermined time after the activation of the select signal SEL1, the RS flip-flop 50c corresponding to the bank BK1 is reset to inactivate the completion signal CMP1 (FIG. 27(e)). Since all the completion signals CMP0–CMP3 are turned to low level, the flip-flop 62 shown in FIG. 23 changes the count up signal UP to high level (FIG. 27(f)). Then, the refresh address REFAD changes from "0" to "1" (FIG. 27(g)).

Subsequently, the banks BK2 and BK3 complete their normal operations in succession (FIGS. 27(h), (i)), activating the precharge end signal PREEND and the refresh timing signal REFT (FIGS. 27(j), (k)).

This embodiment can offer the same effects as those obtained from the first embodiment described above. Moreover, in this embodiment, refresh requests need not be generated bank by bank; therefore, the interval of refresh requests can be set at 2040 ns, or four times as much as in the third embodiment.

Figure 28:
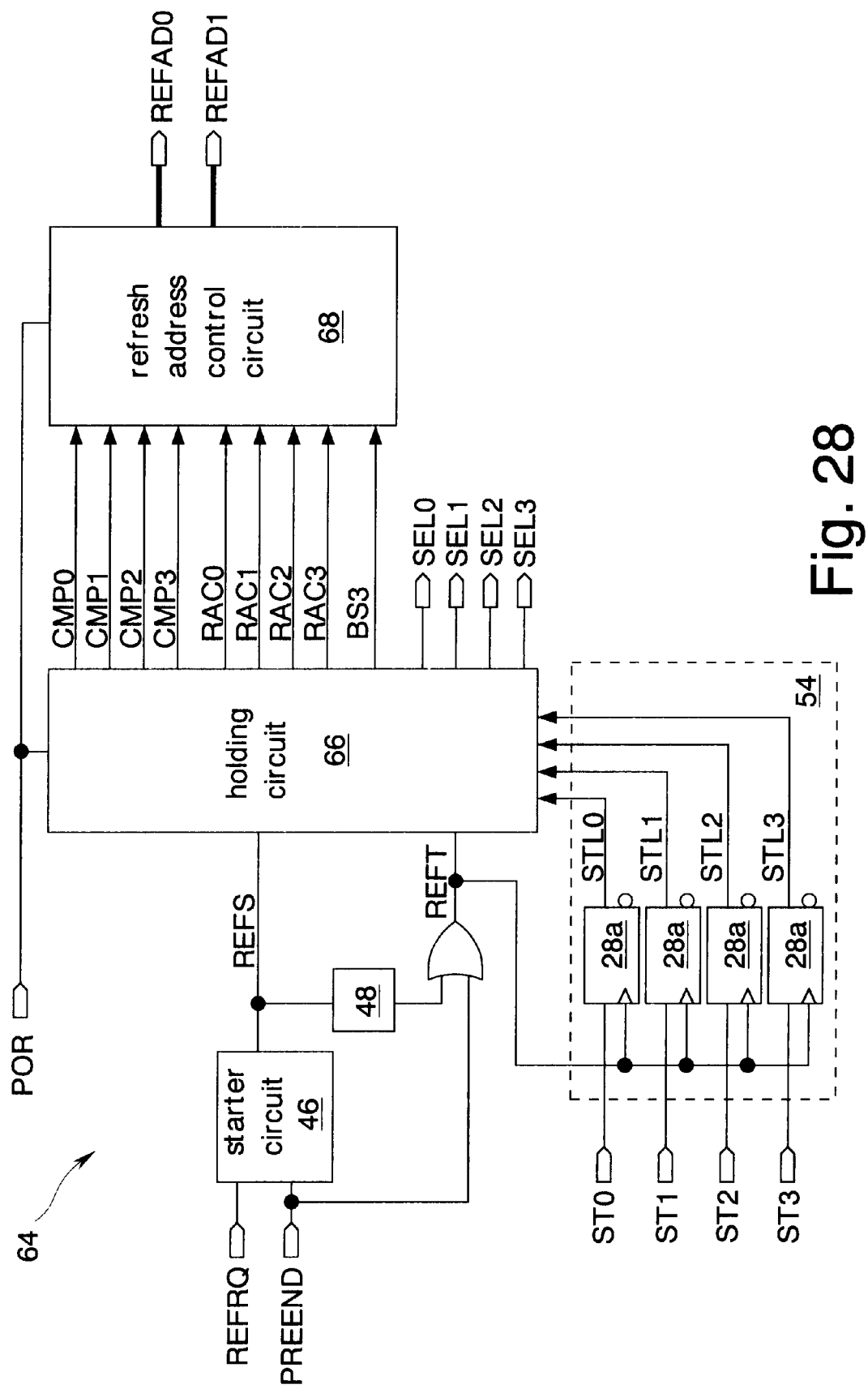
FIG. 28 is a block diagram showing a refresh control circuit in a fifth embodiment.

FIG. 28 shows a fifth embodiment of the semiconductor memory in the present invention. The same circuits and signals as those described in the third embodiment will be designated by identical reference numbers or symbols.

This embodiment includes a refresh control circuit 64 which differs from the refresh control circuit 18 of the first embodiment. The other configuration is identical to that of the first embodiment. The semiconductor memory of the present embodiment is formed as a 64-Mbit SDRAM with four banks BK0–BK3, having a maximum clock frequency of 10 MHz. The interval at which the refresh request occurs signal REFRQ is set at 510 ns. Besides, the SDRAM has a precharge all command for precharging all the banks BK0–BK3 simultaneously.

The refresh control circuit 64 includes the starter circuit 46, the delay circuit 48, and the status latching circuit 54 which are identical to those of the third embodiment, along with a holding circuit 66 and a refresh address control circuit 68.

The holding circuit 66 receives a power-on resetting signal POR, a refresh start signal REFS, a refresh timing signal REFT, and status latched signals STL0–STL3, and outputs completion signals CMP0–CMP3, select signals SEL0–SEL3, a select signal BS3, and address select signals RAC0–RAC3 for selecting refresh addresses.

The refresh address control circuit 68 receives the power-on resetting signal POR, the completion signals CMP0–CMP3, the address select signals RAC0–RAC3, and the select signal BS3, and outputs refresh address signals READ0 and REFAD1.

Figure 29:
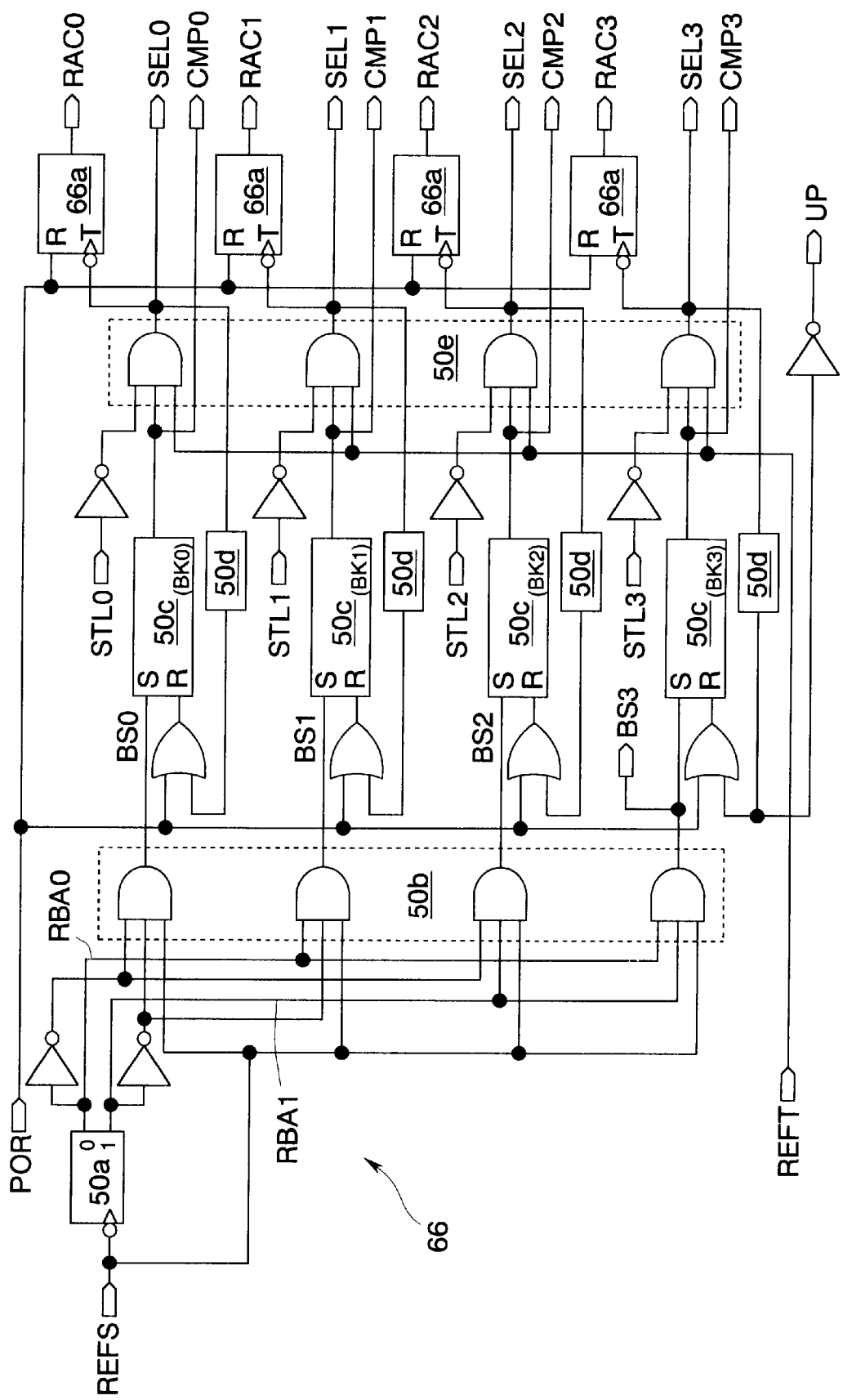
FIG. 29 is a circuit diagram showing the details of the holding circuit in FIG. 28.

FIG. 29 shows the details of the holding circuit 66.

The holding circuit 66 is constituted by adding toggle flip-flops 66a, which respectively correspond to the banks BK0–BK3, to the holding circuit 50 (FIG. 18) of the third embodiment. The toggle flip-flops 66a are reset by the power-on resetting signal POR which is activated upon power-on. The toggle flip-flops 66a subsequently invert the levels of the address select signals RAC0–RAC3 in synchronization with the falling edges of the select signals SEL0–SEL3, respectively. That is, the address select signals RAC0–RAC3 are inverted when the banks BK0–BK3 are refreshed. Refresh is performed by using the refresh address REFAD0 when the address select signals RAC0–RAC3 are at low level, and by using the refresh address REFAD1 when the address select signals RAC0–RAC3 are at high level.

Figure 30:
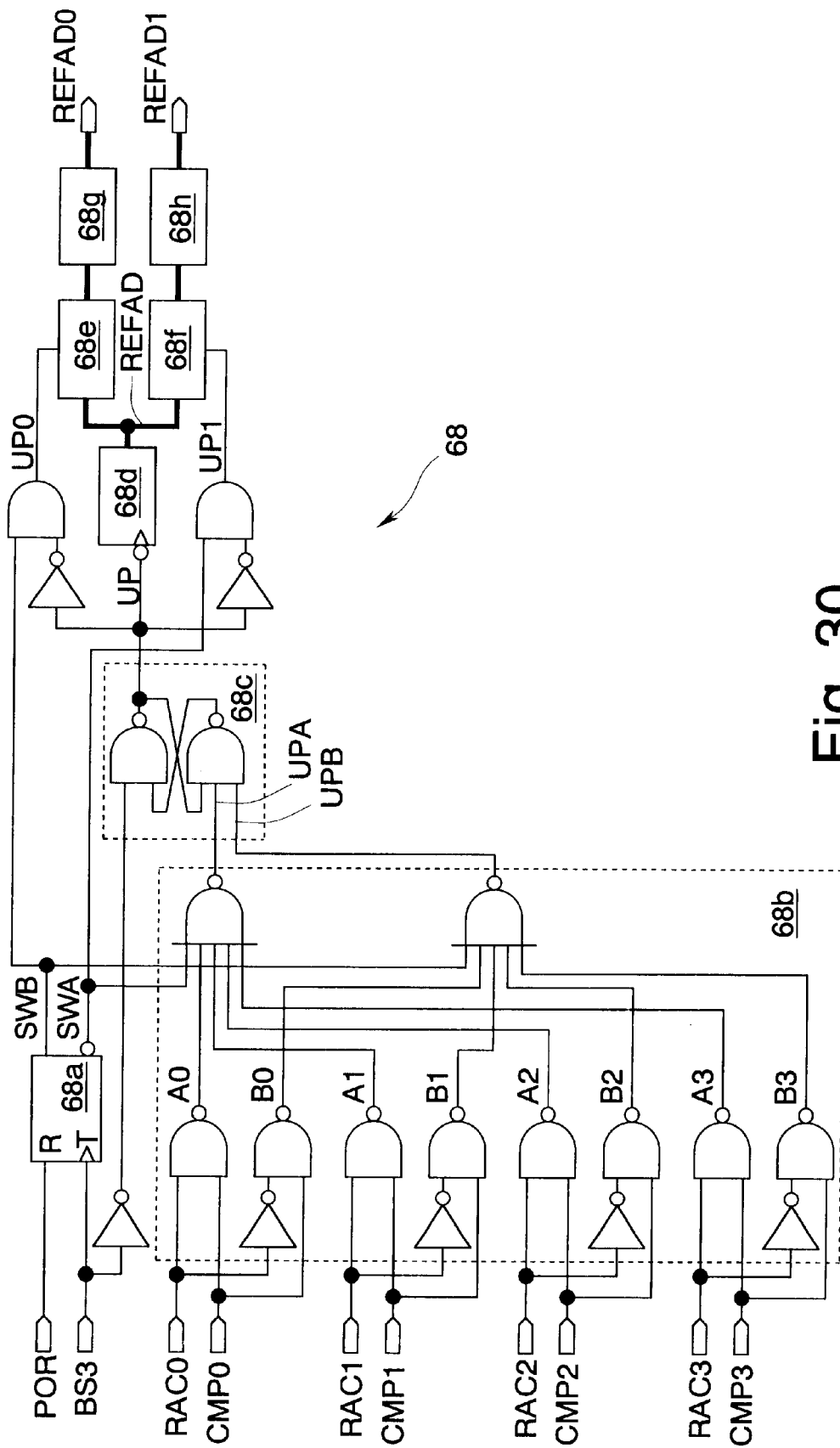
FIG. 30 is a circuit diagram showing the details of the refresh address control circuit in FIG. 28.

FIG. 30 shows the details of the refresh address control circuit 68.

The refresh address control circuit 68 includes a toggle flip-flop 68a, a control circuit 68b having NAND gates and inverters, a flip-flop 68c, a refresh counter 68d, switches 68e and 68f, and latches 68g and 68h.

The toggle flip-flop 68a is reset by the power-on resetting signal POR, and subsequently inverts the levels of complementary switching signals SWA and SWB in synchronization with the falling edge of the select signal BS3. That is, the switching signals SWA and SWB are alternately activated (high level) each time a refresh request to the bank BK3 occurs.

The control circuit 68b has eight two-input NAND gates, two five-input NAND gates, and inverters. Four of the two-input NAND gates are activated when the address select signals RAC0–RAC3 are at high level, respectively, thereby outputting the inverted levels of the completion signals CMP0–CMP3 as status signals A0–A3. The other four of the two-input NAND gates are activated when the address select signals RAC0–RAC3 are at low level, respectively, thereby outputting the inverted levels of the completion signals CMP0–CMP3 as status signals B0–B3. One of the five-input NAND gates turns a count up signal UPA to low level when the switching signal SWA and all the status signals A0–A3 are at high level. The other five-input NAND gate turns a count up signal UPB to low level when the switching signal SWB and all the status signals B0–B3 are at high level.

The flip-flop 68c turns a count up signal UP to high level in response to the activation of the select signal BS3, and turns the count up signal UP to low level upon receiving the low level of either of the count up signals UPA and UPB. The refresh counter 68d increments a refresh address REFAD by one in synchronization with the rising edge of the count up signal UP.

The switches 68e and 68f are composed of, e.g., CMOS transmission gates or the like. The switch 68e outputs the refresh address signal REFAD to the latch 68g when the switching signal SWB is at high level and the count up signal UP is at low level. The switch 68f outputs the refresh address signal REFAD to the latch 68h when the switching signal SWA is at high level and the count up signal UP is at low level. The latches 68g and 68h output the accepted refresh addresses REFAD as the refresh addresses REFAD0 and REFAD1, respectively. That is, the refresh address REFAD0 becomes changeable when the switching signal SWB is at high level. The refresh address REFAD1 becomes changeable when the switching signal SWA is at high level. Then, either of the refresh addresses REFAD0 and REFAD1 is used to perform refresh operations.

Figure 31:
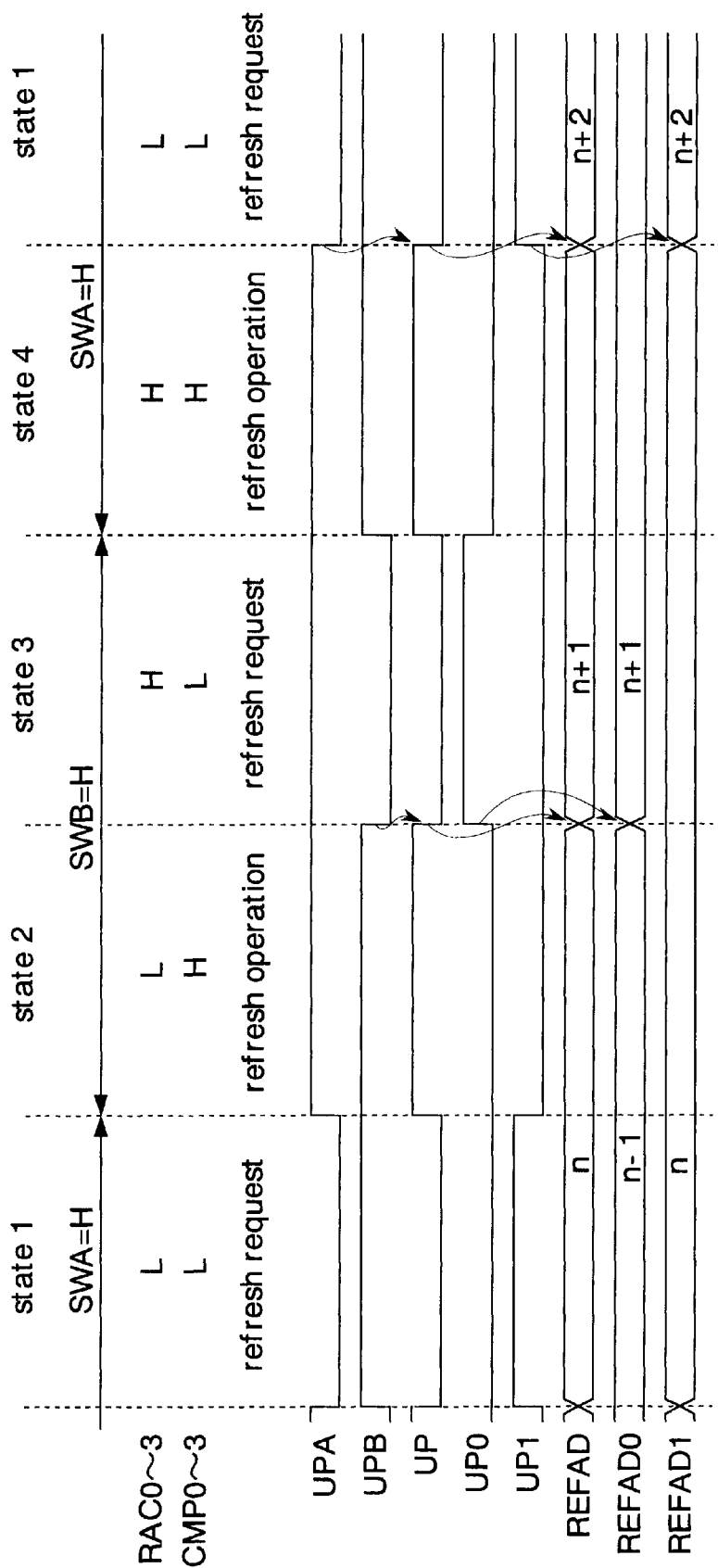
FIG. 31 is a timing chart showing the operation of the refresh address control circuit in FIG. 28.

FIG. 31 shows the principle of operation of the refresh address control circuit 68.

The refresh address control circuit 68 takes state 1 to state 4 on each of the banks BK0–BK3, depending on the levels of the address select signals RAC0–RAC3 and the completion signals CMP0–CMP3. In the state 1, refresh requests corresponding to the banks BK0–BK3 occur in succession. When a refresh request for the bank BK3 occurs with the activation of the not-shown select signal BS3, the state changes from the state 1 to the state 2 so that banks not in operation are refreshed successively. That is, after the select signal BS3 is activated and the refresh address control circuit 68 goes out of the state 2, it follows that all the banks BK0–BK3 are completed of refresh under a single refresh address. In this period, the banks in the state 1 or 2 are subjected to the refresh address REFAD0. After further change in state, the banks in the state 3 or 4 will be subjected to the refresh address REFAD1. Subsequently, when all the banks go out of the state 2, the refresh address control circuit 68 increases the refresh addresses REFAD and REFAD0 by "1," shifting from the state 2 to the state 3.

In the states 3 and 4, if a refresh request for the bank BK3 occurs with the activation of the not-shown select signal BS3, the state changes from the state 3 to the state 4 so that banks not in operation are refreshed successively. That is, after the select signal BS3 is activated and the refresh address control circuit 68 goes out of the state 4, it follows that all the banks BK0–BK3 are completed of refresh under a single refresh address. The banks in the state 3 or 4 are subjected to the refresh address REFAD1. After further change in state, the banks in the state 1 or 2 will be subjected to the refresh address REFAD0. Subsequently, when all the banks go out of the state 4, the refresh address control circuit 68 increases the refresh addresses REFAD and REFAD1 by "1," shifting from the state 4 to the state 1.

In this connection, the boundaries of the states 1–4 shown by the broken lines shift in the lateral direction of the chart bank by bank, depending on the timing of the refresh operations of the banks BK0–BK3. Therefore, all the shown signals will not simultaneously change across the boundaries.

Figure 32:
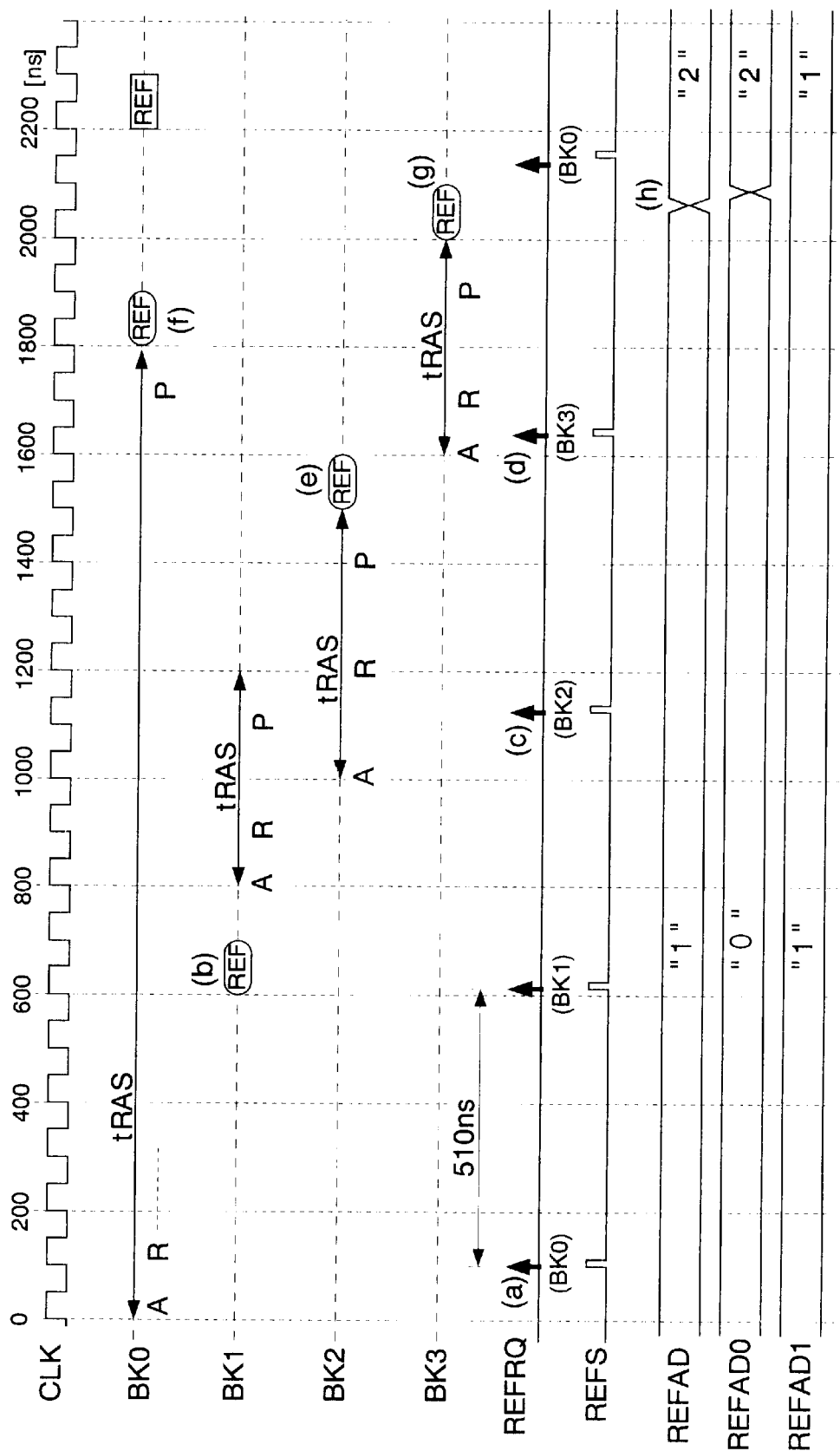
FIG. 32 is a timing chart showing an overview of the refresh operations in the fifth embodiment.

FIG. 32 shows an overview of the refresh operations in the SDRAM described above. In this example, an active command A corresponding to the bank BK0 is supplied at time 0 ns, and the bank BK0 performs its normal operation until time 1800 ns. The banks BK1–BK3 perform their normal operations in the same timing as in the third embodiment (FIG. 20). The burst length is set at "2." The maximum time (timing specification) of tRAS is set at 2000 ns.

In the chart, a refresh request signal REFRQ corresponding to the bank BK0 occurs when the bank BK0 is activated (FIG. 32(a)). Therefore, this refresh request is held in the RS flip-flop 50c shown in FIG. 29. Next, a refresh request signal REFRQ corresponding to the bank BK1 occurs to perform the refresh operation of the bank BK1 (FIG. 32(b)). The refresh is performed by using the refresh address REFAD0 output from the latch 68g shown in FIG. 30. Next, refresh request signals REFRQ corresponding to the banks BK2 and BK3 occur in succession (FIGS. 32(c), (d) ). Since both the banks BK2 and BK3 are activated, these refresh requests are held in the RS flip-flops 50c.

In response to the completion of the precharge operation of the bank BK2, the refresh timing signal REFT shown in FIG. 28 is activated to perform the refresh operation of the bank BK2 (FIG. 32(e)). Similarly, in response to the completion of the precharge operations of the banks BK0 and BK3, the refresh timing signal REFT shown in FIG. 28 is activated to perform the refresh operations of the bank BK0 and BK3, respectively (FIGS. 32(f), (g)).

The refresh operation of the bank BK3 completes the refresh operations of all the banks BK0–BK3 corresponding to a single refresh address (="0"). Therefore, the refresh address REFAD changes from "1" to "2," and the refresh address REFAD0 changes from "0" to "2" (FIG. 32(h)). In the present embodiment, each time the refresh address REFAD increases, the refresh addresses REFAD0 and REFAD1 increase by 2 in turn. Then, either one of the refresh addresses is used for refresh. Due to the use of the two successive refresh addresses, the tRAS can be made four times (2000 ns) as much as in the third embodiment. Besides, the refresh operations are performed without being recognized from exterior.

Figure 33:
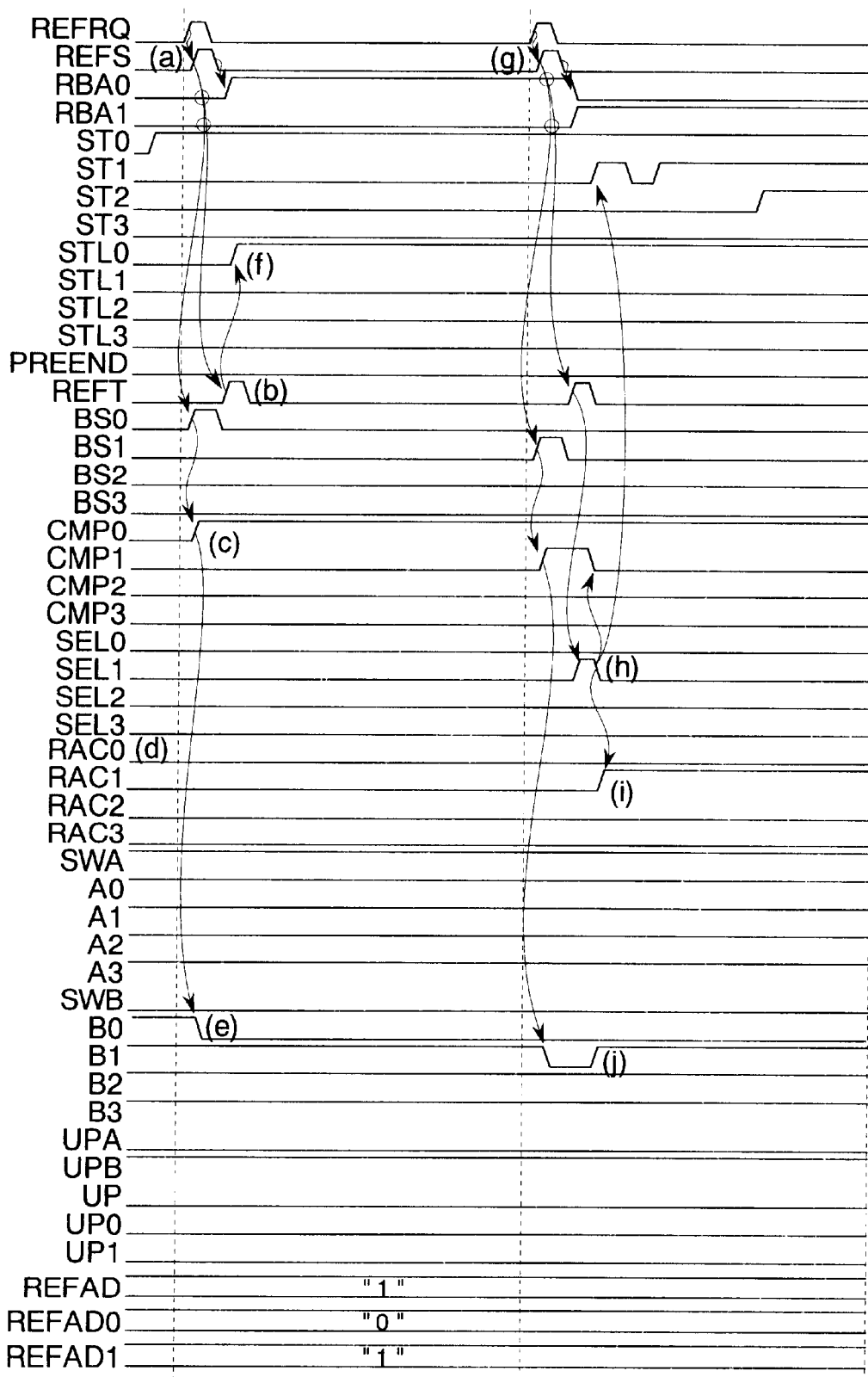
FIG. 33 is a timing chart showing the operation of the refresh control circuit in the fifth embodiment.

FIG. 33 shows the operations of the refresh control circuit 64 during the period of 100 to 1120 ns in the timing shown in FIG. 32.

Initially, as in the third embodiment (FIG. 21), the refresh request signal REFRQ, the refresh start signal REFS, and the refresh timing signal REFT are activated (FIGS. 33(a), (b)), followed by the activation of the completion signal CMP0 (FIG. 33(c)). Here, the address select signals RAC0–RAC3 are set at low level, the status signals A0–A3 and B0–B3 are set at high level, and the switching signals SWA and SWB are set at high level and low level, respectively (FIG. 33(d)). The control circuit 68b shown in FIG. 30 outputs the inverted level of the completion signal CMP0 as the status signal B0 (FIG. 33(e)). Since the bank BK0 is in operation, the status latched signal STL0 turns to high level, precluding the refresh of the bank BK0 (FIG. 33(f)).

Next, the refresh request signal REFRQ corresponding to the bank BK1 occurs (FIG. 33(g)). Since the bank BK1 is not in operation, the select signal SEL1 is activated as in FIG. 21 so that the refresh operation is performed (FIG. 33(h)). Due to the low level of the address select signal RAC0, the refresh of the bank BK1 is performed under the refresh address REFAD0 (="0"). The activation of the select signal SEL1 turns the address select signal RAC1 to high level (FIG. 33(i)). Accordingly, the refresh address REFAD1 is used when the next refresh request corresponding to the bank BK1 occurs. The control circuit 68b outputs the inverted level of the completion signal CMP1 as the status signal B1 (FIG. 33 (j)).

Figure 34:
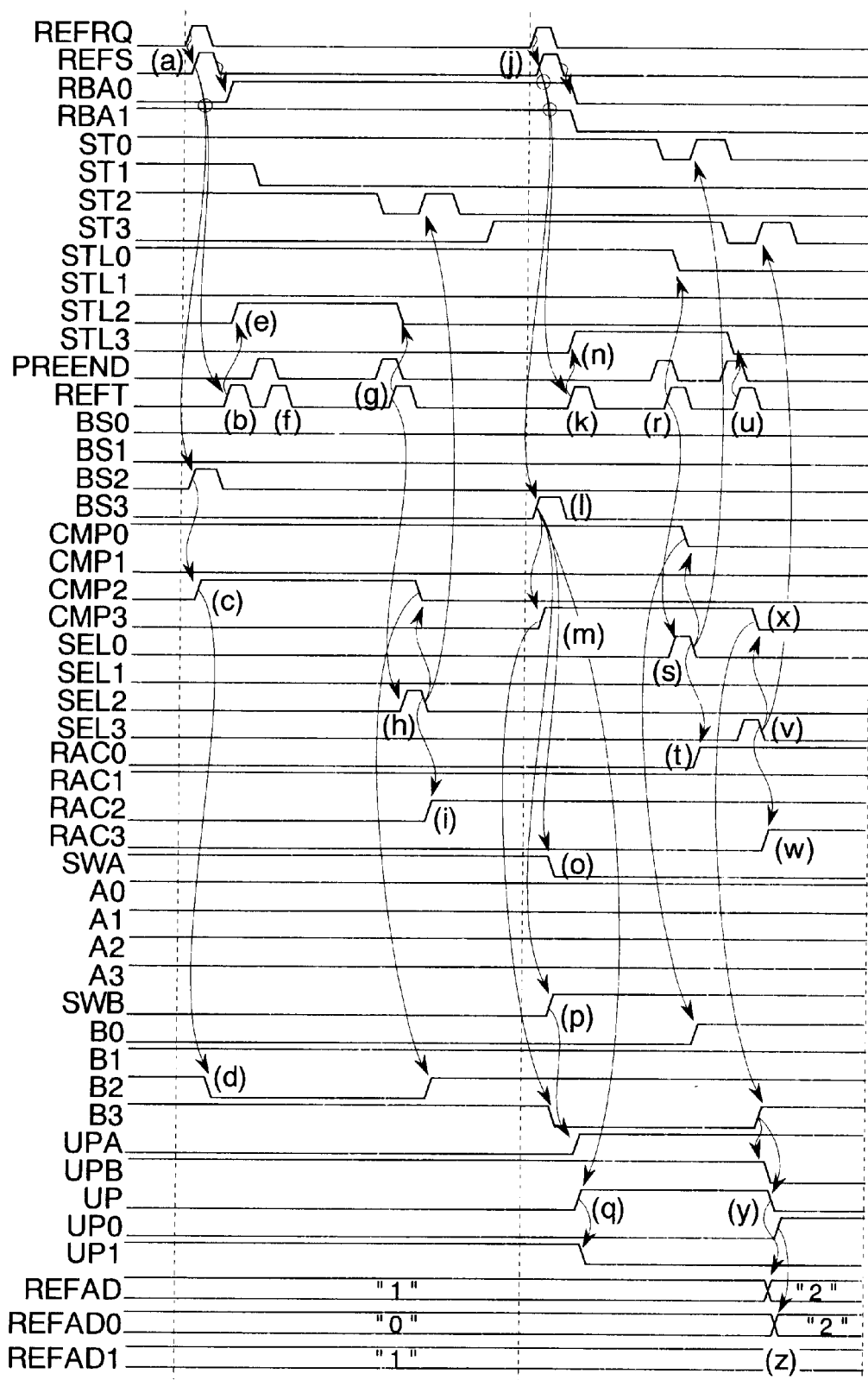
FIG. 34 is a timing chart showing the operation of the refresh control circuit in the fifth embodiment.

FIG. 34 shows the operations of the refresh control circuit 64 during the period of 1120 to 2140 ns in the timing shown in FIG. 32.

Initially, as in the third embodiment (FIG. 22), the refresh request signal REFRQ corresponding to the bank BK2, the refresh start signal REFS, and the refresh timing signal REFT are activated (FIGS. 34(a), (b)), followed by the activation of the completion signal CMP2 (FIG. 34(c)). The control circuit 68b outputs the inverted level of the completion signal CMP2 as the status signal B2 (FIG. 34(d)). Since the bank BK2 is in operation, the status latched signal STL2 turns to high level, precluding the refresh of the bank BK2 (FIG. 34(e)).

The bank BK1 completes its normal operation so that the precharge end signal PREEND is activated to activate the refresh timing signal REFT (FIG. 34(f)). Subsequently, the bank BK2 completes its normal operation so that the precharge end signal PREEND is activated to activate the refresh timing signal REFT (FIG. 34(g)). The select signal SEL2 is activated in response to the activation of the refresh timing signal REFT, whereby the refresh operation of the bank BK2 is performed under the refresh address REFAD0 (FIG. 34(h)). The activation of the select signal SEL2 turns the address select signal RAC2 to high level (FIG. 34(i)).

Next, the refresh request signal REFRQ corresponding to the bank BK3, the refresh start signal REFS, the refresh timing signal REFT, and the select signal BS3 are activated (FIGS. 34(j), (k), (l)), followed by the activation of the completion signal CMP3 (FIG. 34(m)). Since the bank BK3 is in operation, the status latched signal STL3 turns to high level, precluding the refresh of the bank BK3 (FIG. 34(n)). In response to the activation of the select signal BS3, the switching signals SWA and SWB change to low level and high level, respectively (FIGS. 34(o), (p)), and the count up signal UPA turns to high level. The flip-flop 68c shown in FIG. 30 is set in response to the activation of the select signal BS3, thereby changing the count up signal UP to high level (FIG. 34(q)).

Next, the bank BK0 completes its normal operation so that the precharge end signal PREEND is activated to activate the refresh timing signal REFT (FIG. 34(r)). The select signal SEL0 is activated in response to the activation of the refresh timing signal REFT, whereby the refresh operation of the bank BK0 is performed under the refresh address REFAD0 (FIG. 34(s)). The activation of the select signal SEL0 turns the address select signal RAC0 to high level (FIG. 34(t)).

Next, the bank BK3 completes its normal operation so that the precharge end signal PREEND is activated to activate the refresh timing signal REFT (FIG. 34(u)). The select signal SEL3 is activated in response to the activation of the refresh timing signal REFT, whereby the refresh operation of the bank BK3 is performed under the refresh address REFAD0 (FIG. 34(v)). The activation of the select signal SEL3 turns the address select signal RAC3 to high level (FIG. 34(w)).

The refresh operation of the bank BK3 inactivates the completion signal CMP3 (FIG. 34(x)). At this point, the refreshes of the banks BK0–BK3 under the refresh address REFAD0 are completed. Accordingly, the count up signals UP and UP0 change to low level and high level, respectively (FIG. 34(y)). The refresh address REFAD changes from "1" to "2," and REFAD0 from "0" to "2" (FIG. 34(z)).

Figure 35:
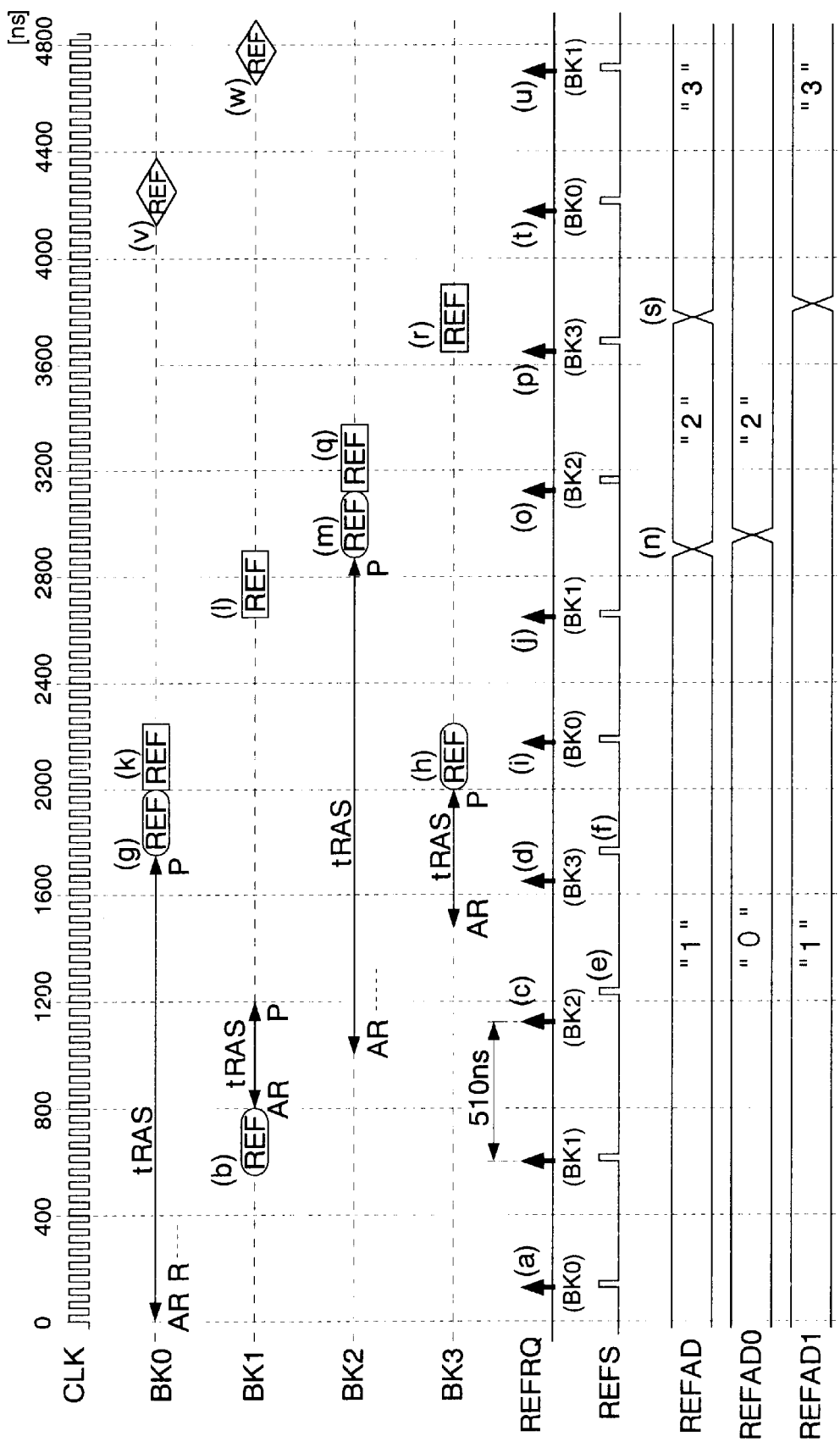
FIG. 35 is a timing chart showing another example of the refresh operation in the fifth embodiment.

FIG. 35 shows another example of the refresh operations in the SDRAM described above. In this example, the bank BK0 performs its normal operation from time 0 to 1800 ns. The bank BK1 performs its normal operation from time 800 to 1200 ns. The bank BK2 performs its normal operation from time 1000 to 2900 ns. The bank BK3 performs its normal operation from time 1500 to 2000 ns.

In the chart, a refresh request signal REFRQ corresponding to the bank BK0 occurs when the bank BK0 is activated (FIG. 35(a)). Therefore, this refresh request is held. Next, a refresh request signal REFRQ corresponding to the bank BK1 occurs, and the refresh operation of the bank BK1 is performed under the refresh address REFAD0 (FIG. 35(b)). Next, refresh request signals REFRQ corresponding to the banks BK2 and BK3 occur in succession (FIGS. 35(c), (d)). The refresh requests corresponding to the banks BK2 and BK3 overlap with the precharge operations of the banks BK1 and BK0, respectively. On this account, the starter circuit 46 shown in FIG. 17 shifts the activation timing of the refresh start signal REFS (FIGS. 35(e), (f)).

The banks BK0 and BK3 complete their operations, and the refresh operations of the banks BK0 and BK3 are performed under the refresh address REFAD0 (FIGS. 35(g), (h)). Then, refresh request signals REFRQ corresponding to the banks BK0 and BK1 occur in succession (FIGS. 35(i), (j)), and the refresh operations of the banks BK0 and BK1 are performed under the refresh address REFAD1 (FIGS. 35(k), (l)).

Next, the bank BK2 completes its operation, and the refresh operation of the bank BK2 is performed under the refresh address REFAD0 (FIG. 35(m)). The refresh operation of the bank BK2 completes the refresh operations of all the banks BK0–BK3 corresponding to a single refresh address (="0"). Therefore, the refresh address REFAD changes from "1" to "2," and the refresh address REFAD0 changes from "0" to "2" (FIG. 35(n)).

Next, refresh request signals REFRQ corresponding to the banks BK2 and BK3 occur in succession (FIGS. 35(o), (p)), and the refresh operations of the banks BK2 and BK3 are performed under the refresh address REFAD1 (="1") (FIGS. 35(q), (r)). The refresh operation of the bank BK3 completes the refresh operations of all the banks BK0–BK3 corresponding to a single refresh address (="1"). Therefore, the refresh address REFAD changes from "2" to "3," and the refresh address REFAD1 changes from "1" to "3" (FIG. 35(s)).

Subsequently, refresh request signals REFRQ corresponding to the banks BK0 and BK1 occur in succession (FIGS. 35(t), (u)), and the refresh operations of the banks BK0 and BK1 are performed under the refresh address REFAD0 (="2") (FIGS. 35(v), (w)).

Figure 36:
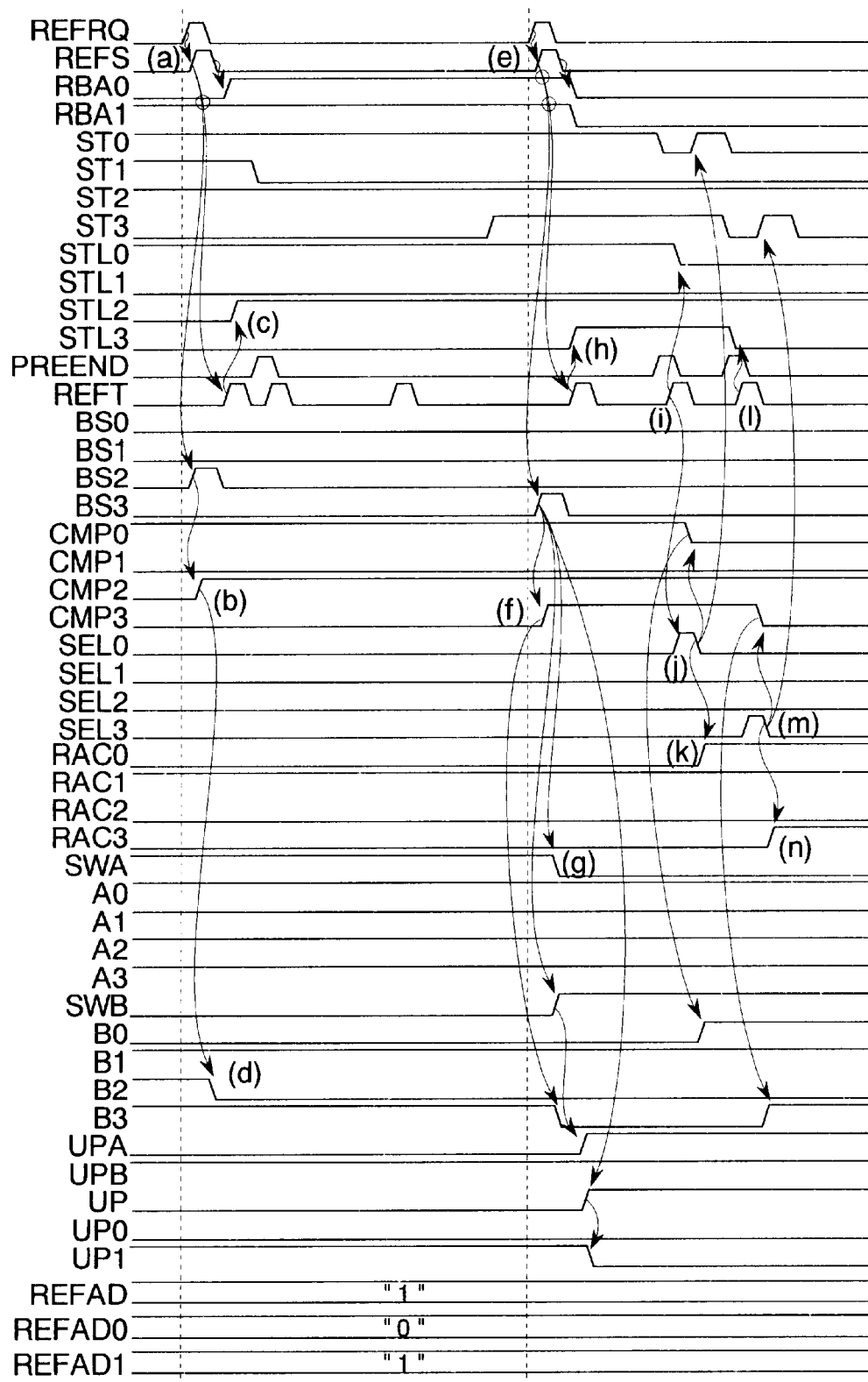
FIG. 36 is a timing chart showing the operation of the refresh control circuit in FIG. 35.

FIG. 36 shows the operations of the refresh control circuit 64 for the period between time 1120 and 2140 ns in the timing shown in FIG. 35. In this connection, since the timing chart of FIG. 35 is identical to that of FIG. 33 for the period between time 100 and 1120 ns, description thereof will be omitted here.

Initially, the refresh request signal REFRQ corresponding to the bank BK2 is activated (FIG. 36(a)), followed by the activation of the completion signal CMP2 (FIG. 36(b)). In this example, the bank BK2 is in operation; therefore, the status latched signal STL2 turns to high level, precluding the refresh of the bank BK2 (FIG. 36(c)). Accordingly, the select signal B2 maintains its low level (FIG. 36(d)).

Next, the refresh request signal REFRQ corresponding to the bank BK3 is activated (FIG. 36(e)), followed by the activation of the completion signal CMP3 and the select signal BS3 (FIG. 36(f)). The activation of the select signal BS3 inverts the levels of the switching signals SWA and SWB (FIG. 36(g)). Since the bank BK3 is in operation, the status latched signal STL3 turns to high level, precluding the refresh of the bank BK3 (FIG. 36(h)).

Then, the bank BK0 completes its normal operation. The precharge end signal PREEND, the refresh timing signal REFT, and the select signal SEL0 are activated to perform the refresh operation of the bank BK0 under the refresh address REFAD0 (FIGS. 36(i), (j)). The address select signal RAC0 turns to high level in response to the inactivation of the select signal SEL0 (FIG. 36(k)).

Similarly, the bank BK3 completes its normal operation, so that the precharge end signal PREEND, the refresh timing signal REFT, and the select signal SEL3 are activated to perform the refresh operation of the bank BK3 under the refresh address REFAD0 (FIGS. 36(l), (m)). The address select signal RAC3 turns to high level in response to the inactivation of the select signal SEL3 (FIG. 36(n)). At this point, the refresh operation of the bank BK2 under the refresh address REFAD0 is yet to be performed; therefore, neither of the refresh addresses REFAD and REFAD0 is counted up.

Figure 37:
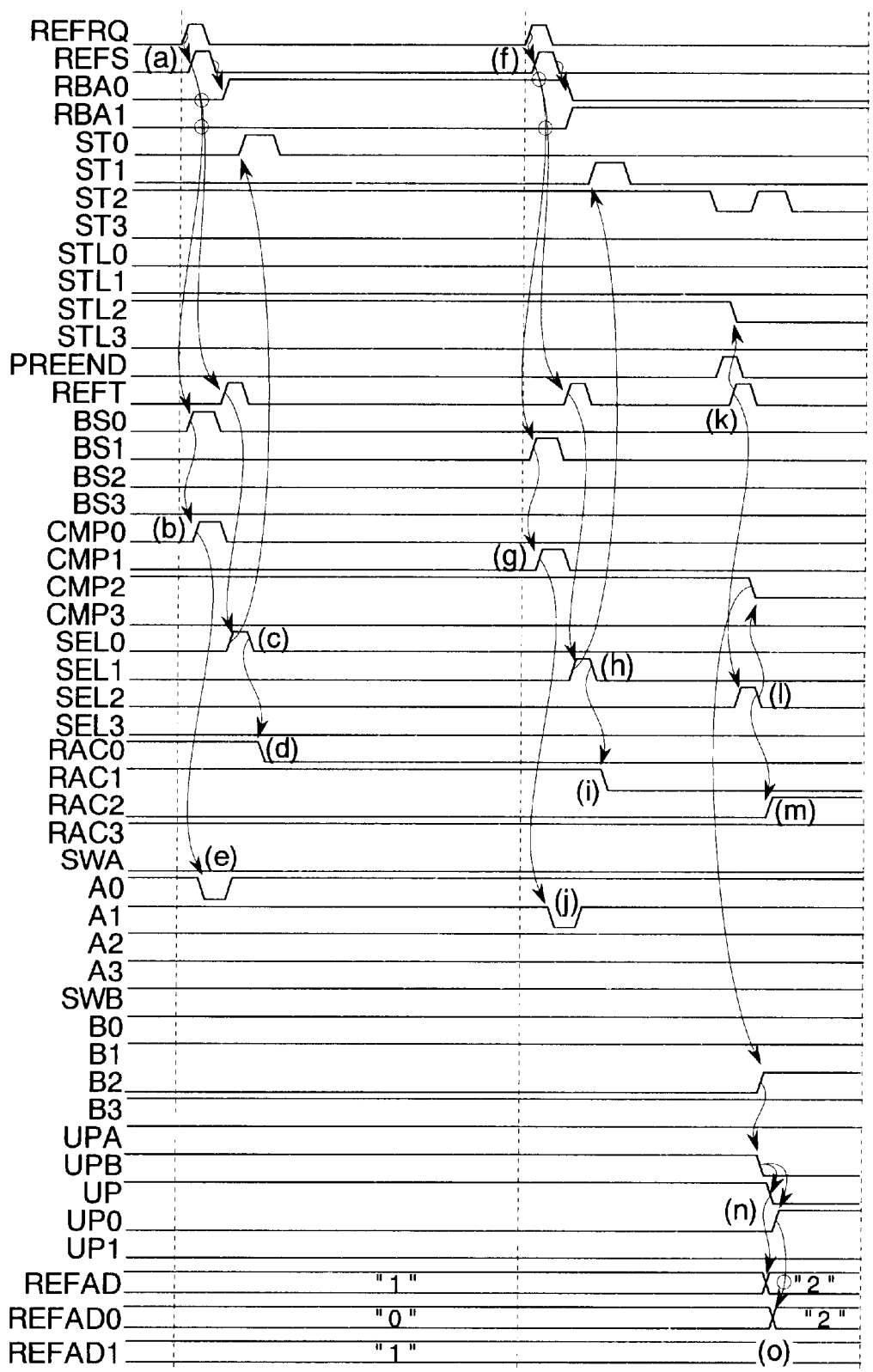
FIG. 37 is a timing chart showing the operation of the refresh control circuit in FIG. 35.

FIG. 37 shows the operations of the refresh control circuit 64 for the period between time 2140 and 3160 ns in the timing shown in FIG. 35.

Initially, the refresh request signal REFRQ corresponding to the bank BK0 is activated (FIG. 37(a)), followed by the activation of the completion signal CMP0 (FIG. 37(b)). Since the bank BK0 is not in operation, the select signal SEL0 is activated to perform the refresh operation (FIG. 37(c)). The address select signal RAC0 turns to low level in response to the activation of the select signal SEL0 (FIG. 37(d)). The control circuit 68b shown in FIG. 30 unput the inverted level of the completion signal CMP0 as the status signal A0 (FIG. 37(e)).

Next, the refresh request signal REFRQ corresponding to the bank BK1 is activated (FIG. 37(f)), followed by the activation of the completion signal CMP1 (FIG. 37(g)). Since the bank BK1 is not in operation, the select signal SEL1 is activated to perform the refresh operation under the refresh address REFAD1 (="1") (FIG. 37(h)). The address select signal RAC1 turns to low level in response to the inactivation of the select signal SEL1 (FIG. 37(i)). The control circuit 68b outputs the inverted level of the completion signal CMP1 as the status signal A1 (FIG. 37(j)).

Next, the bank BK2 completes its normal operation, so that the precharge end signal PREEND, the refresh timing signal REFT, and the select signal SEL2 are activated to perform the refresh operation of the bank BK2 under the refresh address REFAD0 (FIGS. 37(k), (l)). The address select signal RAC2 turns to high level in response to the inactivation of the select signal SEL2 (FIG. 37(m)). At this point, the refreshes of the banks BK0–BK3 under the refresh address REFAD0 are completed. Thus, in response to the inactivation of the completion signal CMP2, the count up signals UP and UP0 change to low level and high level, respectively (FIG.37(y)). The refresh address REFAD changes from "1" to "2," and REFAD0 from "0" to "2" (FIG. 37(o)).

Figure 38:
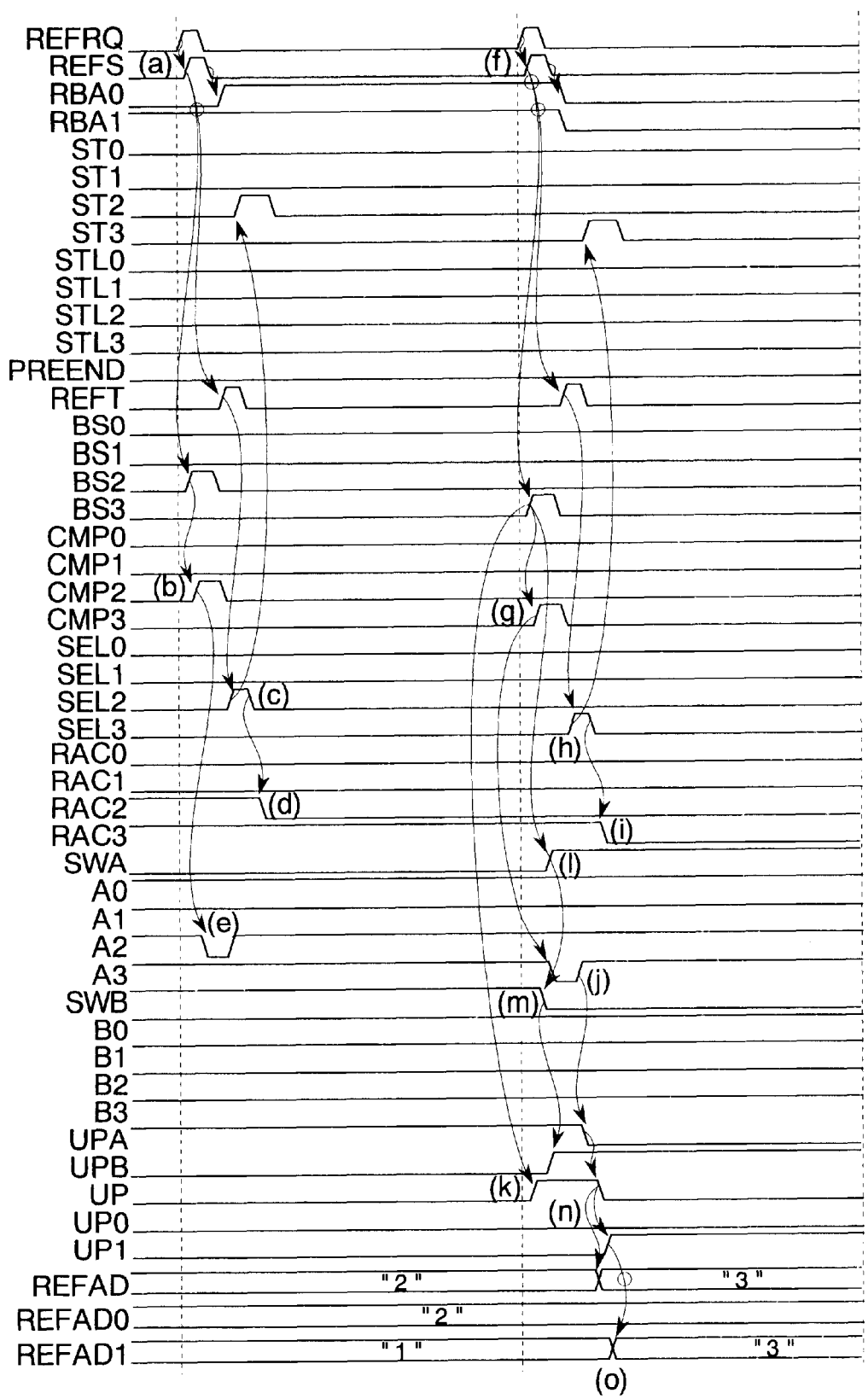
FIG. 38 is a timing chart showing the operation of the refresh control circuit in FIG. 35.

FIG. 38 shows the operations of the refresh control circuit 64 for the period between time 3160 and 4180 ns in the timing shown in FIG. 35.

Initially, the refresh request signal REFRQ corresponding to the bank BK2 is activated (FIG. 38(a)), followed by the activation of the completion signal CMP2 (FIG. 38(b)). Since the bank BK2 is not in operation, the select signal SEL2 is activated to perform the refresh operation (FIG. 38(c)). The address select signal RAC2 turns to low level in response to the inactivation of the select signal SEL2 (FIG. 38(d)). The control circuit 68b outputs the inverted level of the completion signal CMP2 as the status signal A2 (FIG. 38(e)).

Next, the refresh request signal REFRQ corresponding to the bank BK3 is activated (FIG. 38(f)), followed by the activation of the completion signal CMP3 (FIG. 38(g)). Since the bank BK3 is not in operation, the select signal SEL3 is activated to perform the refresh operation under the refresh address REFAD1 (FIG. 38(h)). The address select signal RAC3 turns to low level in response to the inactivation of the select signal SEL3 (FIG. 38(i)). The control circuit 68b outputs the inverted level of the completion signal CMP3 as the status signal A3 (FIG. 37(j)). In response to the activation of the select signal BS3, the count up signal UP turns to high level (FIG. 38(k)), inverting the switching signals SWA and SWB again (FIG. 38(l), (m)).

At this point, the refreshes of the banks BK0–BK3 under the refresh address REFAD1 are completed. Thus, in response to the activation of the completion signal CMP3, the count up signals UP and UP1 change to low level and high level, respectively (FIG. 38(n)). The refresh address REFAD changes from "2" to "3," and REFAD1 from "1" to "3" (FIG. 38(o)).

This embodiment can offer the same effects as those obtained from the first embodiment described above. Moreover, in this embodiment, performing refresh operations by using the two successive refresh addresses allows tRAS four times (2000 ns) as much as in the third embodiment.

Besides, as in the third embodiment, the refresh operations of the banks BK0–BK3 can be distributed for a reduction in peak current.

Figure 39:
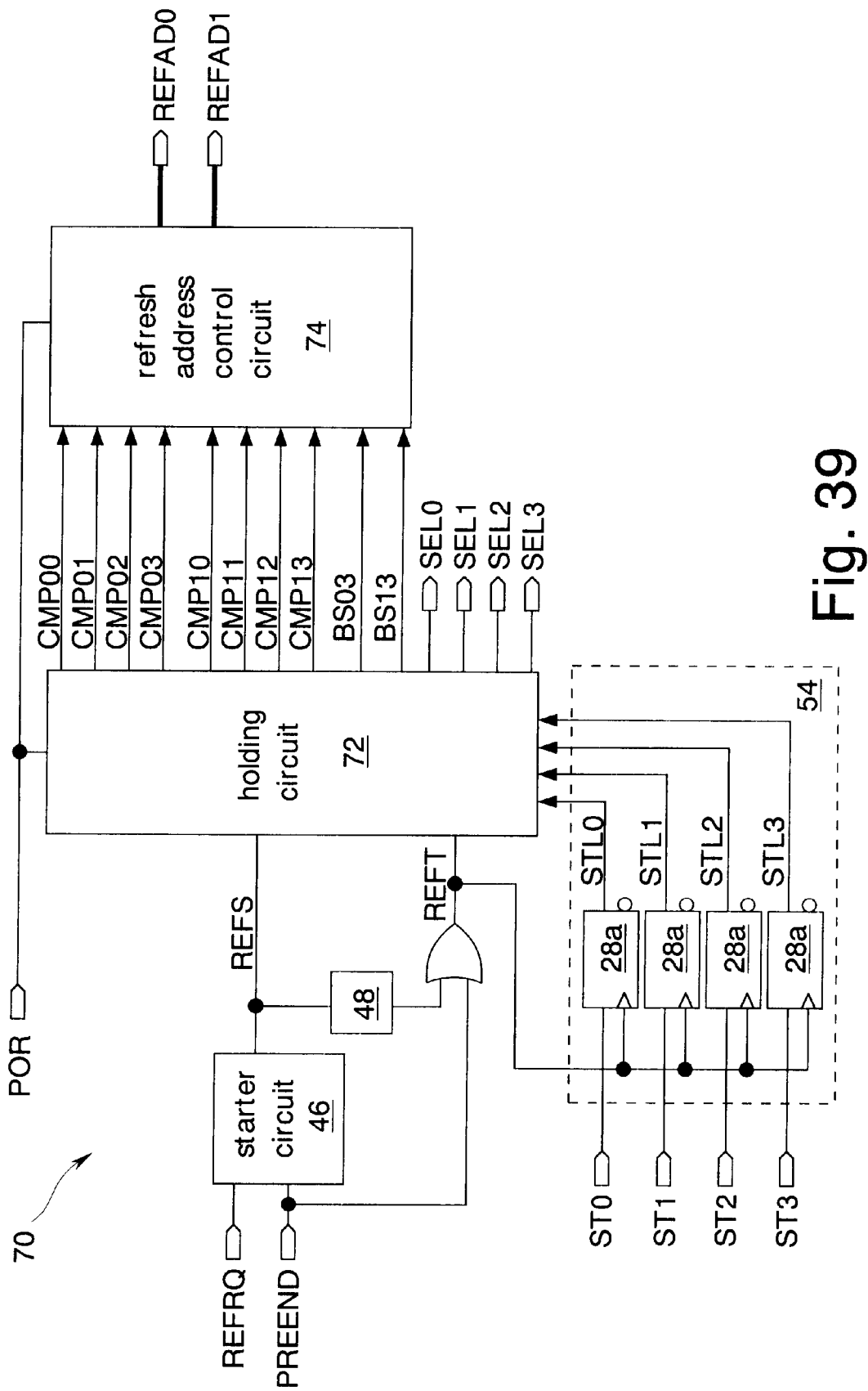
FIG. 39 is a block diagram showing a refresh control circuit in a sixth embodiment of the present invention.

FIG. 39 shows a sixth embodiment of the semiconductor memory in the present invention. The same circuits and signals as those described in the third embodiment will be designated by identical reference numbers or symbols.

This embodiment includes a refresh control circuit 70 which differs from the refresh control circuit 18 of the first embodiment. The other configuration is identical to that of the first embodiment. The semiconductor memory of the present embodiment is formed as a 64-Mbit SDRAM with four banks BK0–BK3, having a maximum clock frequency of 10 MHz. The interval at which the refresh request signal REFRQ occurs is set at 510 ns. Besides, the SDRAM has a precharge all command for precharging all the banks BK0–BK3 simultaneously.

The refresh control circuit 70 includes the starter circuit 46, the delay circuit 48, and the status latching circuit 54 which are identical to those of the third embodiment, along with a holding circuit 72 and a refresh address control circuit 74.

The holding circuit 72 receives a power-on resetting signal POR, a refresh start signal REFS, a refresh timing signal REFT, and status latched signals STL0–STL3, and outputs completion signals CMP00–CMP03 and CMP10–CMP13, select signals SEL0–SEL3, and select signals BS03 and BS13.

The refresh address control circuit 74 receives the power-on resetting signal POR, the completion signals CMP00–CMP03 and CMP10–CMP13, and the select signals BS03 and BS13, and outputs refresh address signals REFAD0 and REFAD1. The refresh address control circuit 74 is an address generating circuit for generating a plurality of refresh addresses.

Figure 40:
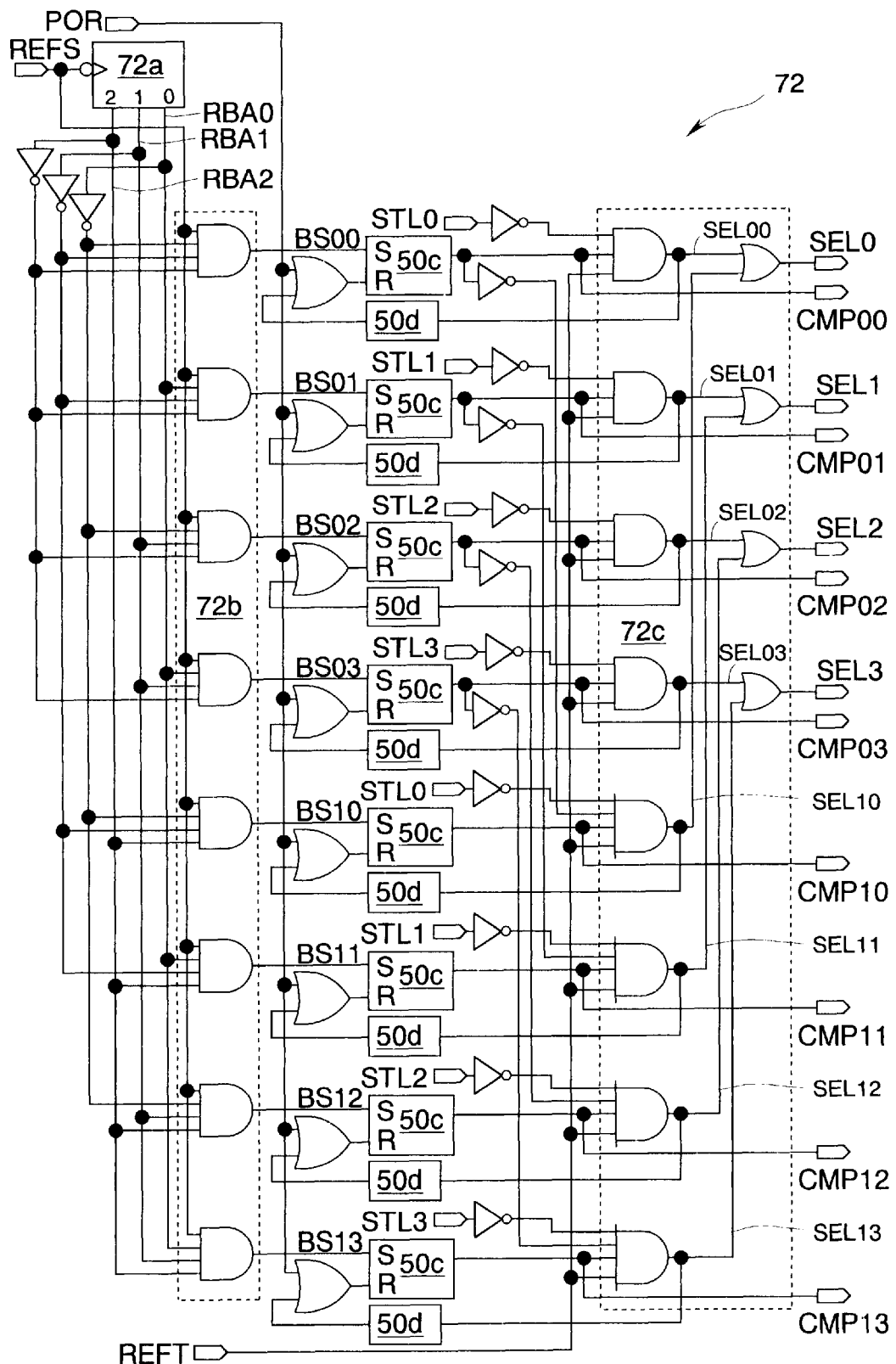
FIG. 40 is a circuit diagram showing the details of the holding circuit in FIG. 39.

FIG. 40 shows the details of the holding circuit 72.

The holding circuit 72 includes a three-bit counter 72a, a decoder 72b for decoding the output of the counter 72a, eight RS flip-flops 50c, eight delay circuits 50d, and an output circuit 72c.

The counter 72a counts up in synchronization with the falling edge of the refresh start signal REFS, and outputs count signals RBA0, RBA1, and RBA2. Here, the count signal RBA0 corresponds to the low order bit.

The decoder 72b has eight three-input AND gates. The decoder 72b activates any one of a select signal BS00 corresponding to a counter value "0," a select signal BS01 corresponding to a counter value "1," a select signal BS02 corresponding to a counter value "2," a select signal BS03 corresponding to a counter value "3," a select signal BS10 corresponding to a counter value "4," a select signal BS11 corresponding to a counter value "5," a select signal BS12 corresponding to a counter value "6," and a select signal BS13 corresponding to a counter value "7" in accordance with the count signals RBA0–RBA2 when the refresh start signal REFS is at high level.

The RS flip-flops 50c receive the select signals BS00–BS03 and BS10–BS13 at their respective set terminals S. They also receive the OR logics of delayed signals obtained by delaying the select signals SEL00–SEL03, SEL10–SEL13 and the power-on resetting signal POR at their respective reset terminals R. That is, the RS flip-flops 50c activate the completion signals CMP00–CMP03 and CMP10–CMP13 when receiving the activation of the select signals BS00–BS03 and BS10–BS13 respectively, and inactivate the completion signals CMP00–CMP03 and CMP10–CMP13 when receiving the activation of the delayed signals of the select signals SEL00–SEL03 and SEL10–SEL13 or the power-on resetting signal POR, respectively. Here, the numerals at the ends of the select signals BS00–BS03, BS10–BS13, SEL00–SEL03, and SEL10–SEL13, and the completion signals CMP00–CMP03 and CMP10–CMP13 correspond to the numbers of the banks. The delay circuits 50d delay the select signals SEL00–SEL03 and SEL10–SEL13 for a predetermined time each, and output the same as the delayed signals.

The output circuit 72c outputs the OR logics of pairs of signals corresponding to the same banks among the select signals SEL00–SEL03 and SEL10–SEL13, as the select signals SEL0–SEL3, respectively. The select signals SEL00–SEL03 and SEL10–SEL13 are output if the completion signals CMP00–CMP03 and CMP10–CMP13 are activated while the status latched signals STL0–STL3 are at low level and the refresh timing signal REFT is at high level, respectively. That is, the output circuit 72c receives the activation of the completion signals CMP00–CMP03 and CMP10–CMP13, and activates the select signals SEL00–SEL03 and SEL10–SEL13 when the corresponding banks BK0–BK3 are not in operation.

Figure 41:
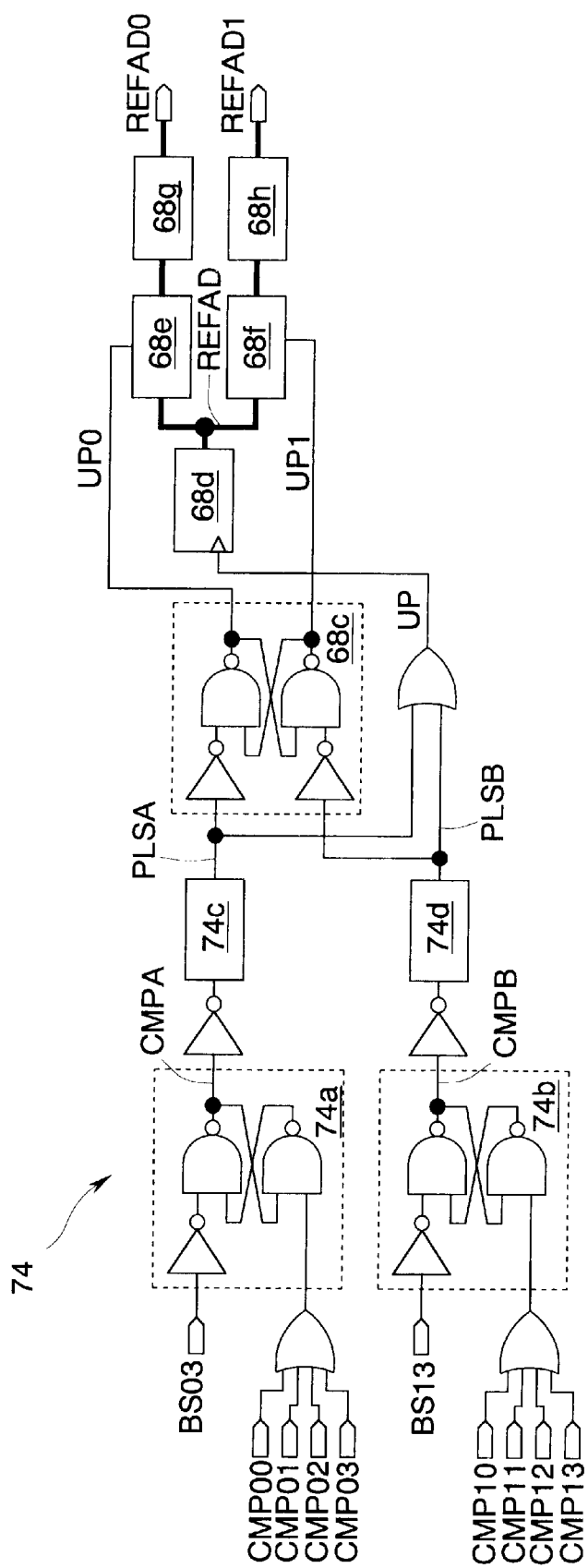
FIG. 41 is a circuit diagram showing the details of the refresh address control circuit in FIG. 39.

FIG. 41 shows the details of the refresh address control circuit 74.

The refresh address control circuit 74 includes flip-flops 74a and 74b, and pulse generators 74c and 74d, along with the flip-flop 68c, the refresh counter 68d, the switches 68e and 68f, and the latches 68g and 68h which are identical to those of the refresh address control circuit 68 in the fifth embodiment.

The flip-flop 74a is set in response to the activation of the select signal BS03, changing a completion signal CMPA to high level. The flip-flop 74a is reset in response to the inactivation of all the completion signals CMP00–CMP03, changing the completion signal CMPA to low level. The flip-flop 74b is set in response to the activation of the select signal BS13, changing a completion signal CMPB to high level. The flip-flop 74a is reset in response to the inactivation of all the completion signals CMP10–CMP13, changing the completion signal CMPB to low level.

The pulse generator 74c generates a positive pulse signal PLSA in synchronization with the falling edge of the completion signal CMPA. The pulse generator 74d generates a positive pulse signal PLSB in synchronization with the falling edge of the completion signal CMPB. The OR logic of the pulse signals PLSA and PLSB is supplied to the refresh counter 68d as a count up signal UP.

Figure 42:
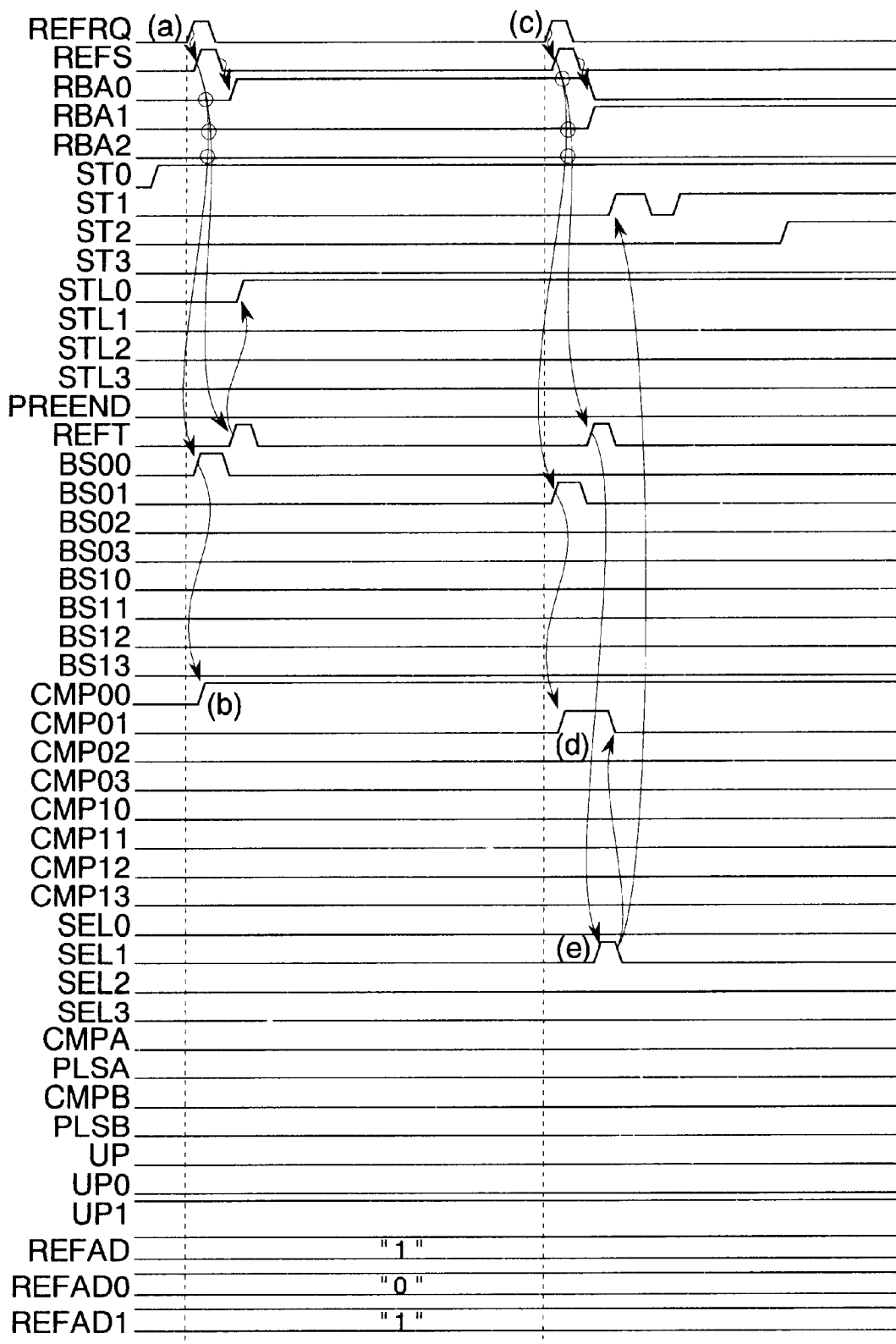
FIG. 42 is a timing chart showing the operation of the refresh control circuit in the sixth embodiment.
Figure 43:
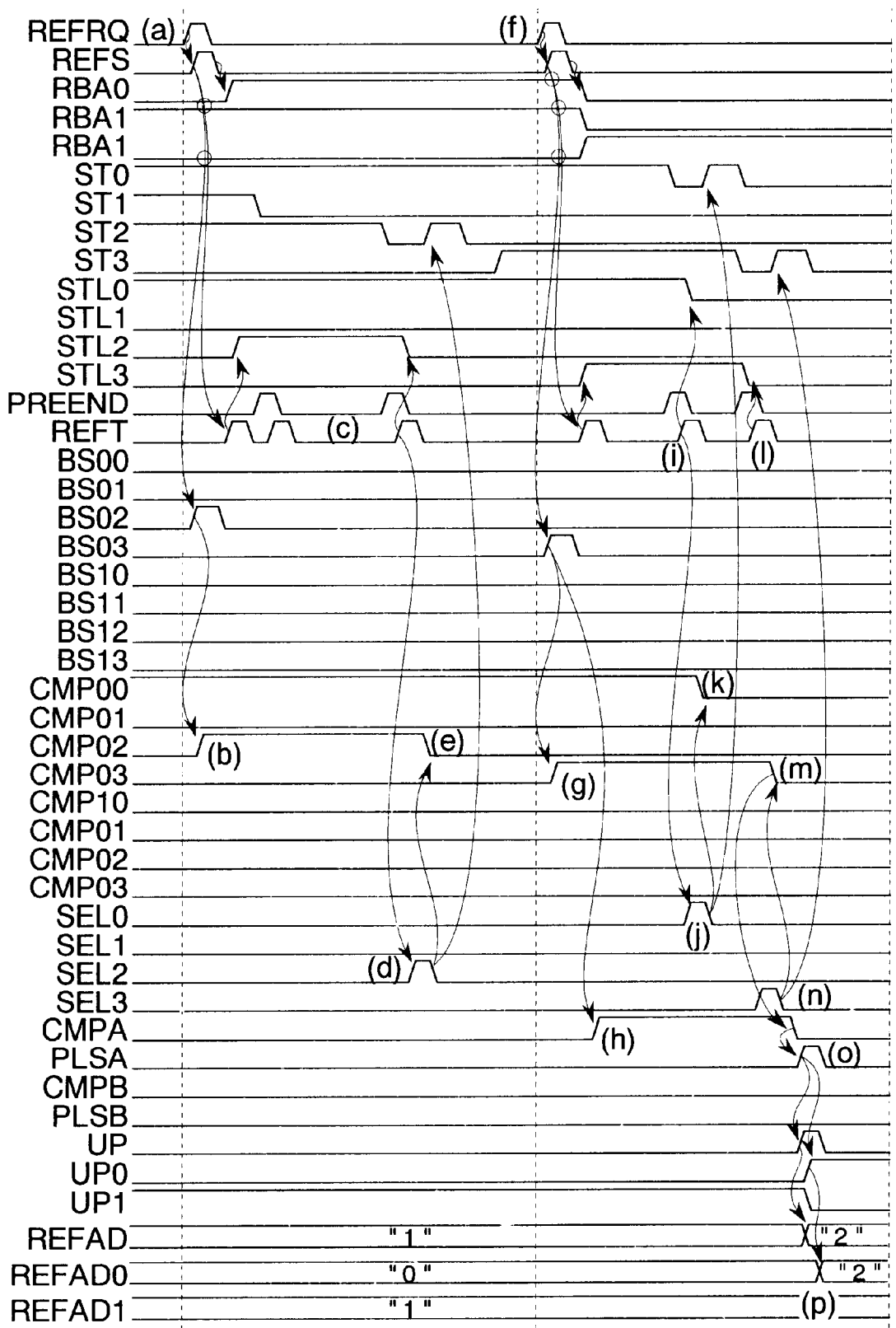
FIG. 43 is a timing chart showing the operation of the refresh control circuit in the sixth embodiment.

FIGS. 42 and 43 show the operations of the refresh address control circuit 70 when the SDRAM operates under the timing shown in FIG. 30. FIGS. 42 and 43 correspond to FIGS. 33 and 34 described above, respectively. Description will be omitted of the waveforms of the same timing as that of FIGS. 33 and 34.

In FIG. 42, initially, the refresh request signal REFRQ corresponding to the bank BK0 is activated (FIG. 42(a)), followed by the activation of the completion signal CMP00 (FIG. 42(b)). Here, no refresh is performed since the bank BK0 is in operation.

Next, the refresh request signal REFRQ corresponding to the bank BK1 is activated (FIG. 42(c)), followed by the activation of the completion signal CMP01 (FIG. 42(d)). Since the bank BK1 is not in operation, the select signal SEL1 is activated for refresh (FIG. 42(e)).

In FIG. 43, the refresh request signal REFRQ corresponding to the bank BK2 is activated (FIG. 43(a)), followed by the activation of the completion signal CMP02 (FIG. 43(b)). Here, no refresh is performed since the bank BK2 is in operation. The banks BK1 and BK2 complete their normal operations, and the precharge end signal PREEND is activated to activate the refresh timing signal REFT in succession (FIG. 43(c)). The select signal SEL2 is activated so that the refresh operation of the bank BK2 is performed under the refresh address REFAD0 (FIG. 43(d)). The inactivation of the select signal SEL2 inactivates the completion signal CMP02 (FIG. 43(e)).

Next, the refresh request signal REFRQ corresponding to the bank BK3 is activated (FIG. 43(f)), followed by the activation of the completion signal CMP03 (FIG. 43(g)). In response to the activation of the select signal BS03, the completion signal CMPA turns to high level (FIG. 43(h)). The bank BK0 completes its normal operation, so that the precharge end signal PREEND is activated to activate the refresh timing signal REFT (FIG. 43(i)). The select signal SEL0 is activated to perform the refresh operation of the bank BK0 under the refresh address REFAD0 (FIG. 43(j)). The inactivation of the select signal SEL0 inactivates the completion signal CMP00 (FIG. 43(k)).

Next, the bank BK3 completes its normal operation, so that the precharge end signal PREEND is activated to activate the refresh timing signal REFT in sequence (FIG. 43(l)). The select signal SEL3 is activated to perform the refresh operation of the bank BK3 under the refresh address REFAD0 (FIG. 43(m)). The inactivation of the select signal SEL3 inactivates the completion signal CMP03 (FIG. 43(n)). The inactivation of the completion signal CMP03 changes the completion signal CMPA to low level, generating the pulse signal PLSA (FIG. 43(o)). Then, the count up signals UP and UP0 are activated to change the refresh addresses REFAD and REFAD0 to "2" (FIG. 43(p)).

Figure 44:
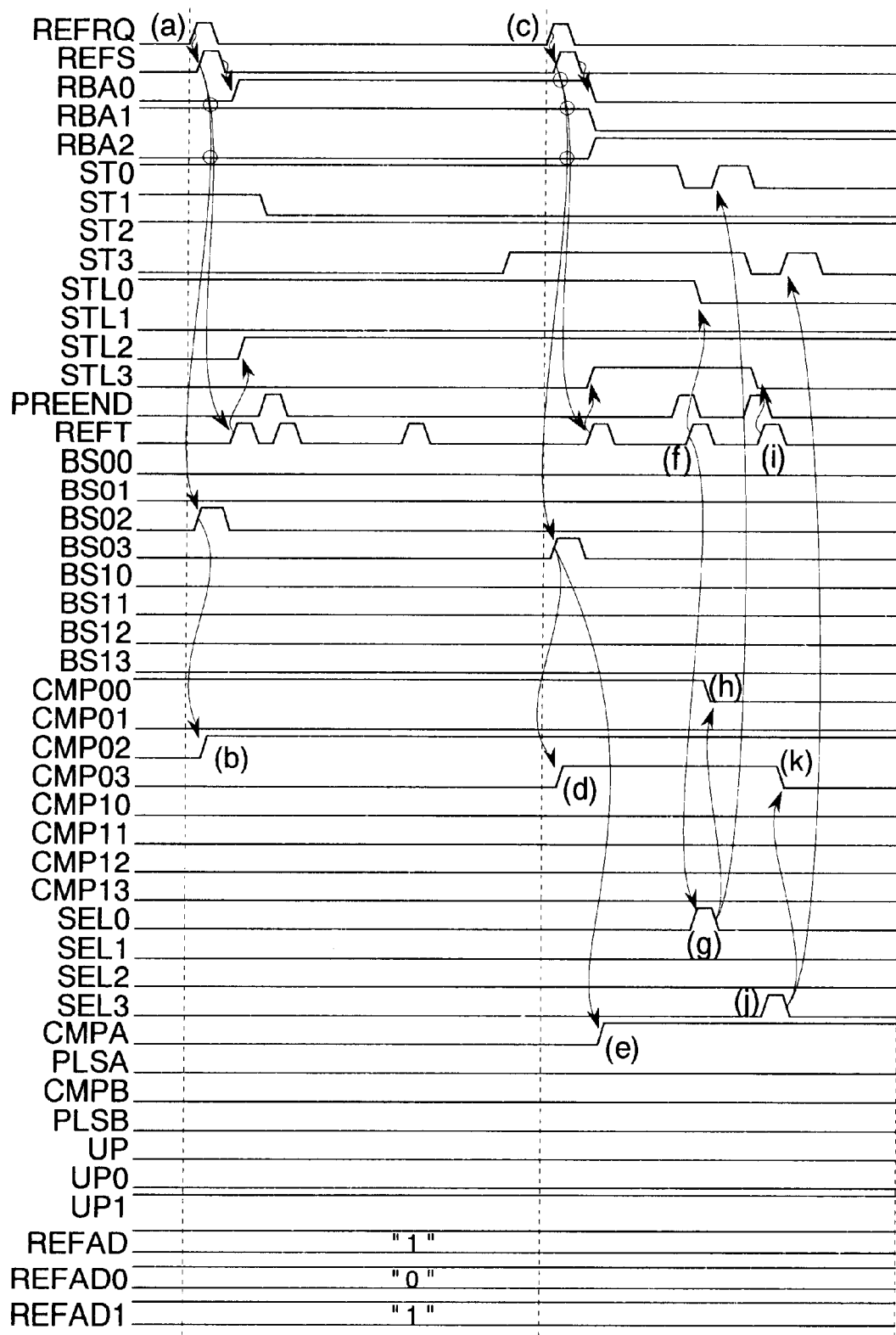
FIG. 44 is a timing chart showing another example of the operation of the refresh control circuit in the sixth embodiment.
Figure 45:
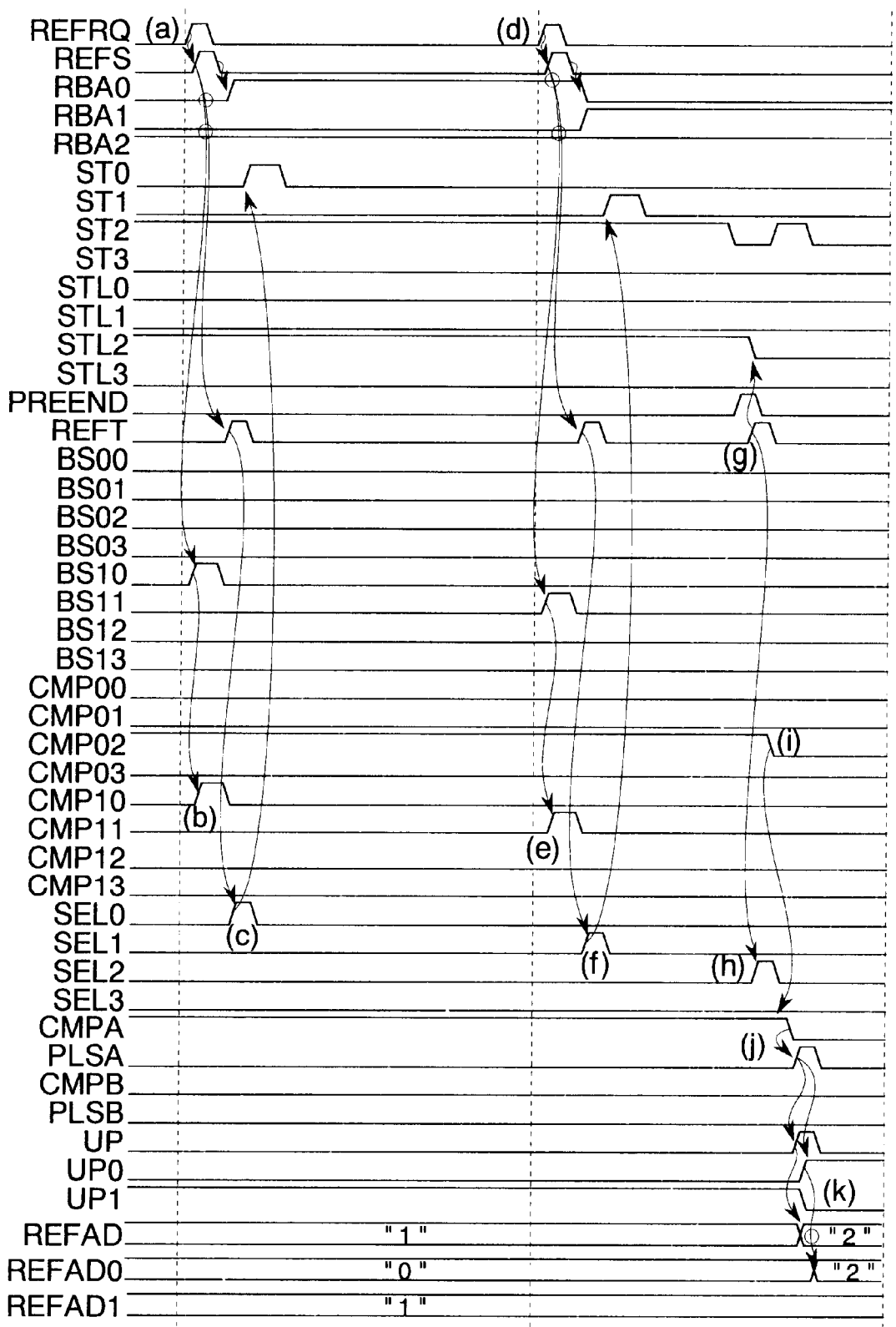
FIG. 45 is a timing chart showing another example of the operation of the refresh control circuit in the sixth embodiment.
Figure 46:
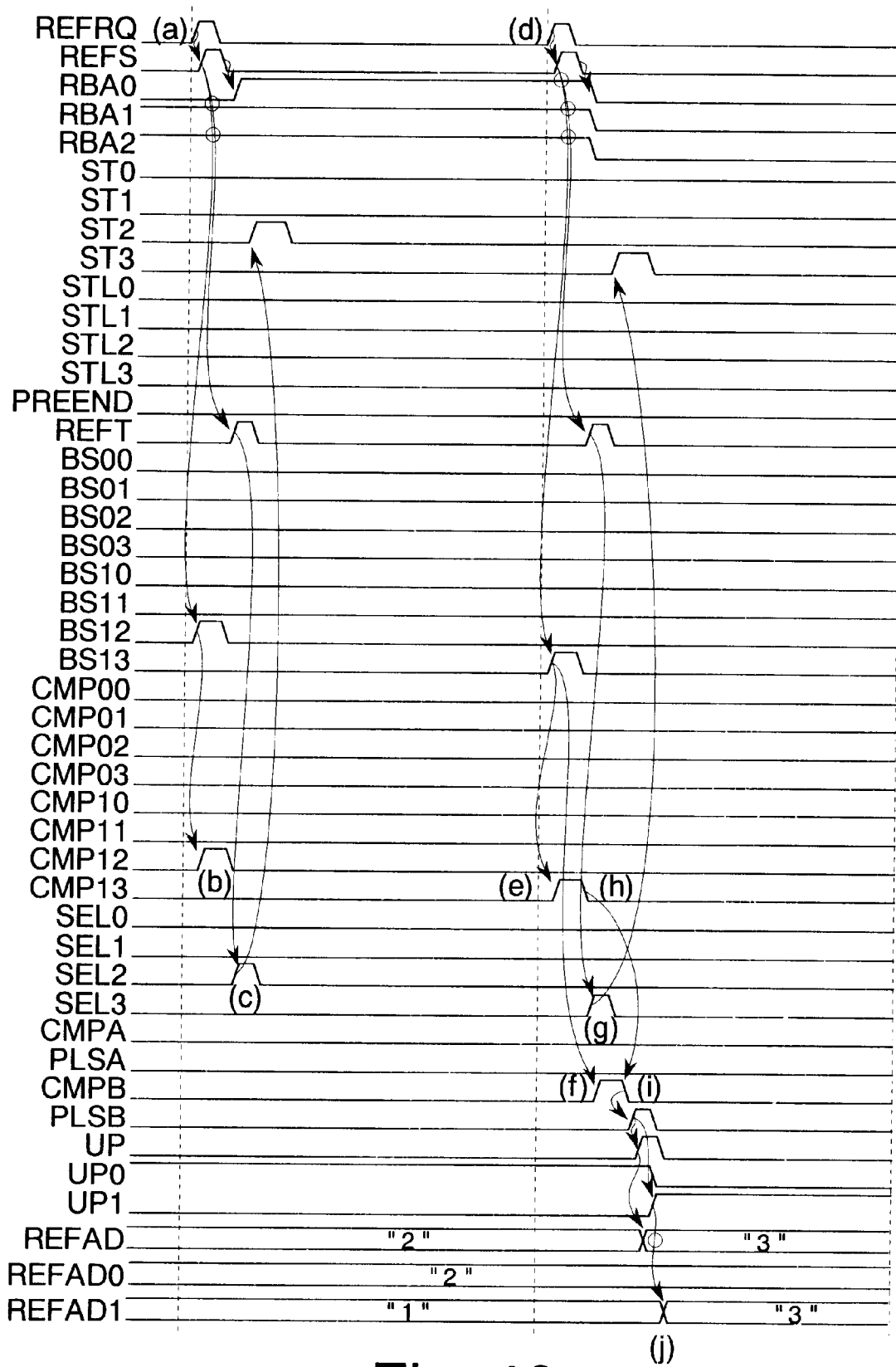
FIG. 46 is a timing chart showing another example of the operation of the refresh control circuit in the sixth embodiment.

FIGS. 44–46 show the operations of the refresh address control circuit 70 for the period between time 1120 and 4180 ns while the SDRAM operates under the timing shown in FIG. 35. FIGS. 44–46 correspond to FIGS. 36–38 described above, respectively. Description will be omitted of waveforms of the same timing as that of FIGS. 36–38.

In FIG. 44, initially, the refresh request signal REFRQ corresponding to the bank BK2 is activated (FIG. 44(a)), followed by the activation of the completion signal CMP02 (FIG. 44(b)). Here, no refresh is performed since the bank BK2 is in operation.

Next, the refresh request signal REFRQ corresponding to the bank BK3 is activated (FIG. 44(c)), followed by the activation of the completion signal CMP03 (FIG. 44(d)). In response to the activation of the select signal BS03, the completion signal CMPA turns to high level (FIG. 44(e)). The bank BK0 completes its normal operation, so that the precharge end signal PREEND is activated to activate the refresh timing signal REFT in sequence (FIG. 44(f)). The select signal SEL0 is activated to perform the refresh operation of the bank BK0 under the refresh address REFAD0 (FIG. 44(g)). The inactivation of the select signal SEL0 inactivates the completion signal CMP00 (FIG. 44(h)).

Next, the bank BK3 completes its normal operation, so that the precharge end signal PREEND is activated to activate the refresh timing signal REFT in sequence (FIG. 44(i)). The select signal SEL3 is activated to perform the refresh operation of the bank BK3 under the refresh address REFAD0 (FIG. 44(j)). The inactivation of the select signal SEL3 inactivates the completion signal CMP03 (FIG. 44(k)). Here, since the bank BK2 is yet to be refreshed under the refresh address REFAD0, the completion signal CMPA remains unchanged with no change in the refresh addresses REFAD and REFAD0.

In FIG. 45, the refresh request signal REFRQ corresponding to the bank BK0 is activated (FIG. 45(a)), followed by the activation of the completion signal CMP10 (FIG. 45(b)). Since the bank BK0 is not in operation, the select signal SEL0 is activated to perform the refresh operation of the bank BK0 under the refresh address REFAD1 (FIG. 45(c)).

Next, the refresh request signal REFRQ corresponding to the bank BK1 is activated (FIG. 45(d)), followed by the activation of the completion signal CMP11 (FIG. 45(e)). Since the bank BK1 is not in operation, the select signal SEL1 is activated to perform the refresh operation of the bank BK1 under the refresh address REFAD1 (FIG. 45(f)).

Subsequently, the bank BK2 completes its normal operation, so that the precharge end signal PREEND is activated to activate the refresh timing signal REFT (FIG. 45(g)). The select signal SEL2 is activated to perform the refresh operation of the bank BK2 under the refresh address REFAD0 (FIG. 45(h)). The inactivation of the select signal SEL2 inactivates the completion signal CMP02 (FIG. 45(i)). The inactivation of the completion signal CMP02 changes the completion signal CMPA to low level, generating the pulse signal PLSA (FIG. 45(j)). Then, the count up signals UP and UP0 are activated to change the refresh addresses REFAD and REFAD0 to "2" (FIG. 45(k)).

In FIG. 46, the refresh request signal REFRQ corresponding to the bank BK2 is activated (FIG. 46(a)), followed by the activation of the completion signal CMP12 (FIG. 46(b)). Since the bank BK2 is not in operation, the select signal SEL2 is activated to perform the refresh operation of the bank BK2 under the refresh address REFAD1 (FIG. 46(c)).

Next, the refresh request signal REFRQ corresponding to the bank BK3 is activated (FIG. 46(d)), followed by the activation of the completion signal CMP13 (FIG. 46(e)). In response to the activation of the select signal BS13, the completion signal CMPB turns to high level (FIG. 46(f)). Since the bank BK3 is not in operation, the select signal SEL3 is activated to perform the refresh operation of the bank BK3 under the refresh address REFAD1 (FIG. 46(g)). The inactivation of the select signal SEL3 inactivates the completion signal CMP1 3 (FIG. 46(h)). At this point, the refresh operations of the banks BK0–BK3 under the refresh address REFAD1 are completed. Therefore, the inactivation of the completion signal CMP13 changes the completion signal CMPB to low level, generating the pulse signal PLSB (FIG. 46(i)). Then, the count up signals UP and UP0 are activated to change the refresh addresses REFAD and REFAD1 to "3" (FIG. 46 (j)).

This embodiment can offer the same effects as those obtained from the fifth embodiment described above.

Note that the embodiments described above have dealt with the cases where refresh operations occur during read operations. When refresh operations occur during write operations, the refresh operations can also be performed automatically at the same timing as in the read operations.

The second, fifth, and sixth embodiments described above have dealt with the cases where two refresh addresses are used to refresh the banks BK0–BK3. However, the present invention is not limited to such embodiments. For example, three or more refresh addresses may be used to refresh the banks BK0–BK3. In this case, tRAS can be easily extended by simply increasing the number of holding circuits and priority circuits in accordance with the number of refresh addresses to be generated.

The fifth and sixth embodiments described above have dealt with the cases where the refresh requests for the banks BK0–BK3 occur independently. However, the present invention is not limited to such embodiments. For example, as in the fourth embodiment, the refresh request for all the banks BK0–BK3 may occur simultaneously.

The above-described embodiments have dealt with the cases where the banks BK0–BK3 are provided with a single, common refresh counter 20. However, the present invention is not limited to such embodiments. For example, a refresh counter 20 may be formed for each of the banks BK0–BK3.

The invention is not limited to the above embodiments and various modifications may be made without departing from the spirit and the scope of the invention. Any improvement may be made in part or all of the components.

What is claimed is:

1. A semiconductor memory comprising:

a plurality of banks each having memory cells;

a refresh circuit for generating a refresh request for refreshing said memory cells, at a predetermined interval;

a refresh counter for generating a refresh address and supplying it to said plurality of banks;

a holding circuit for holding information about completion/incompletion of refreshing said memory cells in each of said banks; and a refresh control circuit for refreshing the bank which does not operate and is in the incompletion status in response to said refresh request, based on said information held in said holding circuit.

2. The semiconductor memory according to claim 1, wherein when all of said information held in said holding circuit indicates completion, said holding circuit changes said all information to incompletion and said refresh counter counts up.

3. The semiconductor memory according to claim 1, wherein a maximum time available for consecutive access to each of said banks is specified to be shorter than the interval of occurrence of said refresh request.

4. The semiconductor memory according to claim 1, comprising a priority circuit for determining one of said plurality of banks to be refreshed when said banks not in operation include a plurality of banks yet to be refreshed.

5. A semiconductor memory comprising:

a plurality of banks each having memory cells;

a refresh circuit for generating a refresh request for refreshing said memory cells, at a predetermined interval;

an address generating circuit for generating a plurality of refresh addresses;

a plurality of holding circuits for respectively holding information about completion/incompletion of refreshing said memory cells designated by each of said refresh addresses in each of said banks; and a refresh control circuit for refreshing the banks which do not operate and are in the incompletion status in response to said refresh request, based on said information held in each of said holding circuits.

6. The semiconductor memory according to claim 5, wherein said address generating circuit comprises:

a refresh counter for generating one of said refresh addresses; and an address holding circuit for holding the refresh address previously generated by said refresh counter.

7. The semiconductor memory according to claim 6, wherein when all of said information held in one of said holding circuits corresponding to said address holding circuit indicates completion, one of said holding circuits corresponding to said refresh counter changes said all information to incompletion after transferring said held information to said holding circuit corresponding to said address holding circuit and said refresh counter counts up after transferring a current counter value to said address holding circuit.

8. The semiconductor memory according to claim 6, wherein a maximum time available for consecutive access to each of said banks is specified to be shorter than (interval at which refresh request occurs)×(number of banks)× (number of holding circuits−1).

9. The semiconductor memory according to claim 5, comprising a priority circuit for determining one of said memory cells to be refreshed when said banks not in operation include a plurality of said memory cells yet to be refreshed corresponding to said refresh address.

* * * * *

UNITED STATES PATENT AND TRADEMARK OFFICE
CERTIFICATE OF CORRECTION

PATENT NO.    : 6,426,909 B1  
DATED         : July 30, 2002  
INVENTOR(S)   : Hiroyoshi Tomita It is certified that error appears in the above-identified patent and that said Letters Patent is hereby corrected as shown below:

<u>Title page,</u>
Item [30], please insert the following Foreign Application Priority Data:

-- [30]  Foreign Application Priority Data
Nov. 17, 2000   [JP] .............................. 2000-351601 --.

Signed and Sealed this

Twenty-third Day of September, 2003

JAMES E. ROGAN
*Director of the United States Patent and Trademark Office*